(12) United States Patent
Nakazawa et al.

(10) Patent No.: US 12,406,739 B2
(45) Date of Patent: Sep. 2, 2025

(54) SEMICONDUCTOR STORAGE DEVICE

(71) Applicant: Kioxia Corporation, Tokyo (JP)

(72) Inventors: Shingo Nakazawa, Kamakura Kanagawa (JP); Yuki Inuzuka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 90 days.

(21) Appl. No.: 18/458,071

(22) Filed: Aug. 29, 2023

(65) Prior Publication Data

US 2024/0096429 A1 Mar. 21, 2024

(30) Foreign Application Priority Data

Sep. 15, 2022 (JP) .................. 2022-147466

(51) Int. Cl.
| | | |
|---|---|---|
| *G11C 5/06* | (2006.01) | |
| *G11C 11/56* | (2006.01) | |
| *G11C 16/04* | (2006.01) | |
| *G11C 16/08* | (2006.01) | |
| *G11C 16/26* | (2006.01) | |
| *G11C 16/34* | (2006.01) | |

(52) U.S. Cl.
CPC ...... *G11C 16/3427* (2013.01); *G11C 11/5642* (2013.01); *G11C 11/5671* (2013.01); *G11C 16/0483* (2013.01); *G11C 16/08* (2013.01); *G11C 16/26* (2013.01)

(58) Field of Classification Search
CPC ....... G11C 5/063; G11C 7/18; G11C 11/4097; G11C 5/025; G11C 5/04
USPC .......................................... 365/63
See application file for complete search history.

(56) References Cited

U.S. PATENT DOCUMENTS 9,514,825 B2 * 12/2016 Maejima ............... G06F 3/0679
2017/0271021 A1 9/2017 Futatsuyama et al.
2020/0381067 A1 12/2020 Maeda

FOREIGN PATENT DOCUMENTS

| JP | 2017-168163 A | 9/2017 |
| JP | 2018-164070 A | 10/2018 |
| JP | 2020-198141 A | 12/2020 |

OTHER PUBLICATIONS

Morooka, et al. "Optimal Cell Structure/Operation Design of 3D Semicircular Split-gate Cells for Ultra-high-density Flash Memory." 2022 IEEE Symposium on VLSI Technology and Circuits (VLSI Technology and Circuits). IEEE, 2022, pp. 308-309.

* cited by examiner

*Primary Examiner* — Son T Dinh
(74) *Attorney, Agent, or Firm* — Kim & Stewart LLP

(57) ABSTRACT

A semiconductor storage device includes a first word line, a second word line, a first select gate line, a second select gate line, a third select gate line, a fourth select gate line, a first memory pillar including a first memory cell connected to the first word line, a first select transistor connected to the first select gate line, a second memory cell connected to the second word line, and a second select transistor connected to the second select gate line, and a logic control circuit configured to perform a read operation to read threshold voltages of the first and second memory cells, respectively. The logic control circuit independently controls the first to fourth select gate lines during the read operation to turn the select transistors electrically connected to memory cells other than the memory cell to be read to off state.

20 Claims, 30 Drawing Sheets

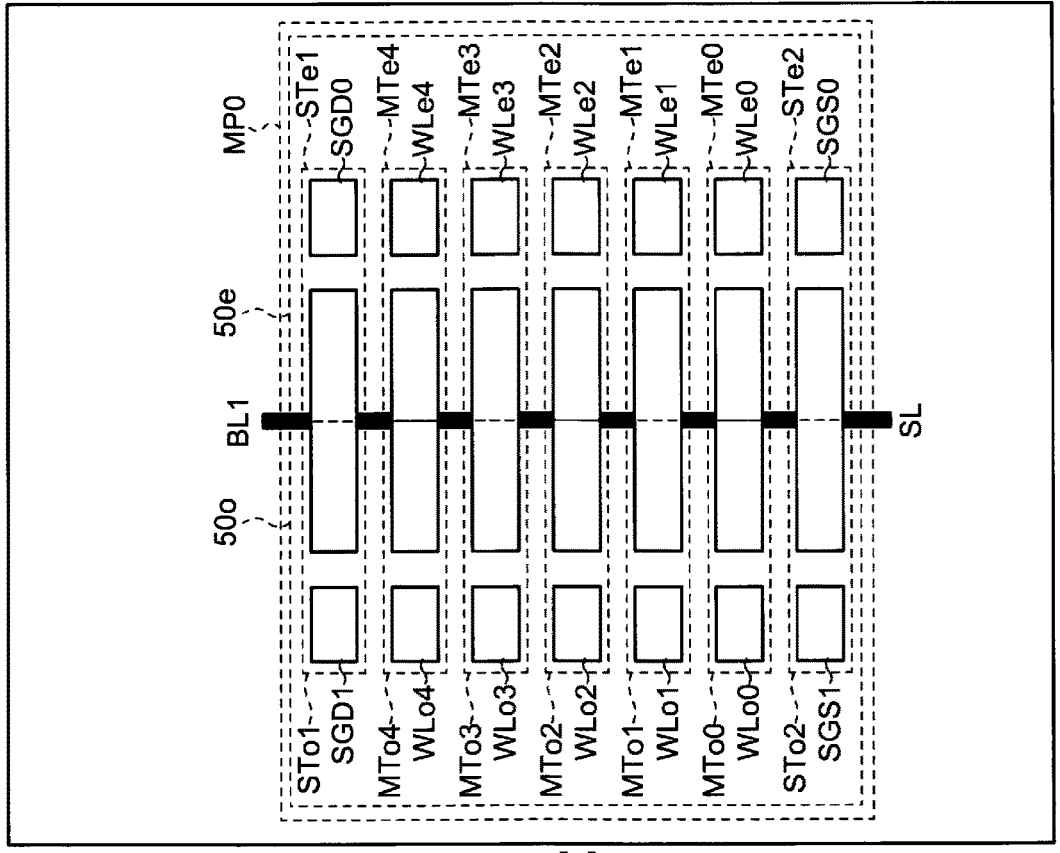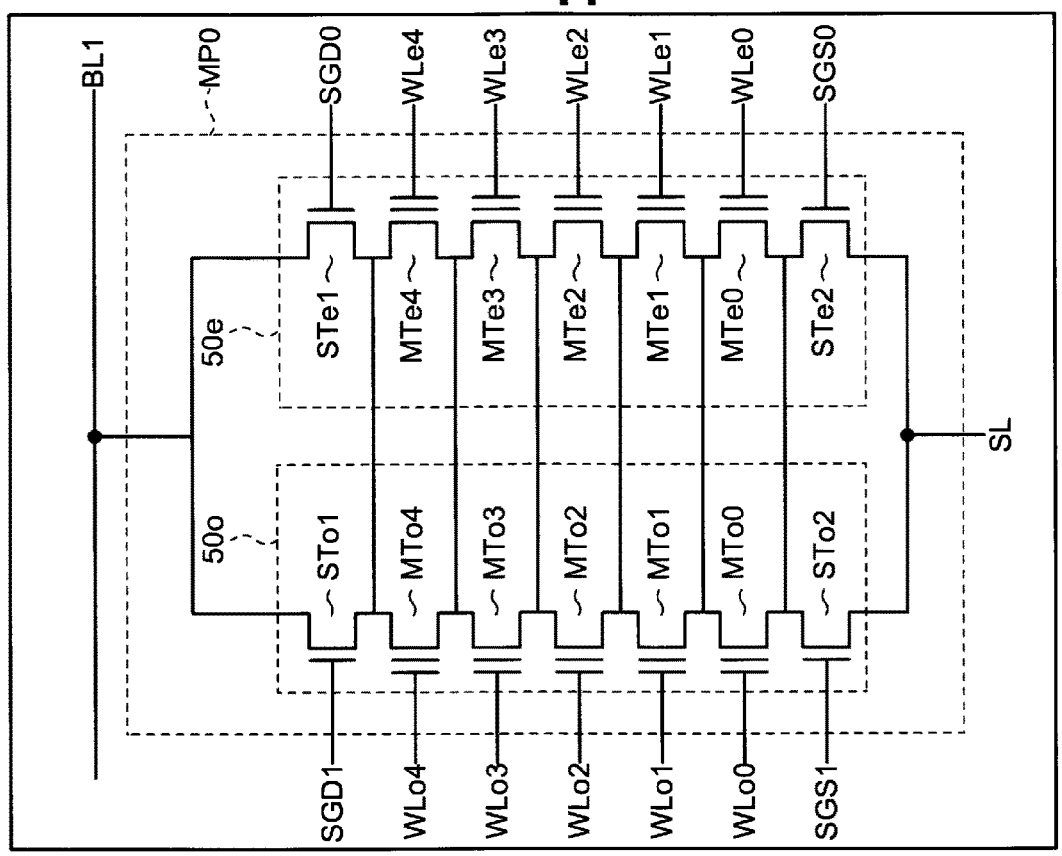
FIG. 15

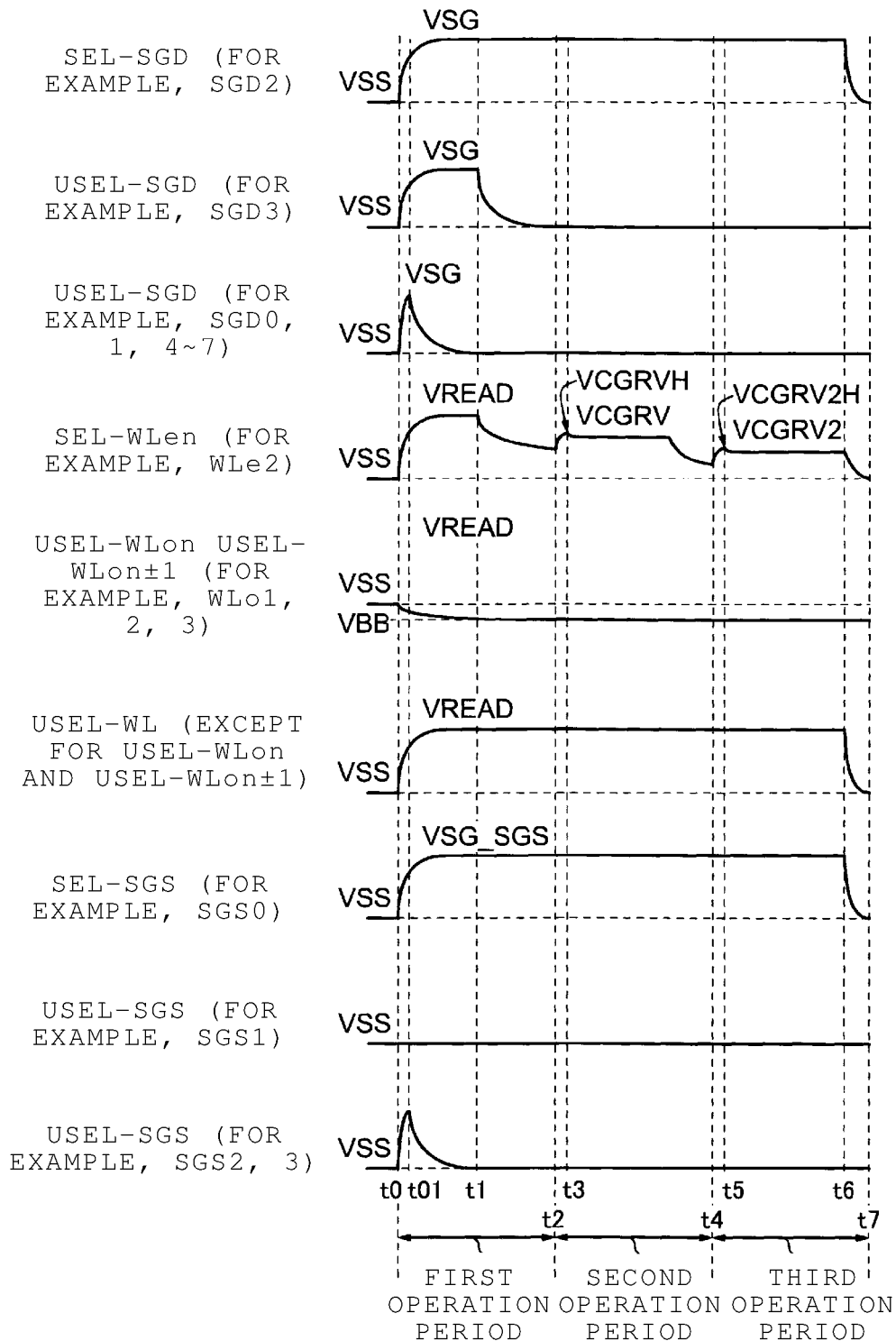

SEMICONDUCTOR STORAGE DEVICE

CROSS-REFERENCE TO RELATED APPLICATION(S)

This application is based upon and claims the benefit of priority from Japanese Patent Application No. 2022-147466, filed Sep. 15, 2022, the entire contents of which are incorporated herein by reference.

FIELD

Embodiments described herein relate generally to a semiconductor storage device.

BACKGROUND

A NAND flash memory is known as a nonvolatile semiconductor storage device.

DESCRIPTION OF THE DRAWINGS

FIG. 15 is a diagram showing an example of an equivalent circuit simplified from the equivalent circuit of the strings shown in FIG. 13.

FIG. 30 is a timing chart to explain read operation of a semiconductor storage device according to a fourth embodiment.

DETAILED DESCRIPTION

Figure 1:
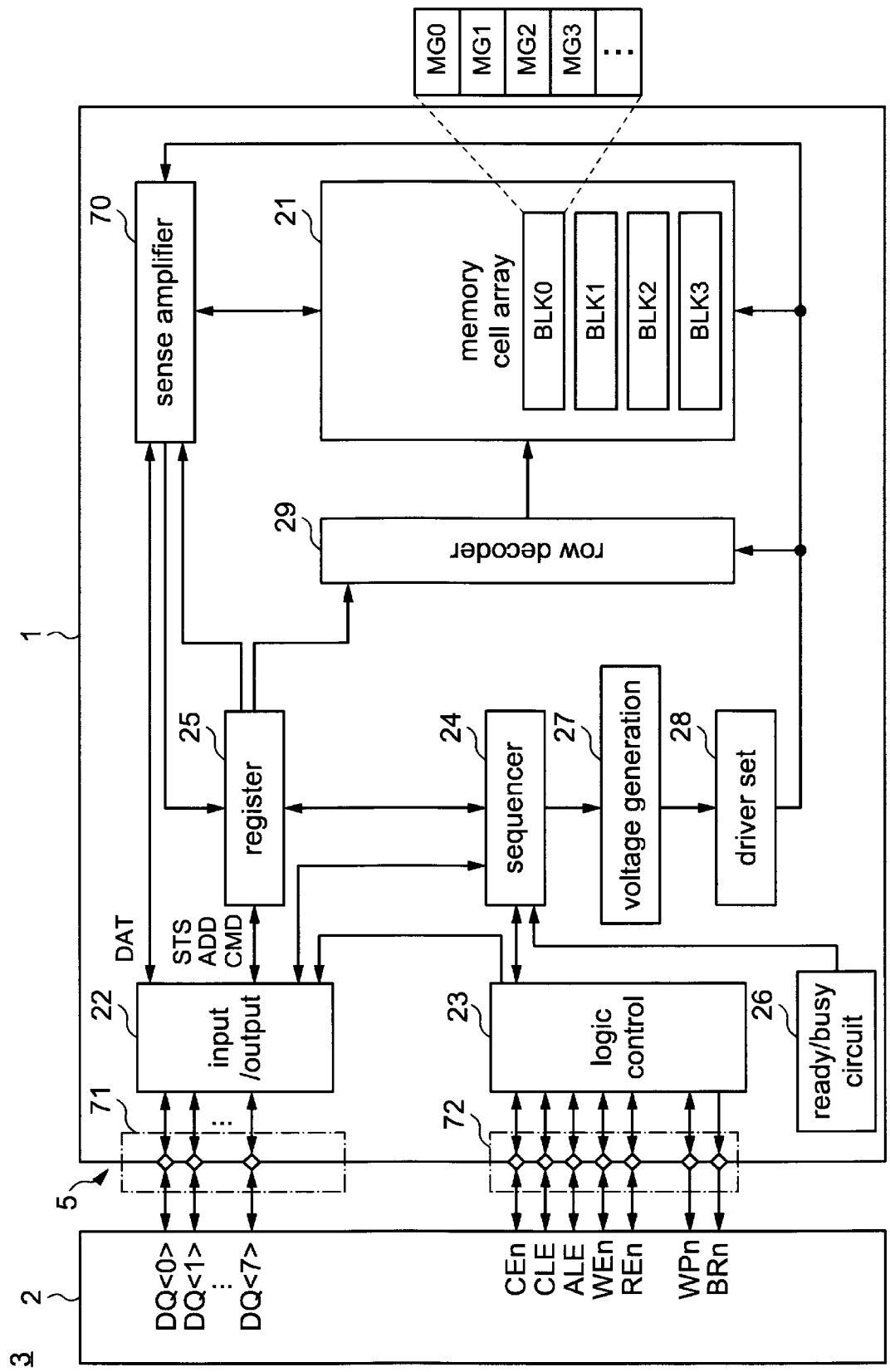
FIG. 1 is a block diagram showing a configuration of a memory system including a semiconductor storage device according to a first embodiment.

Embodiments provide a semiconductor storage device capable of preventing read disturb of a memory cell.

In general, according to one embodiment, a semiconductor storage device includes a first word line provided in a first layer extending in a first direction and a second direction that intersects the first direction, a second word line provided opposite to the first word line in the first layer and controlled independently of the first word line, a third word line provided in a second layer extending in the first direction and the second direction and stacked on the first layer in a third direction that intersects the first direction and the second direction, a fourth word line provided opposite to the third word line in the second layer and controlled independently of the third word line, a fifth word line provided in a third layer extending in the first direction and the second direction and stacked on the first layer in the third direction, a sixth word line provided opposite to the fifth word line in the third layer and controlled independently of the fifth word line, a first select gate line disposed in a fourth layer stacked on the third layer in the third direction and extending in the first direction, a second select gate line disposed opposite to the first select gate line in the fourth layer and controlled independently of the first select gate line, a third select gate line disposed adjacent to the second select gate line in the fourth layer and controlled independently of the first select gate line and the second select gate line, a fourth select gate line disposed opposite to the third select gate line in the fourth layer and controlled independently of the first to third select gate lines, a first memory pillar extending in the third direction and including a first memory cell, a first select transistor electrically connected in series to the first memory cell, a second memory cell, and a second select transistor electrically connected in series to the second memory cell, a second memory pillar extending in the third direction and including a third memory cell and a third select transistor electrically connected in series to the third memory cell, and a fourth memory cell and a fourth select transistor electrically connected in series to the fourth memory cell, a third memory pillar extending in the third direction and including a fifth memory cell, a fifth select transistor electrically connected in series to the fifth memory cell, a sixth memory cell, and a sixth select transistor electrically connected in series to the sixth memory cell, a fourth memory pillar extending in the third direction and including a seventh memory cell and a seventh select transistor electrically connected in series to the seventh memory cell, and an eighth memory cell and an eighth select transistor electrically connected in series to the eighth memory cell, and a logic control circuit configured to perform a read operation to read threshold voltages of the first to eighth memory cells, respectively. The first to eighth memory cells are interposed between the first word line and the second word line. The first, third, fifth, and seventh memory cells are disposed opposite to the first word line, and the second, fourth, sixth, and eighth memory cells are disposed opposite to the second word line. The first and second select transistors are interposed between the first and second select gate lines, the third and fourth select transistors between the second and third select gate lines, the fifth and sixth select transistors between the third and fourth select gate lines, and the seventh and eighth select transistors between the first and fourth select gate lines. The first and seventh select transistors are electrically connected to the first select gate line, the second and fourth select transistors to the second select gate line, the third and fifth select transistors to the third select gate line, and the sixth and eighth select transistors to the fourth select gate line. When performing the read operation, the logic control circuit independently controls each of the first to fourth select gate lines such that select transistors electrically connected to memory cells other than a memory cell to be read are turned off.

In general, according to one embodiment, a semiconductor storage device includes a first word line provided in a first layer extending in a first direction and a second direction that intersects the first direction, a second word line provided opposite to the first word line in the first layer and controlled independently of the first word line, a third word line provided in a second layer extending in the first direction and the second direction and stacked on the first layer in a third direction that intersects the first direction and the second direction, a fourth word line provided opposite to the third word line in the second layer and controlled independently of the third word line, a fifth word line provided in a third layer extending in the first direction and the second direction and stacked on the first layer in the third direction, a sixth word line provided opposite to the fifth word line in the third layer and controlled independently of the fifth word line, a first select gate line disposed in a fourth layer stacked on the third layer in the third direction and extending in the first direction, a second select gate line disposed opposite to the first select gate line in the fourth layer and controlled independently of the first select gate line, a third select gate line disposed adjacent to the second select gate line in the fourth layer and controlled independently of the first select gate line and the second select gate line, a fourth select gate line disposed opposite to the third select gate line in the fourth layer and controlled independently of the first to third select gate lines, a first memory pillar extending in the third direction and including a first memory cell electrically connected to the first word line, a first select transistor electrically connected in series to the first memory cell and electrically connected to the first select gate line, a second memory cell electrically connected to the second word line, and a second select transistor electrically connected in series to the second memory cell and electrically connected to the second select gate line, a second memory pillar extending in the third direction and including a third memory cell electrically connected to the first word line and a third select transistor electrically connected in series to the third memory cell and electrically connected to the third select gate line, and a fourth memory cell electrically connected to the second word line and a fourth select transistor electrically connected in series to the fourth memory cell and electrically connected to the second select gate line, a third memory pillar extending in the third direction and including a fifth memory cell electrically connected to the first word line, a fifth select transistor electrically connected in series to the fifth memory cell and electrically connected to the third select gate line, a sixth memory cell electrically connected to the second word line, and a sixth select transistor electrically connected in series to the sixth memory cell and electrically connected to the fourth select gate line, and a fourth memory pillar extending in the third direction and including a seventh memory cell electrically connected to the first word line and a seventh select transistor electrically connected in series to the seventh memory cell and electrically connected to the first select gate line, and an eighth memory cell electrically connected to the second word line and an eighth select transistor electrically connected in series to the eighth memory cell and electrically connected to the fourth select gate line.

Hereinafter, embodiments will be described with reference to the drawings. In the following description, components having the same or similar functions and configurations are denoted by common reference numerals. If it is necessary to distinguish a plurality of components having common reference numeral from one another, different subscripts (for example, uppercase alphabetic characters, lowercase alphabetic characters, numbers, or hyphens followed by uppercase alphabetic characters and numbers) will be added to the common reference number.

In the following description, a signal X<p:0> (p is a natural number) is a signal of (p+1) bits, and means a set including signals X<0>, X<1>, . . . and X<p>, each being a 1-bit signal. A component Y<p:0> means a set including components Y<0>, Y<1>, . . . and Y<p> that correspond one-to-one to input or output of the signal X<p:0>.

First Embodiment

A semiconductor storage device 1 according to the first embodiment will be described below.

1-1. Configuration Example 1-1-1. Memory System

FIG. 1 is a block diagram showing an example of the configuration of a memory system 3 including the semiconductor storage device 1. As shown in FIG. 1, the memory system 3 includes the semiconductor storage device 1 and a memory controller 2. The memory system 3 is a solid state drive (SSD), a memory card such as an SD® card, or the like, for example. The memory system 3 may include a host device (not shown).

For example, the semiconductor storage device 1 is connected to the memory controller 2 and controlled using the memory controller 2. For example, the memory controller 2 receives a command necessary for operating the semiconductor storage device 1 from the host device and transmits the command to the semiconductor storage device 1. The memory controller 2 transmits the command to the semiconductor storage device 1 and controls an operation to read data from the semiconductor storage device 1, an operation to write data to the semiconductor storage device 1, and an operation to erase data from the semiconductor storage device 1. In the first embodiment, the semiconductor storage device 1 is a NAND flash memory, for example.

1-1-2. Configuration of Semiconductor Storage Device

As shown in FIG. 1, the semiconductor storage device 1 includes a memory cell array 21, an input/output circuit 22, a logic control circuit 23, a sequencer 24, a register 25, a ready/busy control circuit 26, a voltage generation circuit 27, a driver set 28, a row decoder 29, a sense amplifier module 70, an input/output pad group 71, and a logic control pad group 72. In the semiconductor storage device 1, various operations such as a write operation for storing write data DAT to the memory cell array 21 and a read operation for reading read data DAT from the memory cell array 21 are performed.

The memory cell array 21 is connected to the sense amplifier module 70, the row decoder 29, and the driver set 28, for example. The memory cell array 21 includes blocks BLK0, BLK1, ..., BLKn (n is an integer equal to or greater than 1). Each of the blocks BLKs includes a plurality of memory groups MG (MG0, MG1, MG2, ...), which will be described in detail below. Each of the memory groups MGs includes a plurality of nonvolatile memory cells associated with bit lines and word lines. The block BLK is a data erase unit, for example. The data stored by the memory cell transistors MTe0 to MTe7 and MTo0 to MTo7 (FIG. 2) in the same block BLK are collectively erased. It should be noted that, in the semiconductor storage device 1, the memory cell transistor MT may simply be referred to as memory cell.

In the semiconductor storage device 1, a quadruple level cell (QLC) system may be adopted, for example. In the QLC system, each memory cell stores 4-bit data. It should be noted that each memory cell may store 3-bit (8-level) data, 2-bit (4-level) or less data, or 5-bit or more data.

The input/output circuit 22 is connected to the register 25, the logic control circuit 23, and the sense amplifier module 70, for example. The input/output circuit 22 controls transmission and reception of data signals DQ<7:0> between the memory controller 2 and the semiconductor storage device 1.

The data signals DQ<7:0> are 8-bit signals. The data signals DQ<7:0> is data transmitted and received between the semiconductor storage device 1 and the memory controller 2, and includes command CMD, data DAT, address information ADD, status information STS, and the like. The command CMD includes a command to execute a command transmitted from the host device to the semiconductor storage device 1 via the memory controller 2, for example. The data DAT includes write data DAT to the semiconductor storage device 1 or read data DAT from the semiconductor storage device 1. The address information ADD includes column addresses and row addresses for selecting a plurality of nonvolatile memory cells associated with bit lines and word lines, for example. The status information STS includes information on a status of the semiconductor storage device 1 regarding write and read operations, for example.

Specifically, the input/output circuit 22 includes an input circuit and an output circuit which perform processes to be described below. The input circuit receives the write data DAT, the address information ADD, and the command CMD from the memory controller 2. The input circuit transmits the received write data DAT to the sense amplifier module 70 and transmits the received address information ADD and command CMD to the register 25. Meanwhile, the output circuit receives the status information STS from the register 25 and the read data DAT from the sense amplifier module 70. The output circuit transmits the received status information STS and read data DAT to the memory controller 2.

The logic control circuit 23 is connected to the memory controller 2 and the sequencer 24, for example. The logic control circuit 23 receives, for example, a chip enable signal CEn, a command latch enable signal CLE, an address latch enable signal ALE, a write enable signal WEn, a read enable signal REn, and a write protect signal WPn from the memory controller 2. The logic control circuit 23 controls the input/output circuit 22 and the sequencer 24 based on the received signal.

The chip enable signal CEn is a signal for enabling the semiconductor storage device 1. The command latch enable signal CLE is a signal for notifying the input/output circuit 22 that the signal DQ input to the semiconductor storage device 1 is the command CMD. The address latch enable signal ALE is a signal for notifying the input/output circuit 22 that the signal DQ input to the semiconductor storage device 1 is the address information ADD. The write enable signal WEn and the read enable signal REn are signals necessary for instructing the input/output circuit 22 to input and output the data signal DQ, respectively. The write protect signal WPn is a signal for instructing the semiconductor storage device 1 to prohibit writing and erasing of data.

The sequencer 24 is connected to the ready/busy control circuit 26, the sense amplifier module 70, and the driver set 28, for example. The sequencer 24 controls overall operations of the semiconductor storage device 1 based on the command CMD stored in a command register. For example, the sequencer 24 controls the sense amplifier module 70, the row decoder 29, the voltage generation circuit 27, the driver set 28, and the like to perform various operations such as write, read, and erase operations.

The register 25 includes a status register (not shown), an address register (not shown), the command register (not shown), and the like, for example. The status register receives the status information STS from the sequencer 24, stores the status information STS, and transmits the status information STS to the input/output circuit 22 based on instructions from the sequencer 24. The address register receives the address information ADD from the input/output circuit 22 and stores the address information ADD. The address register transmits the column address in the address information ADD to the sense amplifier module 70 and transmits the row address of the address information ADD to the row decoder 29. The command register receives the command CMD from the input/output circuit 22, stores the command CMD, and transmits the command CMD to the sequencer 24.

The ready/busy control circuit 26 generates a ready/busy signal R/Bn under the control of the sequencer 24 and transmits the generated ready/busy signal R/Bn to the memory controller 2. The ready/busy signal R/Bn is a signal for notifying whether the semiconductor storage device 1 is in a ready state in which state it can receive commands from the memory controller 2 or in a busy state in which state it cannot receive commands from the memory controller 2.

The voltage generation circuit 27 is connected to the driver set 28 and the like, for example. The voltage generation circuit 27 generates voltages used for write operation, read operation, and the like based on the control by the sequencer 24, and supplies the generated voltages to the driver set 28.

The driver set 28 includes an even word line driver 28A (FIG. 8) and an odd word line driver 28B (FIG. 8), for example. The driver set 28 is connected to the memory cell array 21, the sense amplifier module 70, and the row decoder 29. The driver set 28 generates various voltages or various control signals to be supplied to select gate lines SGD (SGD0, SGD1, SGD2, SGD3, SGD4, SGD5, SGD6, SGD7, . . . ) (FIG. 3), word lines WL (FIG. 2), source lines SL (FIG. 2), bit lines BL (FIG. 2) or the like in various operations such as read operation and write operation, based on the voltages supplied from the voltage generation circuit 27 or the control signals supplied from the sequencer 24. The driver set 28 supplies the generated voltages or control signals to the sense amplifier module 70, the row decoder 29, the source lines SL, and the like. In the semiconductor storage device 1, the select gate lines SGD0, SGD1, SGD2, SGD3, SGD4, SGD5, SGD6, SGD7 and the like may simply be referred to as "select gate lines SGD" unless it is necessary to distinguish each of the select gate lines. The select gate line SGD may be referred to as "drain side select gate line", for example.

The row decoder 29 receives a row address from the address register and decodes the received row address. The row decoder 29 selects a target block BLK to be subjected to various operations such as read operation and write operation based on the result of decoding. The row decoder 29 can supply the voltage supplied from the driver set 28 to the selected block BLK.

The sense amplifier module 70 receives a column address from the address register, and transmits and receives data DAT between the memory controller 2 and the memory cell array 21 based on the column address, for example. The sense amplifier module 70 includes a sense amplifier unit (not shown) provided for each bit line BL (BL0 to BL(L−1), where (L−1) is a natural number of 2 or more), for example. The sense amplifier unit is electrically connected to supply voltage to the bit lines BL. The sense amplifier module 70 can sense data read from the memory cell array 21 and temporarily store the read data based on a command related to the read operation. The sense amplifier module 70 can perform logic operations based on the temporarily stored data. The sense amplifier module 70 also transmits the read data DAT to the memory controller 2 via the input/output circuit 22. The sense amplifier module 70 receives write data DAT from the memory controller 2 via the input/output circuit 22 and transmits the write data DAT to the memory cell array 21 based on a command for write operation.

The input/output pad group 71 transmits data signals DQ<7:0> received from the memory controller 2 to the input/output circuit 22. The input/output pad group 71 transmits data signals DQ<7:0> received from the input/output circuit 22 to the memory controller 2.

The logic control pad group 72 transfers the chip enable signal CEn, the command latch enable signal CLE, the address latch enable signal ALE, the write enable signal WEn, and the read enable signal REn received from the memory controller 2 to the logic control circuit 23. The logic control pad group 72 transfers the ready/busy signal R/Bn received from the ready/busy control circuit 26 to the memory controller 2.

1-1-3. Memory Cell Array

Figure 2:
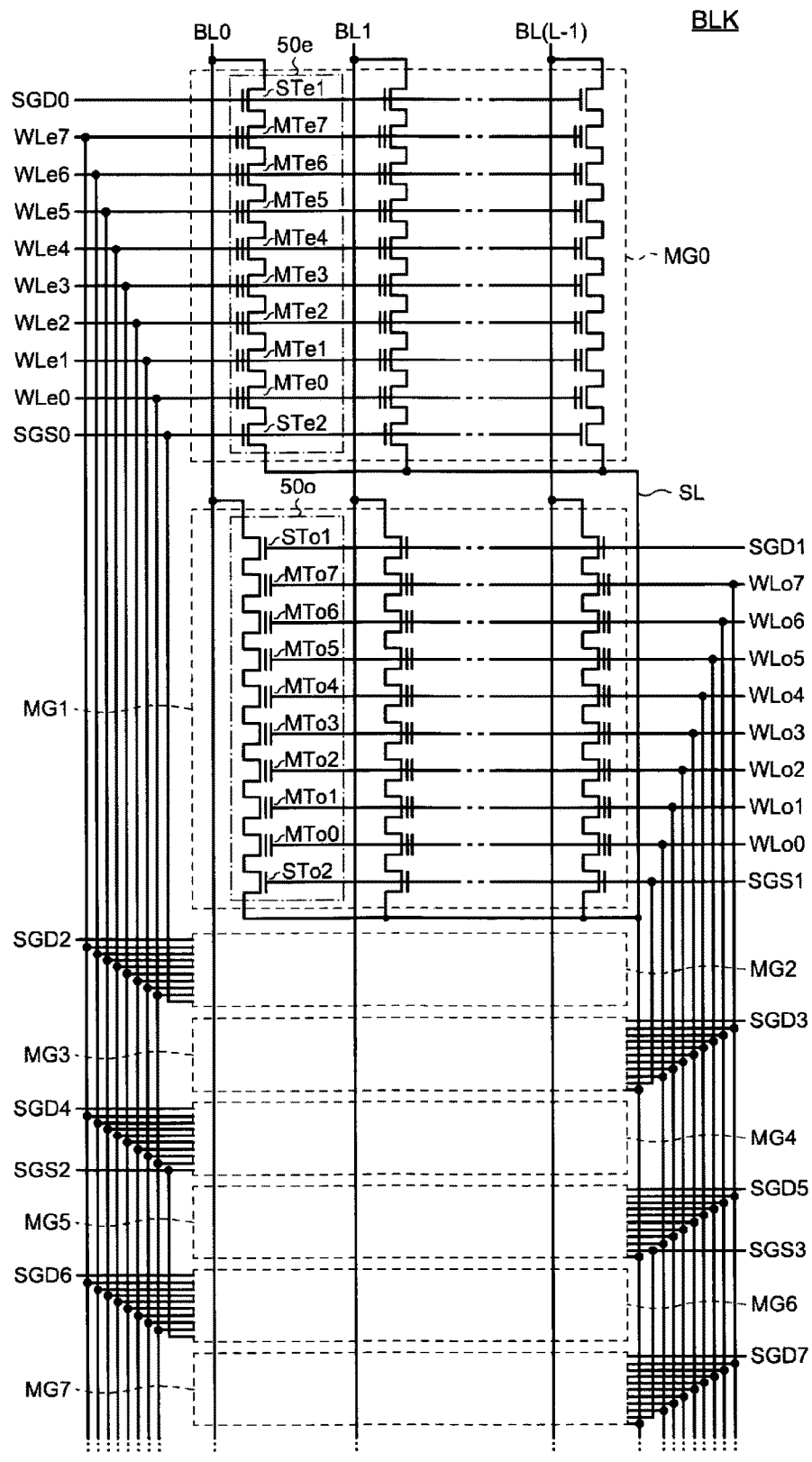
FIG. 2 is a diagram showing a circuit configuration of a memory cell array in the semiconductor storage device according to the first embodiment.

FIG. 2 shows an example of a circuit configuration of the memory cell array 21 shown in FIG. 1. FIG. 2 is a diagram showing a circuit configuration of one block BLK of a plurality of blocks BLK in the memory cell array 21. For example, each of the plurality of blocks BLK in the memory cell array 21 has the circuit configuration shown in FIG. 2. In the description of FIG. 2, the description of the same or similar configuration as that of FIG. 1 may be omitted.

As shown in FIG. 2, the block BLK includes a plurality of memory groups MG (MG0, MG1, MG2, MG3, . . . ). In the embodiment, each memory group MG includes a plurality of memory strings 50. For example, the memory groups MG0 and MG2 include a plurality of memory strings 50e, and the memory groups MG1 and MG3 include a plurality of memory strings 50o.

Each of the memory strings 50 includes eight memory cell transistors MT (MT0 to MT7) and select transistors ST1 and ST2, for example. The memory cell transistor MT includes a control gate and a charge storage layer to store data in a non-volatile manner. The memory cell transistor MT is connected in series between the source of the select transistor ST1 and the drain of the select transistor ST2.

Gates of the select transistors ST1 in each memory group MG are connected to the select gate lines SGD (SGD0, SGD1, SGD2, SGD3, SGD4, SGD5, SGD6, SGD7, . . . ), respectively. The select gate line SGD is independently controlled by the row decoder 29. Gates of select transistors ST2 in each of the even memory groups MGe (MG0, MG2, MG4, MG6, . . . ) are connected to the select gate lines SGS0, SGS2, . . . , for example, and gates of the select transistors ST2 in each of the odd memory groups MGo (MG1, MG3, MG5, MG7, . . . ) are connected to the select gate lines SGS1, SGS3, . . . , for example. The select gate lines SGS0, SGS2, SGS1, SGS3, . . . are provided independently and can be controlled independently. In the semiconductor storage device 1, the select gate lines SGS0, SGS2, SGS1, SGS3, . . . may simply be referred to as "select gate line SGS" unless it is necessary to distinguish each of the select gate lines. The select gate line SGS may be simply referred to as "select gate line" or as "source side select gate line", for example. When distinguishing the select gate lines SGS0, SGS2, SGS1, SGS3, and the like, for example, the select gate line SGS0 may be referred to as "first select gate line", the select gate line SGS1 may be referred to as "second select gate line", the select gate line SGS2 may be referred to as "third select gate line", and the select gate line SGS3 may be referred to as "fourth select gate line".

The control gates of the memory cell transistors MT (MTe0 to MTe7) in the memory group MGe in the same block BLK are commonly connected to even word lines WLe (WLe0 to WLe7), respectively. The control gates of the memory cell transistors MT (MTo0 to MTo7) in the memory group MGo in the same block BLK are commonly connected to odd word lines WLo (WLo0 to WLo7), respectively. The even word lines WLe and the odd word lines WLo are independently controlled by the row decoder 29.

Each memory group MG includes a plurality of pages respectively corresponding to a plurality of word lines WL. For example, in memory groups MG0, MG2, MG4, MG6, or the like, a plurality of memory cell transistors MT with the control gates commonly connected to a certain word line of the even word lines WLe0 to WLe7 correspond to a page. In the memory groups MG1, MG3, MG5, MG7, or the like, a plurality of memory cell transistors MT with the control gates commonly connected to a certain word line of the odd word lines WLo0 to WLo7 correspond to a page. The write operation and the read operation are performed in page units.

The drains of the select transistors ST1 of the memory strings 50 in the same column in the memory cell array 21 are commonly connected to the bit lines BL (BL0 to BL(L−1), where (L−1) is a natural number of 2 or more).

That is, the bit lines BL commonly connect the memory strings 50 between the plurality of memory groups MG. The sources of the plurality of select transistors ST2 are commonly connected to the source line SL. For example, the source line SL is electrically connected to the driver set 28 and supplied with voltage from the voltage generation circuit 27 or the driver set 28 under the control of the voltage generation circuit 27 and the driver set 28 using the sequencer 24. The semiconductor storage device 1 may include a plurality of source lines SL. For example, each of the plurality of source lines SL may be electrically connected to the driver set 28, and each of the plurality of source lines SL may be supplied with different voltages from the voltage generation circuit 27 or the driver set 28 under the control of the voltage generation circuit 27 and the driver set 28 using the sequencer 24.

The memory group MG includes a plurality of memory strings 50 connected to different bit lines BL and connected to the same select gate line SGD. The block BLK includes a plurality of memory groups MG sharing word lines WL. The memory cell array 21 includes a plurality of blocks BLK sharing bit lines BL. In the memory cell array 21, the select gate lines SGS, the word lines WL, and the select gate lines SGD described above are stacked above the source line layer, and the memory cell transistors MT are arranged three-dimensionally.

1-1-4. Planar Layout of Memory Cell Array

Figure 3:
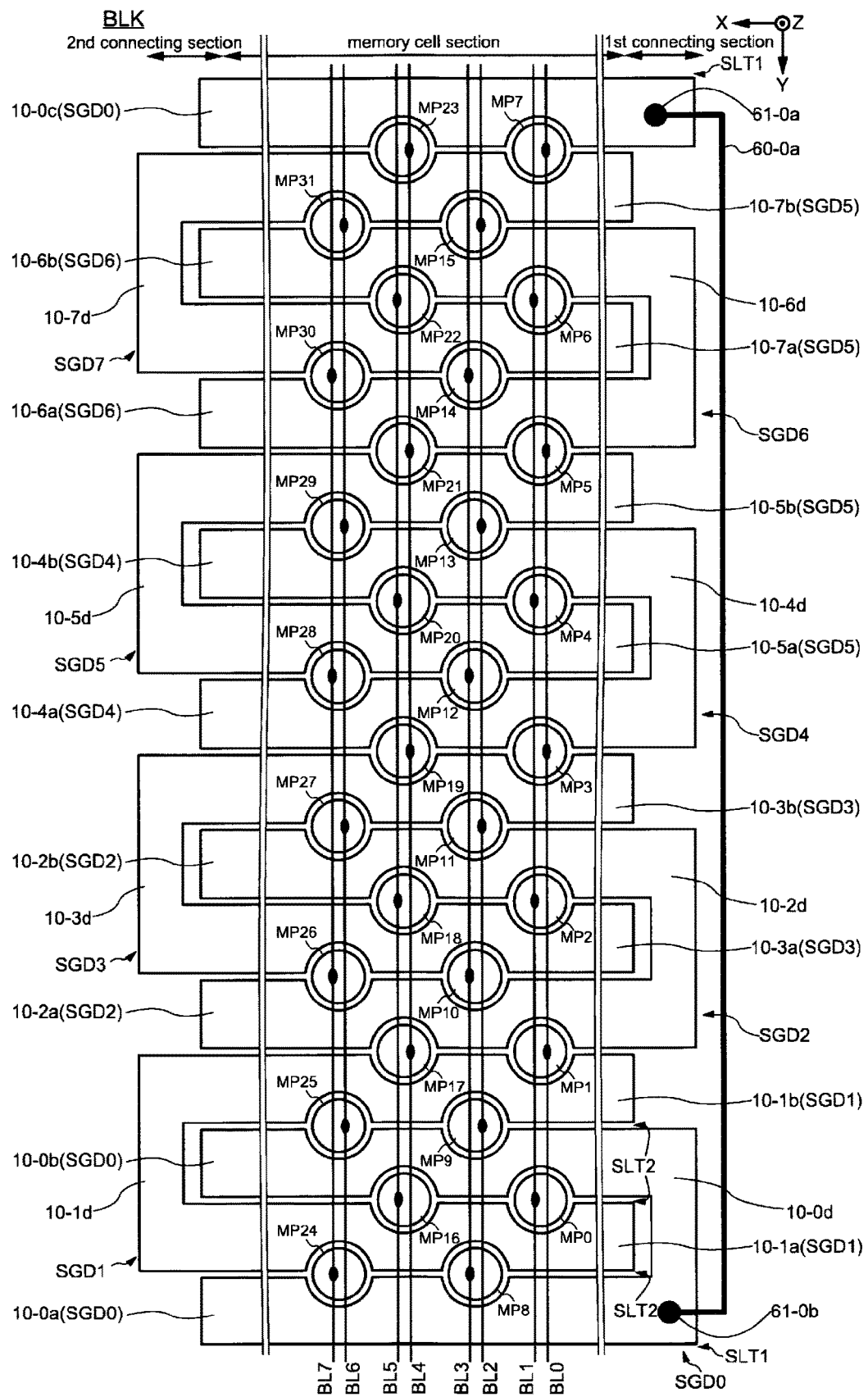
FIG. 3 is a diagram showing a planar layout of drain side select gate lines, bit lines, and memory pillars according to the first embodiment.

FIG. 3 is a schematic diagram showing a planar layout of the select gate lines SGD, the bit lines BL and the memory pillars MP, with the select gate lines SGD connected to contact plugs and wiring layers in a plane (XY plane) parallel to the source line layer of a certain block BLK. As shown in FIG. 3, in the semiconductor storage device 1, one block BLK includes eight select gate lines SGD, for example. In the description of FIG. 3, the description of the same or similar configuration as that of FIGS. 1 and 2 may be omitted.

As shown in FIG. 3, in the semiconductor storage device 1, for example, wiring layers 10-0a, 10-0b, and 10-0c extending in an X direction are connected using a first connecting section 10-0d extending in a Y direction, contact plugs 61-0a and 61-0b extending in a Z direction, and a wiring layer 60-0a. The wiring layers 10-0a and 10-0c are provided at both ends in the Y direction. The wiring layers 10-0a and 10-0b are adjacent to each other in the Y direction with a wiring layer 10-1a interposed therebetween. The first connecting section 10-0d is provided at one end in the X direction. The contact plug 61-0a is provided at one end of the wiring layer 10-0c in the Y direction, for example. The contact plug 61-0b is provided at one end of the first connecting section 10-0d, for example. The wiring layer 60-0a is a layer different from the wiring layer 10, and is connected to the wiring layer 10-0c and the first connecting section 10-0d via the contact plugs 61-0a and 61-0b, for example. Three wiring layers 10-0a, 10-0b and 10-0c serve as the select gate line SGD0.

Wiring layers 10-1a and 10-1b extending in the X direction are connected using a second connecting section 10-1d extending in the Y direction. The wiring layer 10-1a is provided between the wiring layers 10-0a and 10-0b. The wiring layer 10-1b is provided between wiring layers 10-0b and 10-2a. The second connecting section 10-1d is positioned at the other end opposite to the first connecting section 10-0d in the X direction. The two wiring layers 10-1a and 10-1b serve as the select gate line SGD1.

Wiring layers 10-2a and 10-2b extending in the X direction are connected using a first connecting section 10-2d extending in the Y direction. The wiring layer 10-2a is provided between wiring layers 10-1b and 10-3a. The wiring layer 10-2b is provided between wiring layers 10-3a and 10-3b. The first connecting section 10-2d is positioned at one end on the same side as the first connecting section 10-0d in the X direction. The two wiring layers 10-2a and 10-2b serve as the select gate line SGD2.

The wiring layers 10-3a and 10-3b extending in the X direction are connected using a second connecting section 10-3d extending in the Y direction. The wiring layer 10-3a is provided between the wiring layers 10-2a and 10-2b. The wiring layer 10-3b is provided between the wiring layers 10-2b and 10-4a. The second connecting section 10-3d is positioned at the other end opposite to the first connecting section 10-0d in the X direction. The two wiring layers 10-3a and 10-3b serve as the select gate line SGD3.

Wiring layers 10-4a and 10-4b extending in the X direction are connected using a first connecting section 10-4d extending in the Y direction. The wiring layer 10-4a is provided between wiring layers 10-3b and 10-5a. The wiring layer 10-4b is provided between wiring layers 10-5a and 10-5b. The first connecting section 10-4d is positioned at one end on the same side as the first connecting section 10-0d in the X direction. The two wiring layers 10-4a and 10-4b serve as the select gate line SGD4.

The wiring layers 10-5a and 10-5b extending in the X direction are connected using a second connecting section 10-5d extending in the Y direction. The wiring layer 10-5a is provided between the wiring layers 10-4a and 10-4b. The wiring layer 10-5b is provided between wiring layers 10-4b and 10-6a. The second connecting section 10-5d is positioned at the other end opposite to the first connecting section 10-0d in the X direction. The two wiring layers 10-5a and 10-5b serve as the select gate line SGD5.

Wiring layers 10-6a and 10-6b extending in the X direction are connected using a first connecting section 10-6d extending in the Y direction. The wiring layer 10-6a is provided between wiring layers 10-5b and 10-7a. The wiring layer 10-6b is provided between wiring layers 10-7a and 10-7b. The first connecting section 10-6d is positioned at one end on the same side as the first connecting section 10-0d in the X direction. The two wiring layers 10-6a and 10-6b serve as the select gate line SGD6.

The wiring layers 10-7a and 10-7b extending in the X direction are connected using a second connecting section 10-7d extending in the Y direction. The wiring layer 10-7a is provided between the wiring layers 10-6a and 10-6b. The wiring layer 10-7b is provided between the wiring layers 10-6b and 10-0c. The second connecting section 10-7d is positioned at the other end opposite to the first connecting section 10-0d in the X direction. The two wiring layers 10-7a and 10-7b serve as the select gate line SGD7.

In the first embodiment, a configuration in which each wiring layer is connected using the first connecting sections 10-0d, 10-2d, 10-4d, and 10-6d or second connecting sections 10-1d, 10-3d, 10-5d, and 10-7d is described as an example, but the configuration of each wiring layer is not limited to the configuration shown in the first embodiment. For example, each wiring layer may be independent, and may be controlled such that the wiring layers 10-0a, 10-0b and 10-0c are supplied with the same voltage, the wiring layers 10-1a and 10-1b are supplied with the same voltage, the wiring layers 10-2a and 10-2b are supplied with the same voltage, the wiring layers 10-3a and 10-3b are supplied with the same voltage, the wiring layers 10-4a and 10-4b are supplied with the same voltage, the wiring layers 10-5*a* and 10-5*b* are supplied with the same voltage, the wiring layers 10-6*a* and 10-6*b* are supplied with the same voltage, and the wiring layers 10-7*a* and 10-7*b* are supplied with the same voltage.

The wiring layers 10 adjacent to each other in the Y direction in the block BLK are insulated from each other. A region that insulates adjacent wiring layers 10 is referred to as slit SLT2. In the slit SLT2, for example, an insulating film (not shown) is filled in a region spanning from a plane parallel to the source line layer to at least a layer where the wiring layer 10 is provided. In the memory cell array 21, a plurality of blocks BLK shown in FIG. 3 are located in the Y direction, for example. Similarly to the wiring layers 10 adjacent to each other in the Y direction in the block BLK, an insulating film (not shown) is filled in between the blocks BLK adjacent to each other in the Y direction, and the blocks BLK adjacent to each other in the Y direction are also insulated from each other. The region that insulates the adjacent blocks BLK is referred to as slit SLT1. Similarly to the slit SLT2, in the slit SLT1, the insulating film is filled in a region spanning from the plane parallel to the source line layer to at least a layer where the wiring layer 10 is provided.

A plurality of memory pillars MP (MP0 to MP31) are provided between the wiring layers 10 adjacent to each other in the Y direction. A plurality of memory pillars MP are provided in a memory cell section. Each of the plurality of memory pillars MP extends in the Z direction. In the first embodiment, for example, the Y direction is the direction orthogonal or approximately orthogonal to the X direction, and the Z direction is the direction orthogonal or approximately orthogonal to the X and Y directions, and is the direction perpendicular or approximately perpendicular to the direction parallel to the source line layer. In the first embodiment, the memory pillars MP may be referred to as "semiconductor pillars", the X direction may be referred to as "first direction", the Y direction may be referred to as "second direction", and the Z direction may be referred to as "third direction".

Specifically, memory pillars MP8 and MP24 are provided between the wiring layers 10-0*a* and 10-1*a*. Memory pillars MP0 and MP16 are provided between the wiring layers 10-1*a* and 10-0*b*. Memory pillars MP9 and MP25 are provided between the wiring layers 10-0*b* and 10-1*b*. Memory pillars MP1 and MP17 are provided between the wiring layers 10-1*b* and 10-2*a*. Memory pillars MP10 and MP26 are provided between the wiring layers 10-2*a* and 10-3*a*. Memory pillars MP2 and MP18 are provided between the wiring layers 10-3*a* and 10-2*b*. Memory pillars MP11 and MP27 are provided between the wiring layers 10-2*b* and 10-3*b*. Memory pillars MP3 and MP19 are provided between the wiring layers 10-3*b* and 10-4*a*. Memory pillars MP12 and MP28 are provided between the wiring layers 10-4*a* and 10-5*a*. Memory pillars MP4 and MP20 are provided between the wiring layers 10-5*a* and 10-4*b*. Memory pillars MP13 and MP29 are provided between the wiring layers 10-4*b* and 10-5*b*. Memory pillars MP5 and MP21 are provided between the wiring layers 10-5*b* and 10-6*a*. Memory pillars MP14 and MP30 are provided between the wiring layers 10-6*a* and 10-7*a*. Memory pillars MP6 and MP22 are provided between the wiring layers 10-7*a* and 10-6*b*. Memory pillars MP15 and MP31 are provided between the wiring layers 10-6*b* and 10-7*b*. Memory pillars MP7 and MP23 are provided between the wiring layers 10-7*b* and 10-0*c*.

The memory pillar MP has a structure that forms the select transistors ST1, ST2 and the memory cell transistors MT. Details of the structure of the memory pillar MP will be described below.

The memory pillars MP0 to MP7 are located along the Y direction. The memory pillars MP16 to MP23 are located along the Y direction at positions adjacent to the memory pillars MP0 to MP7 in the X direction. That is, the memory pillars MP0 to MP7 and the memory pillars MP16 to MP23 are located in parallel.

The memory pillars MP8 to MP15 and the memory pillars MP24 to MP31 are respectively located along the Y direction. The memory pillars MP8 to MP15 are positioned between the memory pillars MP0 to MP7 and the memory pillars MP16 to MP23 in the X direction. The memory pillars MP16 to MP23 are interposed between the memory pillars MP24 to MP31 and the memory pillars MP8 to MP15 in the X direction. That is, the memory pillars MP8 to MP15 and the memory pillars MP24 to MP31 are located in parallel.

Two bit lines BL0 and BL1 are provided above the memory pillars MP0 to MP8. The bit line BL0 is commonly connected to the memory pillars MP1, MP3, MP5 and MP7. The bit line BL1 is commonly connected to the memory pillars MP0, MP2, MP4, and MP6. Two bit lines BL2 and BL3 are provided above the memory pillars MP8 to MP15. The bit line BL2 is commonly connected to the memory pillars MP9, MP11, MP13, and MP15. The bit line BL3 is commonly connected to the memory pillars MP8, MP10, MP12, and MP14. Each memory pillar is connected between the source line SL and the bit line BL (here, one of BL0 to BL3) corresponding to each memory pillar.

Two bit lines BL4 and BL5 are provided above the memory pillars MP16 to MP23. The bit line BL4 is commonly connected to the memory pillars MP17, MP19, MP21 and MP23. The bit line BL5 is commonly connected to the memory pillars MP16, MP18, MP20 and MP22. Two bit lines BL6 and BL7 are provided above the memory pillars MP24 to MP31. The bit line BL6 is commonly connected to the memory pillars MP25, MP27, MP29, and MP31. The bit line BL7 is commonly connected to the memory pillars MP24, MP26, MP28 and MP30.

As described above, the memory pillar MP is provided at a position straddling the two wiring layers 10 in the Y direction, and is be buried in a part of one SLT2 of a plurality of slits SLT2. One slit SLT2 is provided between memory pillars MP adjacent to each other in the Y direction.

The memory pillar MP is not provided in the region between the wiring layer 10-0*a* and the wiring layer 10-0*c* adjacent to each other with the slit SLT1 interposed therebetween. However, from the viewpoint of process stability, a dummy memory pillar MP that is not connected to the bit line BL may be provided in the region.

Figure 4:
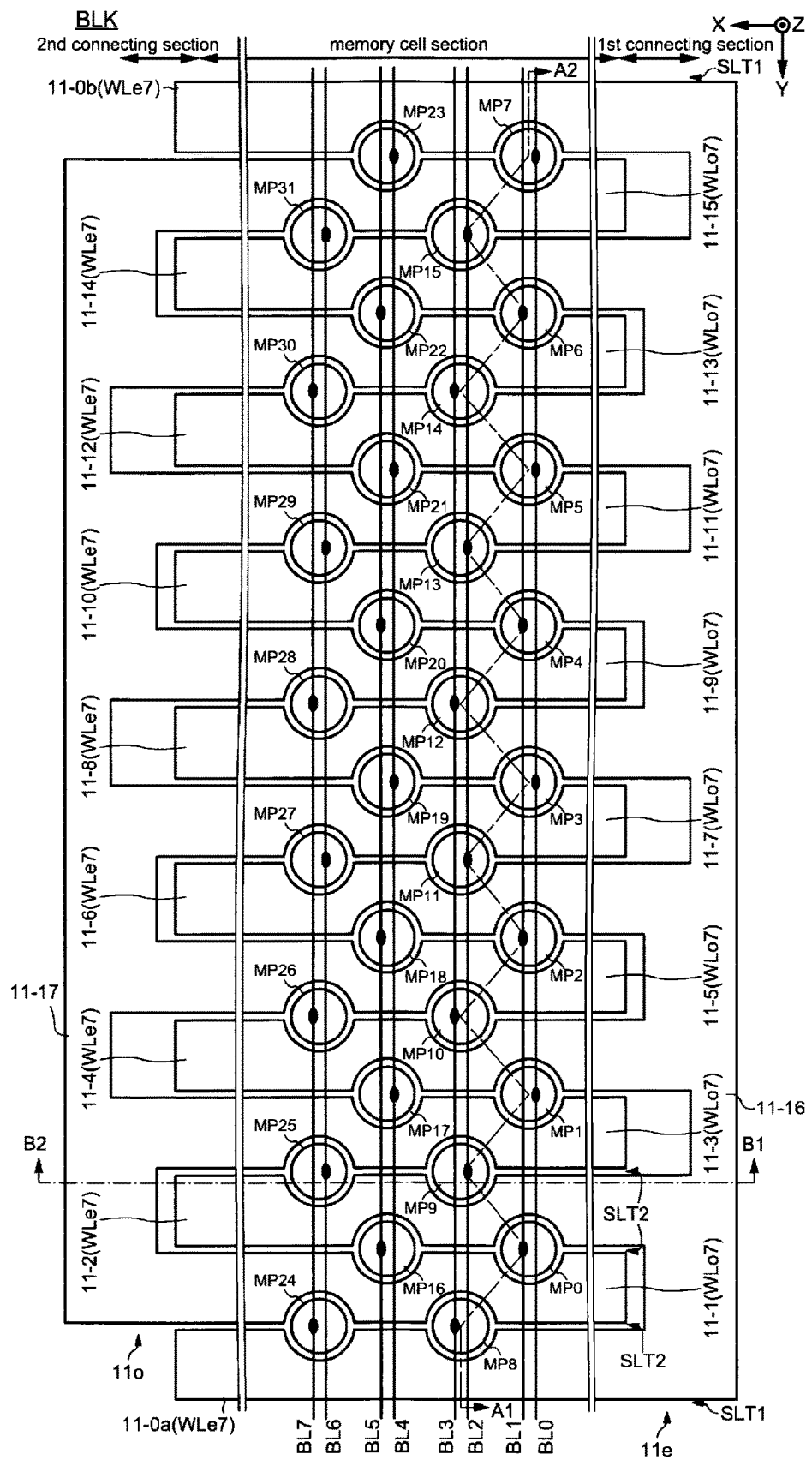
FIG. 4 is a diagram showing a planar layout of word lines and memory pillars according to the first embodiment.

FIG. 4 is a diagram showing a planar layout of the word lines WL, the bit lines BL, and the memory pillars MP on the XY plane. The layout shown in FIG. 4 corresponds to the layout of the one-block region shown in FIG. 3, and is the layout of a wiring layer 11 provided below the wiring layer 10 shown in FIG. 3. In the description of FIG. 4, the description of the same or similar configuration as that of FIGS. 1 to 3 may be omitted.

As shown in FIG. 4, seventeen wiring layers 11 (wiring layers 11-0*a*, 11-0*b*, and 11-1 to 11-15) extending in the X direction are located along the Y direction. The wiring layers 11-0*a*, 11-0*b*, and 11-1 to 11-15 are located below the wiring layers 10-0 to 10-7 in the Z direction. An insulating film is provided between the wiring layers 11-0a, 11-0b, and 11-1 to 11-15 and the wiring layers 10-0 to 10-7.

Each wiring layer 11 serves as a word line WL7. Other word lines WL0 to WL6 have the same configuration and function as the word line WL7. In the example shown in FIG. 4, wiring layers 11-0a, 11-2, 11-4, 11-6, 11-8, 11-10, 11-12, 11-14 and 11-0b serve as even word lines WLe7. The wiring layers 11-0a, 11-2, 11-4, 11-6, 11-8, 11-10, 11-12, 11-14 and 11-0b are connected using a first connecting section 11-16 extending in the Y direction. The first connecting section 11-16 is provided at one end in the X direction. The wiring layers 11-0a, 11-2, 11-4, 11-6, 11-8, 11-10, 11-12, 11-14 and 11-0b are connected to the row decoder 29 using the first connecting section 11-16. In the semiconductor storage device 1, the first connecting section 11-16 and the wiring layers 11-0a, 11-2, 11-4, 11-6, 11-8, 11-10, 11-12, 11-4 and 11-0b may be collectively referred to as wiring layer 11e.

The wiring layers 11-1, 11-3, 11-5, 11-7, 11-9, 11-11, 11-13 and 11-15 serve as the odd word line WLo7. The wiring layers 11-1, 11-3, 11-5, 11-7, 11-9, 11-11, 11-13 and 11-15 are connected using a second connecting section 11-17 extending in the Y direction. The second connecting section 11-17 is provided at the other end opposite to the first connecting section 11-16 in the X direction. The wiring layers 11-1, 11-3, 11-5, 11-7, 11-9, 11-11, 11-13 and 11-15 are connected to the row decoder 29 using the second connecting section 11-17. In the semiconductor storage device 1, the second connecting section 11-17 and the wiring layers 11-1, 11-3, 11-5, 11-7, 11-9, 11-11, 11-13 and 11-15 may be collectively referred to as wiring layer 11o.

Similarly to the wiring layers 10 adjacent to each other in the Y direction in the block BLK, the wiring layers 11 adjacent to each other in the Y direction in the block BLK are insulated using the slit SLT2.

Similarly to the wiring layers 10 adjacent to each other in the Y direction, a plurality of memory pillars MP (MP0 to MP31) are provided between the wiring layers 11 adjacent to each other in the Y direction.

Specifically, the memory pillars MP8 and MP24 are provided between the wiring layers 11-0a and 11-1. The memory pillars MP0 and MP16 are provided between the wiring layers 11-1 and 11-2. The memory pillars MP9 and MP25 are provided between the wiring layers 11-2 and 11-3. As shown in FIG. 4, similarly to the intervals between each of the wiring layers 11-0a, 11-1, 11-2, and 11-3, the memory pillars MP corresponding to the intervals between the respective wiring layers are provided between each of the wiring layers 11-3 to 11-5, and the memory pillars MP7 and MP23 are provided between the wiring layers 11-15 and 11-0b.

The mutual positional relationship and arrangement of the memory pillars MP0 to MP31 are the same as the positional relationship and arrangement shown in FIG. 3. The memory pillar MP is provided at a position straddling the two wiring layers 11 in the Y direction, and is buried in a part of one SLT2 of the plurality of slits SLT2. One slit SLT2 is provided between memory pillars MP adjacent to each other in the Y direction.

The memory pillar MP is not provided in the region between the wiring layers 11-0a and 11-0b adjacent to each other with the slit SLT1 interposed therebetween. However, from the viewpoint of process stability, a dummy memory pillar MP that is not connected to the bit line BL may be provided in the region.

A memory cell section is provided between the first connecting section 11-16 and the second connecting section 11-17. In the memory cell section, the wiring layers 11 adjacent to each other in the Y direction are separated by the slits SLT2 shown in FIG. 3. Similarly to the slits SLT2, the wiring layers 11 between the blocks BLK adjacent to each other in the Y direction are separated by the slits SLT1. Like FIG. 3, the memory cell section includes memory pillars MP0 to MP31.

The word lines WL0 to WL6 have the same configuration and function as word line WL7 shown in FIG. 4.

Figure 5:
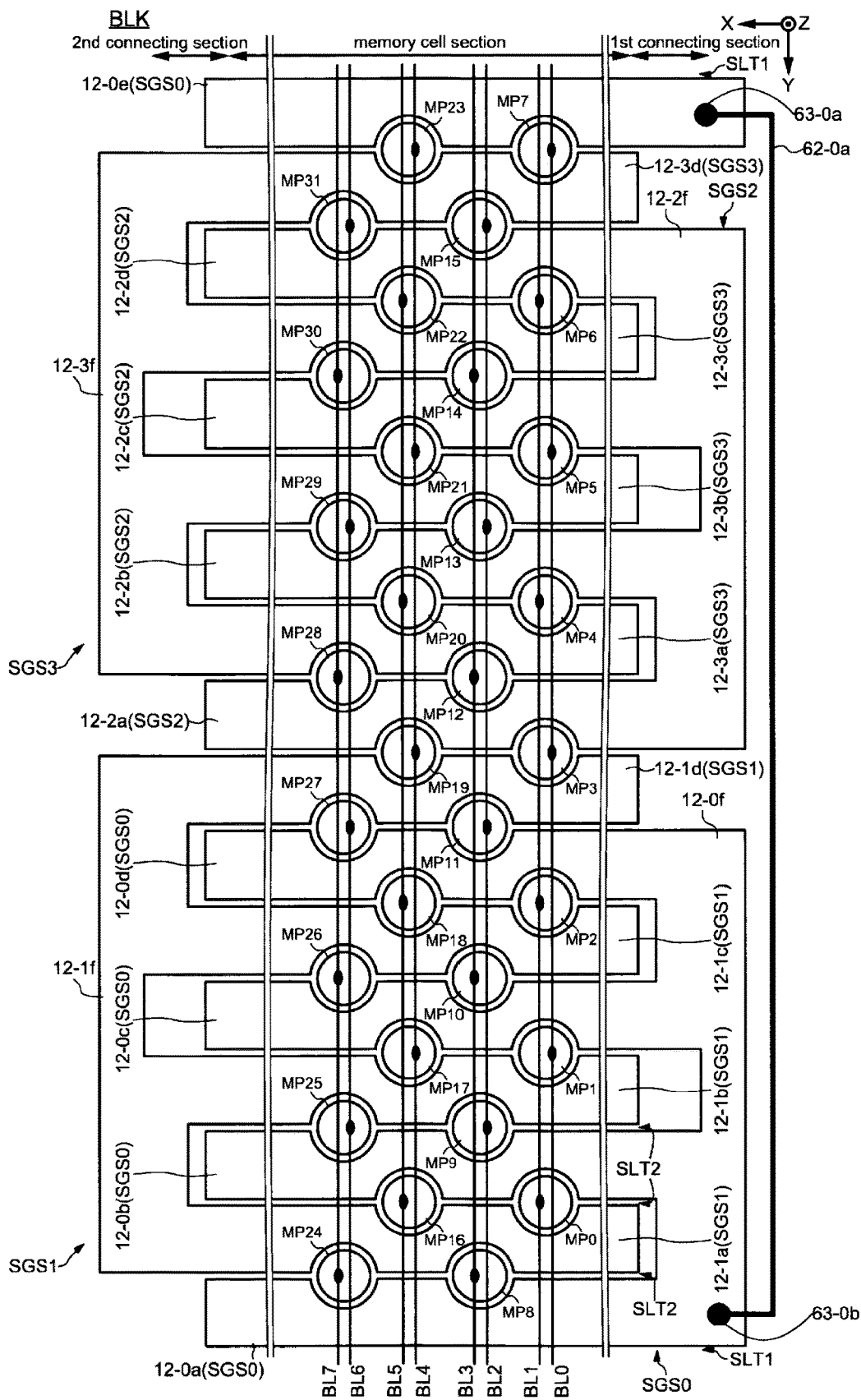
FIG. 5 is a diagram showing a planar layout of source side select gate lines, bit lines, and memory pillars according to the first embodiment.

FIG. 5 is a diagram showing a planar layout of the select gate lines SGS, the bit lines BL, and the memory pillars MP on the XY plane. As shown in FIG. 5, in the semiconductor storage device 1, one block BLK includes four select gate lines SGS, for example. The layout shown in FIG. 5 corresponds to the layout of the one-block region shown in FIG. 3, and is the layout of a wiring layer 12 provided below the wiring layer 11 shown in FIG. 4. In the description of FIG. 5, the description of the same or similar configuration as that of FIGS. 1 to 4 may be omitted.

As shown in FIG. 5, in the semiconductor storage device 1, for example, wiring layers 12-0a, 12-0b, 12-0c, 12-0d, and 12-0e extending in the X direction are connected using a first connecting section 12-0f extending in the Y direction, contact plugs 63-0a and 63-0b extending in the Z direction, and a wiring layer 62-0a. The wiring layers 12-0a and 12-0e are provided at both ends in the Y direction. The wiring layers 12-0a and 12-0b are adjacent to each other in the Y direction with a wiring layer 12-1a interposed therebetween. The wiring layer 12-0b and the wiring layer 12-0c are adjacent to each other in the Y direction with a wiring layer 12-1b interposed therebetween. The wiring layer 12-0c and the wiring layer 12-0d are adjacent to each other in the Y direction with a wiring layer 12-1c interposed therebetween. The wiring layer 12-0d and a wiring layer 12-2a are adjacent to each other in the Y direction with a wiring layer 12-1d interposed therebetween. The first connecting section 12-0f is provided at one end in the X direction. The contact plug 63-0a is provided at one end of the wiring layer 12-0e in the Y direction, for example. The contact plug 63-0b is provided at one end of the first connecting section 12-0f, for example. The wiring layer 62-0a is a layer different from the wiring layer 12, and is connected to the wiring layer 12-0e and the first connecting section 12-0f via the contact plugs 63-0a and 63-0b, for example. The five wiring layers 12-0a, 12-0b, 12-0c, 12-0d, and 12-0e serve as the select gate line SGS0.

The wiring layers 12-1a, 12-1b, 12-1c, and 12-1d extending in the X direction are connected using a second connecting section 12-1f extending in the Y direction. The wiring layer 12-1a is provided between the wiring layers 12-0a and 12-0b. The wiring layer 12-1b is provided between the wiring layers 12-0b and 12-0c. The wiring layer 12-1c is provided between the wiring layers 12-0c and 12-0d. The wiring layer 12-1d is provided between the wiring layers 12-0d and 12-2a. The second connecting section 12-1f is positioned at the other end opposite to the first connecting section 12-0f in the X direction. The four wiring layers 12-1a, 12-1b, 12-1c, and 12-1d serve as the select gate line SGS1.

Wiring layers 12-2a, 12-2b, 12-2c, and 12-2d extending in the X direction are connected using a first connecting section 12-2f extending in the Y direction. The wiring layers 12-2a and 12-2d are provided at both ends in the Y direction. The wiring layer 12-2a and the wiring layer 12-2b are adjacent to each other in the Y direction with a wiring layer 12-3a interposed therebetween. The wiring layer 12-2b and the wiring layer 12-2c are adjacent to each other in the Y direction with a wiring layer 12-3b interposed therebetween.

The wiring layer 12-2*c* and the wiring layer 12-2*d* are adjacent to each other in the Y direction with a wiring layer 12-3*c* interposed therebetween. The first connecting section 12-2*f* is provided at one end in the X direction. The four wiring layers 12-2*a*, 12-2*b*, 12-2*c*, and 12-2*d* serve as the select gate lines SGS2.

Wiring layers 12-3*a*, 12-3*b*, 12-3*c*, and 12-3*d* extending in the X direction are connected using a second connecting section 12-3*f* extending in the Y direction. The wiring layer 12-3*a* is provided between the wiring layers 12-2*a* and 12-2*b*. The wiring layer 12-3*b* is provided between the wiring layers 12-2*b* and 12-2*c*. The wiring layer 12-3*c* is provided between the wiring layers 12-2*c* and 12-2*d*. The wiring layer 12-3*d* is provided between the wiring layers 12-2*d* and 12-0*e*. The second connecting section 12-3*f* is positioned at the other end opposite to the first connecting section 12-2*f* in the X direction. The four wiring layers 12-3*a*, 12-3*b*, 12-3*c*, and 12-3*d* serve as the select gate line SGS3.

In the first embodiment, the wiring layers are connected using the first connecting sections 12-0*f* and 12-2*f* or the second connecting sections 12-1*f* and 12-3*f*, but the configuration of the wiring layer is not limited to the configuration shown in the first embodiment. For example, each wiring layer may be independent, and controlled such that the same voltage is supplied to the wiring layers 12-0*a*, 12-0*b*, 12-0*c*, 12-0*d*, and 12-0*e*, the same voltage is supplied to the wiring layers 12-1*a*, 12-1*b*, 12-1*c* and 12-1*d*, the same voltage is supplied to the wiring layers 12-2*a*, 12-2*b*, 12-2*c* and 12-2*d*, and the same voltage is supplied to the wiring layers 12-3*a*, 12-3*b*, 12-3*c* and 12-3*d*.

Similarly to the wiring layers 10 and 11 adjacent to each other in the Y direction in the block BLK, the wiring layers 12 adjacent to each other in the Y direction in the block BLK are insulated using the slit SLT2.

Similarly to the wiring layers 10 and 11 adjacent to each other in the Y direction, a plurality of memory pillars MP (MP0 to MP31) are provided between the wiring layers 12 adjacent to each other in the Y direction.

Specifically, memory pillars MP8 and MP24 are provided between the wiring layers 12-0*a* and 12-1*a*. Memory pillars MP0 and MP16 are provided between the wiring layers 12-1*a* and 12-0*b*. Memory pillars MP9 and MP25 are provided between the wiring layers 12-0*b* and 12-1*b*. As shown in FIG. 5, similarly to the intervals between each of the wiring layers 12-0*a*, 12-1*a*, 12-0*b* and 12-1*b*, the memory pillars MP corresponding to the intervals between the respective wiring layers are provided between the wiring layers 12-1*b* to 12-3*d*, and the memory pillars MP7 and MP23 are provided between the wiring layers 12-3*d* and 12-0*e*.

The mutual positional relationship and arrangement of the memory pillars MP0 to MP31 are the same as the positional relationship and arrangement shown in FIG. 3. The memory pillar MP is provided at a position straddling the two wiring layers 12 in the Y direction, and is buried in a part of one SLT2 of the plurality of slits SLT2. One slit SLT2 is provided between memory pillars MP adjacent to each other in the Y direction.

The memory pillar MP is not provided in the region between the wiring layers 12-0*e* and 12-0*a* adjacent to each other with the slit SLT1 interposed therebetween. Meanwhile, from the viewpoint of process stability, a dummy memory pillar MP that is not connected to the bit line BL may be provided in the region.

Although details will be described below, in the semiconductor storage device 1, one block BLK includes two groups (a first group Finger0 and a second group Finger1 (FIG. 16)). The first group Finger0 is disposed adjacent to the second group Finger1. For example, referring to FIG. 3, there are boundaries in the Y direction between the wiring layers 10-3*b* and 10-4*a* and between the wiring layers 10-7*b* and 10-0*c*. The first group Finger0 includes a region between the wiring layer 10-0*a* and the boundary between the wiring layers 10-3*b* and 10-4*a*, and a region between the boundary between the wiring layers 10-7*b* and 10-0*c* and the wiring layer 10-0*c*. The second group Finger1 includes a region between the boundary between the wiring layers 10-3*b* and 10-4*a* and the boundary between the wiring layers 10-7*b* and 10-0*c*. For example, referring to FIG. 4, there are boundaries in the Y direction between the wiring layers 11-6 and 11-7 and between the wiring layers 11-15 and 11-0*b*. The first group Finger0 includes a region between the wiring layer 11-0*a* and the boundary between the wiring layers 11-6 and 11-7, and a region between the boundary between the wiring layers 11-15 and 11-0*b* and the wiring layer 11-0*b*. The second group Finger1 includes a region between the boundary between the wiring layers 11-6 and 11-7 and the boundary between the wiring layers 11-15 and 11-0*b*. For example, referring to FIG. 5, there are boundaries in the Y direction between the wiring layers 12-0*d* and 12-1*d* and between the wiring layers 12-3*d* and 12-0*e*. The first group Finger0 includes a region between the wiring layer 12-0*a* and the boundary between the wiring layers 12-0*d* and 12-1*d*, and a region between the boundary between the wiring layers 12-3*d* and 12-0*e* and the wiring layer 12-0*e*. The second group Finger1 includes a region between the boundary between the wiring layers 12-0*d* and 12-1*d* and the boundary between the wiring layers 12-3*d* and 12-0*e*.

1-1-5. Cross-Sectional Structure of Memory Cell Array

Figure 6:
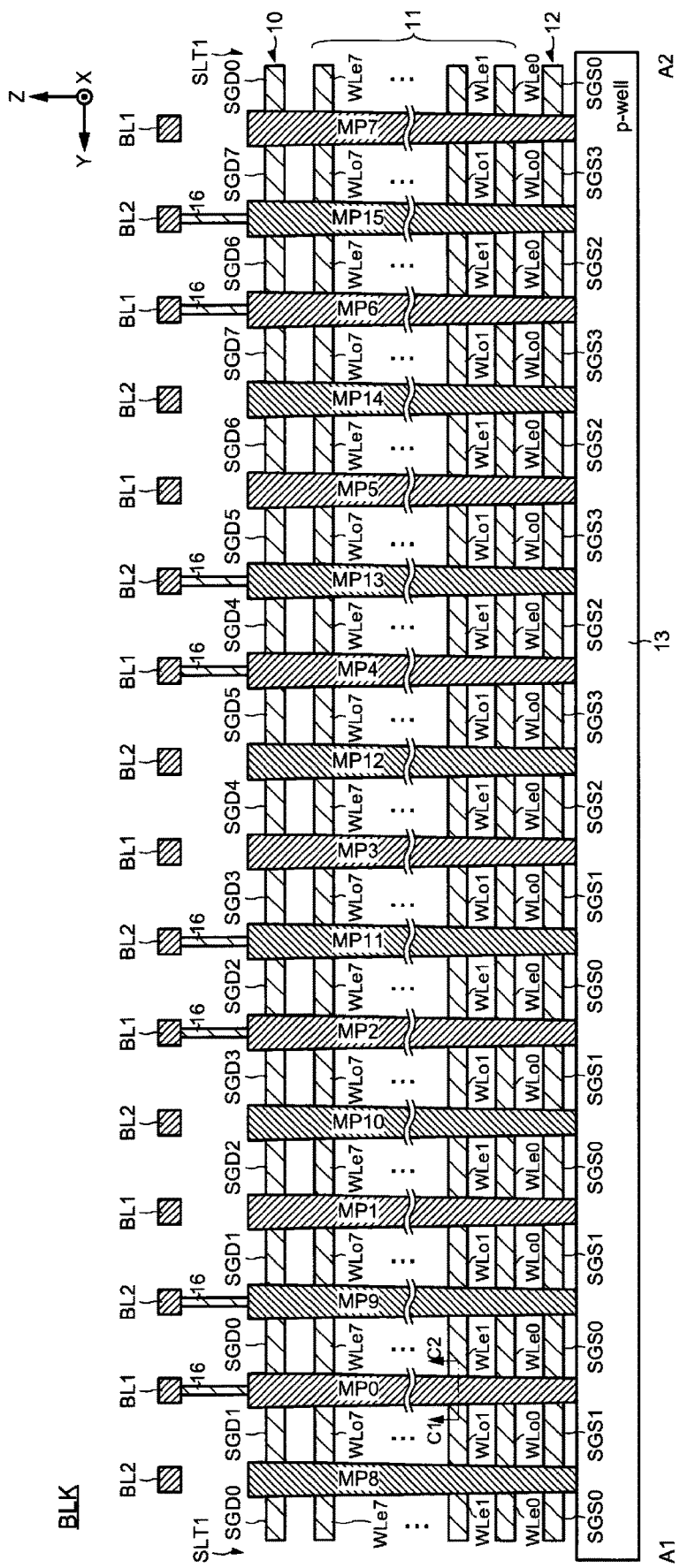
FIG. 6 is a cross-sectional view along line A1-A2 of the semiconductor storage device shown in FIG. 4.

FIG. 6 is a view showing the cross section along A1-A2 shown in FIG. 4. In the description of FIG. 6, the description of the same or similar configuration as that of FIGS. 1 to 5 may be omitted.

As shown in FIG. 6, the wiring layer 12 is provided above a p-type well region (p-well) of a semiconductor substrate 13 along the Z direction. The semiconductor substrate 13 serves as the source line SL, for example. The wiring layer 12 serves as the select gate line SGS, for example. The eight wiring layers 11 are stacked above the wiring layers 12 along the Z direction. The eight wiring layers 11 serve as the word lines WL and correspond to the word lines WL0 to WL7, respectively, for example. The wiring layer 10 is provided above the uppermost wiring layer 11 of the eight wiring layers 11. The wiring layer 10 serves as the select gate line SGD, for example.

The wiring layer 12 serves as the select gate lines SGS (SGS0 to SGS3). The select gate lines SGS0 and SGS1 are alternately disposed in the Y direction between the slit SLT1 and the memory pillar MP3, and the select gate lines SGS2 and SGS3 are alternately disposed in the Y direction between the memory pillars MP3 and MP7. The select gate line SGS0 is disposed between the memory pillar MP7 and the slit SLT1. The memory pillar MP is provided between the select gate lines SGS adjacent to each other in the Y direction. The select gate lines SGS0 to SGS3 are driven electrically independently. Although not shown, in a cross section cut parallel or approximately parallel to the Y direction, the select gate lines SGS0 and SGS1 are located alternately in the Y direction via the slit SLT2, the select gate lines SGS1 and SGS2 are located adjacent to each other in the Y direction via the slit SLT2, and the select gate lines SGS2 and SGS3 are alternately disposed in the Y direction via the slit SLT2.

The wiring layer 11 serves as the even word lines WLe or the odd word lines WLo. The memory pillar MP is provided between the even word lines WLe and the odd word lines WLo adjacent to each other in the Y direction. Memory cells, which will be described below, are provided between the memory pillars MP and the even word lines WLe and between the memory pillars MP and the odd word lines WLo. Although not shown, in a cross section cut parallel or approximately parallel to the Y direction, the even word lines WLe and the odd word lines WLo are alternately disposed in the Y direction via the slits SLT2.

The wiring layer 10 serves as the select gate lines SGD (SGD0 to SGD7). The select gate lines SGD0 and SGD1 are alternately disposed in the Y direction between the slit SLT1 and the memory pillar MP1. The select gate lines SGD2 and SGD3 are alternately disposed in the Y direction between the memory pillar MP1 and the memory pillar MP3. The select gate lines SGD4 and SGD5 are alternately disposed in the Y direction between the memory pillar MP3 and the memory pillar MP5. The select gate lines SGD6 and SGD7 are alternately disposed in the Y direction between the memory pillar MP5 and the memory pillar MP7. The select gate line SGD0 is disposed between the memory pillar MP7 and the slit SLT1. The memory pillar MP is provided between the select gate lines SGD adjacent to each other in the Y direction. The select gate lines SGD0 to SGD7 are driven electrically independently. Although not shown, in a cross section cut parallel or approximately parallel to the Y direction, the select gate lines SG are alternately disposed in the Y direction via the slits SLT2.

The slit SLT1 is provided between blocks BLK adjacent to each other in the Y direction. The slit SLT1 is provided with an insulating layer, for example. The width of the slit SLT1 along the Y direction is substantially the same as the width of the slit SLT2 along the Y direction.

In the semiconductor storage device 1, the source line SL is provided on a main surface of the semiconductor substrate 13. The source line SL may have a configuration in which an un-patterned conductive layer extends across the region of the memory cell array 21, or have a configuration in which a linearly patterned conductive layer extends across the region. In other words, the source line SL extends in the X and Y directions.

The bit lines BL1 and BL2 are provided on the memory pillar MP. A contact plug 16 is provided between each memory pillar MP and the bit line BL. The contact plug 16 connects each memory pillar MP and the bit line BL. For example, the memory pillars MP0, MP2, MP4 and MP6 and the bit lines BL1 are connected via the contact plugs 16. The memory pillars MP9, MP11, MP13 and MP15 and the bit lines BL2 are connected via the contact plugs 16. Other memory pillars MP are connected to the bit line BL0 or bit lines BL3 to BL7 via the contact plugs 16 in regions other than the cross section shown in FIG. 6.

Figure 7:
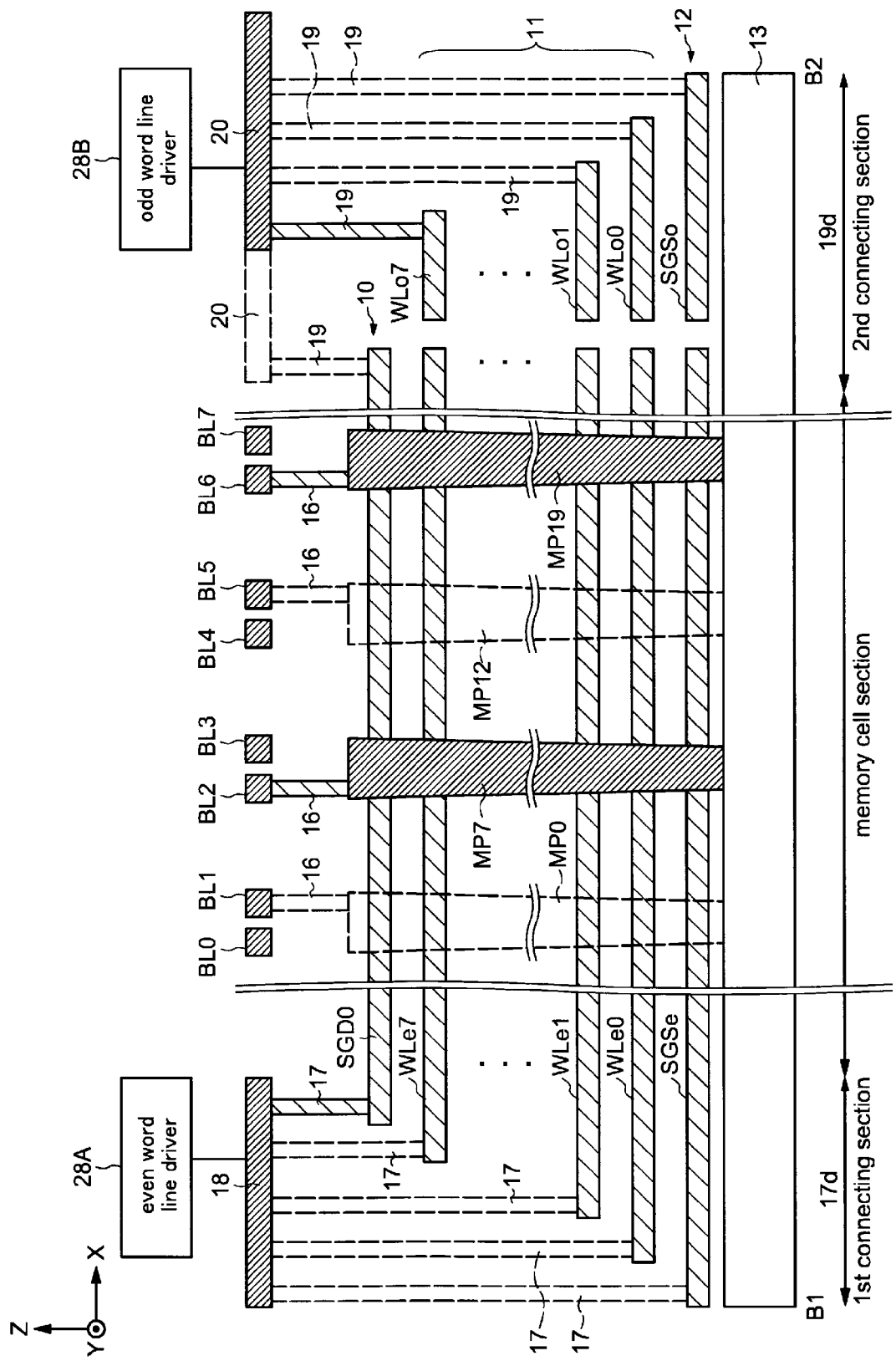
FIG. 7 is a cross-sectional view along line B1-B2 of the semiconductor storage device shown in FIG. 4.

FIG. 7 is a diagram showing a cross section along B1-B2 of the semiconductor storage device 1 shown in FIG. 4. In the description of FIG. 7, the description of the same or similar configuration as that of FIGS. 1 to 6 may be omitted. Since the stacked structure of the wiring layers 12, 11 and 10 and the configuration of the memory cell section are described above with reference to FIG. 6, description thereof will be omitted here. It should be noted that the configuration in the depth direction of the B1-B2 cross section is drawn with a dotted line in FIG. 7.

As shown in FIG. 7, the wiring layers 10, 11, and 12 are formed stepwise in a first connecting section 17d. That is, when viewed in the XY plane, upper surfaces of ends of the wiring layer 10, the eight wiring layers 11 and the wiring layers 12 are exposed in the first connecting section 17d. Contact plugs 17 are provided on the upper surfaces of the ends of the wiring layer 10, the eight wiring layers 11 and the wiring layers 12 exposed in the first connecting section 17d. The contact plugs 17 are connected to a metal wiring layer 18. For example, using the metal wiring layer 18, the wiring layer 10 serving as the select gate lines SGD0, SGD2, SGD4 and SGD6, the wiring layers 11 serving as even word lines WLe, and the wiring layers 12 serving as the select gate lines SGS0 and SGS2 are electrically connected to the even word line driver 28A via the row decoders 29 (FIG. 1). For example, the metal wiring layer 18 may be the wiring layer 60-0a (FIG. 3) described above or the wiring layer 62-0a (FIG. 5) described above. The contact plugs 17 may be the contact plugs 61-0a and 61-0b (FIG. 3) described above, or the contact plugs 63-0a and 63-0b (FIG. 5) described above, for example.

Similarly to the first connecting section 17d, the wiring layers 10, 11, and 12 are formed stepwise in a second connecting section 19d. When viewed in the XY plane, the upper surfaces of the ends of the wiring layer 10, the eight wiring layers 11 and the wiring layers 12 are exposed in the second connecting section 19d. Contact plugs 19 are provided on the upper surfaces of the end of the wiring layer 10, and on the upper surfaces of the ends of the eight wiring layers 11 and 12 exposed in the second connecting section 19d, and the contact plugs 19 are connected to a metal wiring layer 20. For example, using the metal wiring layer 20, the wiring layers 11 serving as the select gate lines SGD1, SGD3, SGD5 and SGD7, and the odd word lines WLo, and the wiring layers 12 serving as the select gate lines SGS1 and SGS3 are electrically connected to the odd word line driver 28B via the row decoder 29 (FIG. 1).

The wiring layer 10 may be electrically connected to the row decoder 29 or the even word line driver 28A and the odd word line driver 28B via the second connecting section 19d instead of the first connecting section 17d, or electrically connected to the row decoder 29 or the even word line driver 28A and the odd word line driver 28B via both the first connecting section 17d and the second connecting section 19d.

Figure 8:
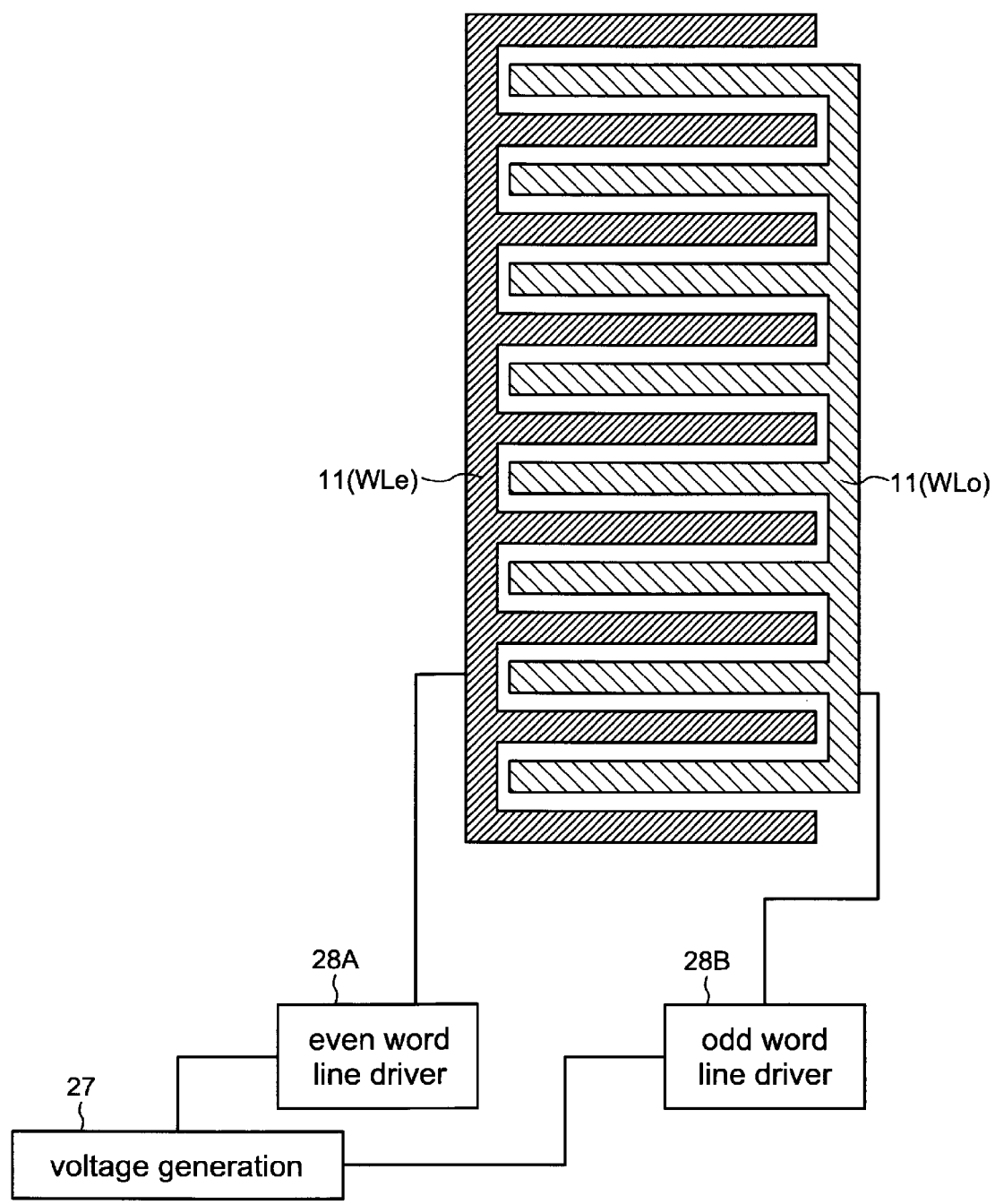
FIG. 8 is a diagram illustrating electrical connections of a voltage generation circuit, a driver set, select gate lines and word lines according to the first embodiment.

FIG. 8 is a diagram illustrating an electrical connection of the voltage generation circuit 27, the driver set 28, the select gate line SGD or the word line WL according to the first embodiment. In the description of FIG. 8, the description of the same or similar configuration as that of FIGS. 1 to 7 may be omitted.

As shown in FIG. 8, the wiring layers 11 serving as even word lines WLe may be connected to the even word line driver 28A, and the wiring layers 11 serving as odd word lines WLo may be electrically connected to the odd word line driver 28B. As described in section 1-1-2, the driver set 28 includes the even word line driver 28A and the odd word line driver 28B. The driver set 28 is electrically connected to the voltage generation circuit 27. The even word line driver 28A and the odd word line driver 28B may generate various voltages using the voltage supplied from the voltage generation circuit 27; the even word line driver 28A may supply the generated voltage to the even word line WLe, and the odd word line driver 28B may supply the generated voltage to the odd word line WLo.

1-1-6. Cross Section of Memory Pillar MP and Memory Cell Transistor MT

1-1-6-1. First Example

Figure 9:
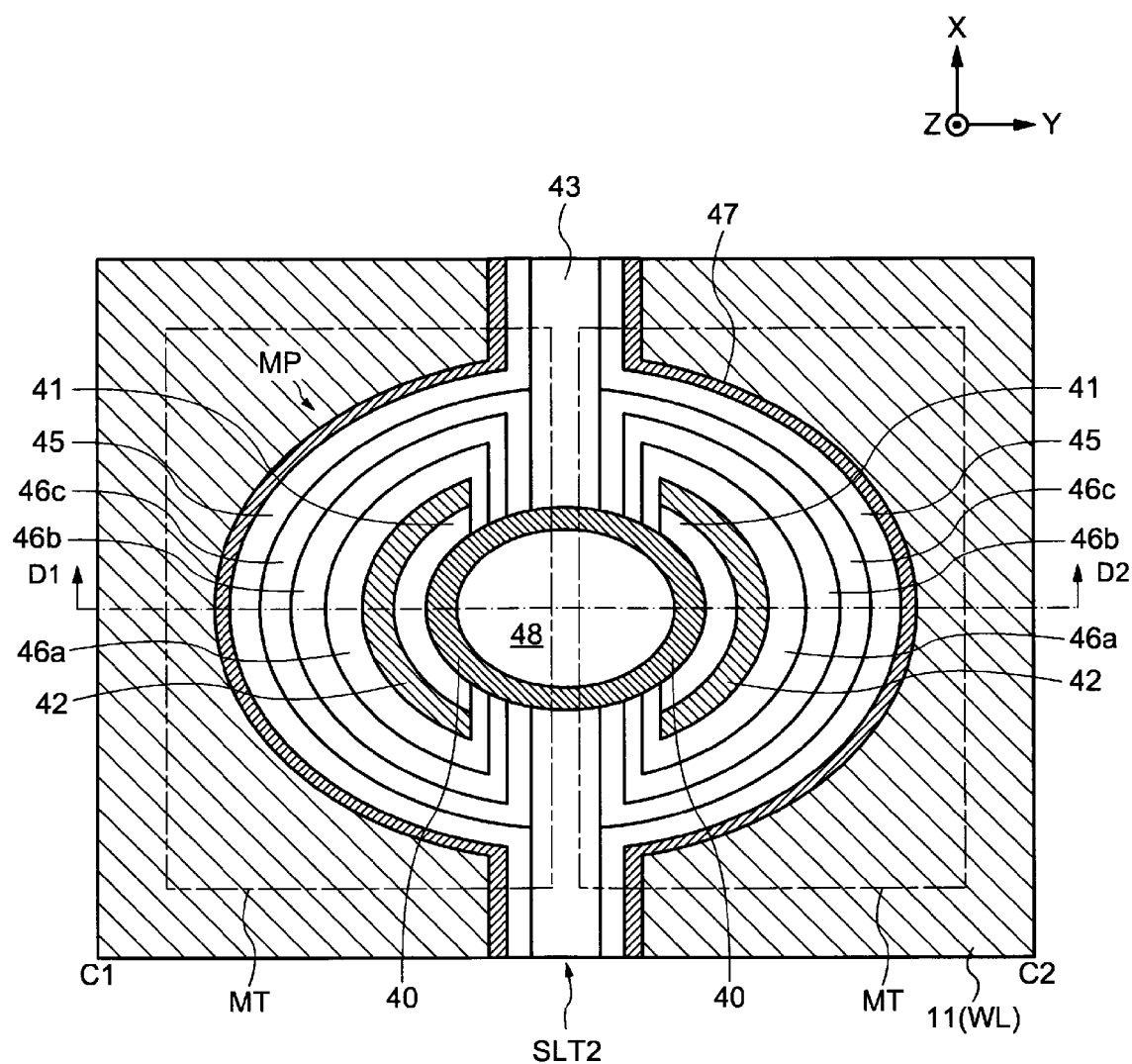
FIG. 9 is a cross-sectional view along line C1-C2 of a memory cell transistor shown in FIG. 6 in the first example.
Figure 10:
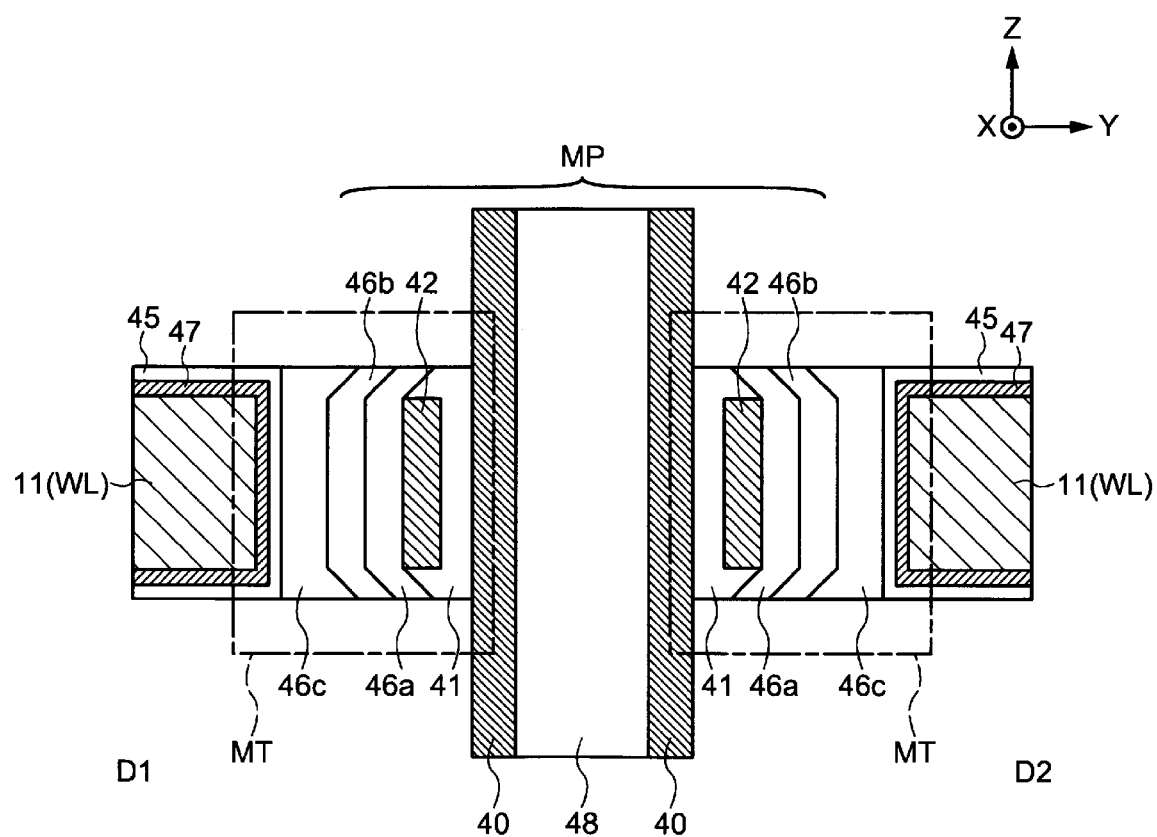
FIG. 10 is a cross-sectional view along line D1-D2 of the memory cell transistor shown in FIG. 9.

The structure of the first example shown in FIGS. 9 and 10 is used as the structure of the memory cell transistor MT. FIG. 9 is a view showing a cross section along a line C1-C2 of FIG. 6, and FIG. 10 is a view showing a cross section along a line D1-D2 of the memory cell transistor MT shown in FIG. 9. FIGS. 9 and 10 are cross-sectional views showing a region including two memory cell transistors MT. In the first example, the charge storage layer in the memory cell transistor MT is a conductive film. In the first example, the memory cell transistor MT is a floating gate type memory cell transistor MT. In the description of FIGS. 9 and 10, the same or similar components as those of FIGS. 1 to 8 may be omitted.

As shown in FIGS. 9 and 10, the memory pillar MP includes, provided along the Z direction, insulating layers 48 and 43, a semiconductor layer 40, an insulating layer 41, a conductive layer 42, and insulating layers 46a to 46c. The insulating layer 48 is formed using a silicon oxide film, for example. The semiconductor layer 40 surrounds the insulating layer 48. The semiconductor layer 40 serves as a region where a channel of the memory cell transistor MT is formed. The semiconductor layer 40 is formed using a polycrystalline silicon layer, for example. The semiconductor layer 40 is continuously provided between the memory cell transistors MT in the same memory pillar MP and is not separated between the memory cell transistors MT. Therefore, the channels formed in each of the two memory cell transistors MT share a part of the memory pillar MP.

The semiconductor layer 40 is continuously provided between two memory cell transistors MT that face each other. Therefore, the channels formed in each of the two facing memory cell transistors MT share a part of the memory pillar MP. Specifically, in FIGS. 9 and 10, in the left memory cell transistor MT and the right memory cell transistor MT facing each other, a channel formed by the first memory cell and a channel formed by the third memory cell share a part of the memory pillar MP. Here, the two channels sharing a part of the memory pillar MP means that the two channels are formed in the same memory pillar MP and that the two channels partially overlap with each other. In the semiconductor storage device 1, the configuration described above may be the two memory cell transistors MT sharing a channel or the two memory cell transistors MT facing each other.

The insulating layer 41 is provided around the semiconductor layer 40 and serves as a gate insulating film of each memory cell transistor MT. The insulating layer 41 is separated into two regions in the XY plane shown in FIG. 9. Each insulating layer 41 separated into two regions serves as a gate insulating film of the two memory cell transistors MT in the same memory pillar MP. The insulating layer 41 is formed using a stacked structure of a silicon oxide film and a silicon nitride film, for example.

The conductive layer 42 is provided around the insulating layer 41 and separated into two regions along the Y direction by the insulating layer 43. Each conductive layer 42 separated into two regions serves as a charge storage layer for each of the two memory cell transistors MT. The conductive layer 42 is formed using a polycrystalline silicon layer, for example.

The insulating layer 43 is formed using a silicon oxide film, for example. An insulating layer 46a, an insulating layer 46b, and an insulating layer 46c are provided around the conductive layer 42 in the order of proximity to the conductive layer 42. For example, the insulating layers 46a and 46c are formed using a silicon oxide film and the insulating layer 46b is formed using a silicon nitride film. The insulating layers 46a, 46b, and 46c serve as block insulating films of the memory cell transistor MT. The insulating layers 46a, 46b, and 46c are separated into two regions along the Y direction. The insulating layer 43 is provided between the insulating layer 46c separated into two regions. The insulating layer 43 is buried in the slit SLT2. The insulating layer 43 is formed using a silicon oxide film, for example.

For example, an AlO layer 45 is provided around the first example of the memory pillar MP. For example, a barrier metal layer 47 is provided around the AlO layer 45. The barrier metal layer 47 is formed using a TiN film, for example. The wiring layer 11 serving as the word line WL is provided around the barrier metal layer 47. The wiring layer 11 of the memory pillar MP according to the first embodiment is formed using a film made of tungsten, for example.

In the configuration of the memory cell transistors MT shown in FIGS. 9 and 10, two memory cell transistors MT are provided along the Y direction in one memory pillar MP. The select transistors ST1 and ST2 have the same configuration as the memory cell transistor MT. An insulating layer (not shown) is provided between the memory cell transistors MT adjacent to each other in the Z direction, and the conductive layer 42 is insulated for each memory cell transistor MT by the insulating layer not shown and the insulating layer 43 and 46.

1-1-6-2. Second Example

Figure 11:
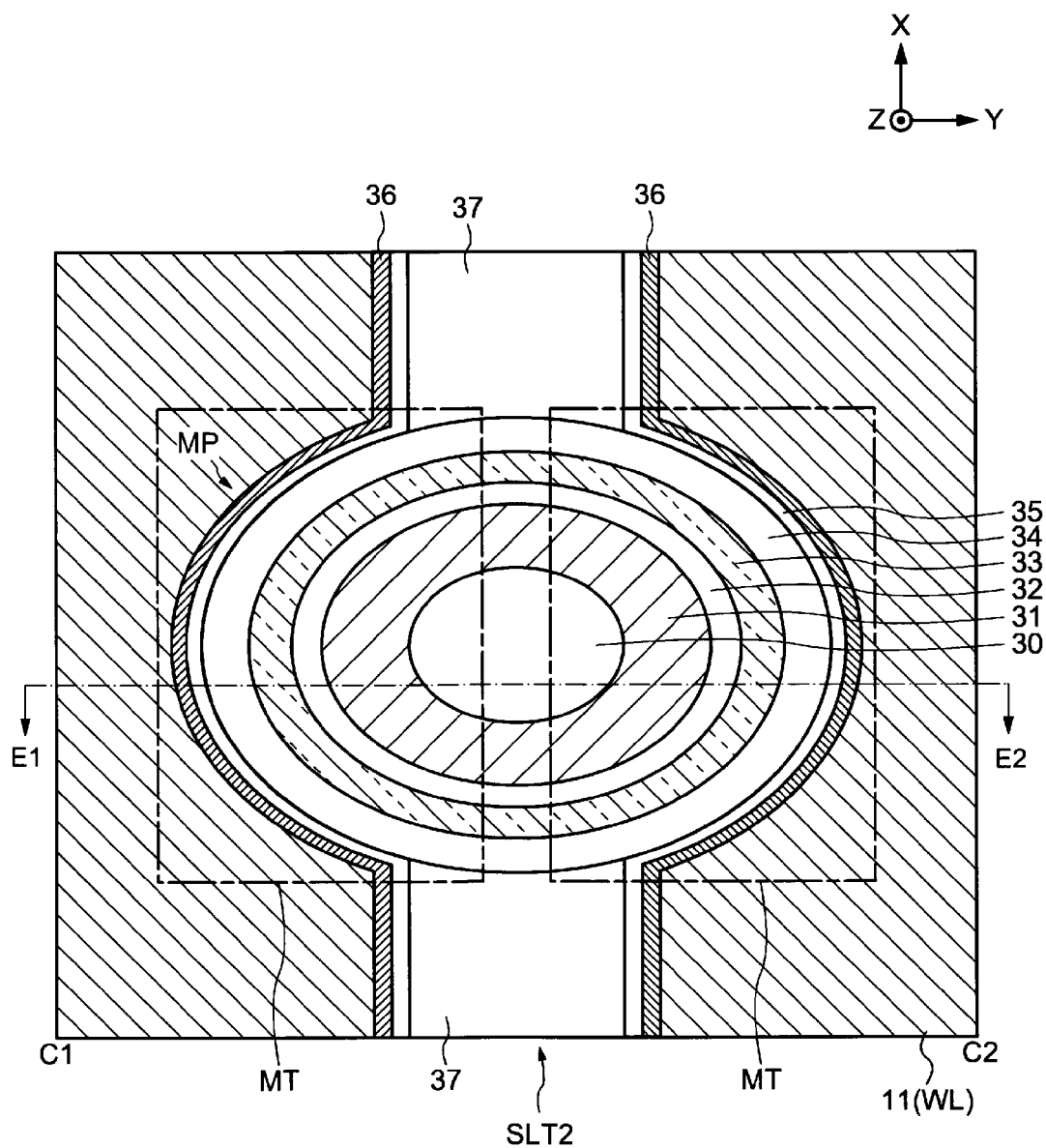
FIG. 11 is a cross-sectional view along line C1-C2 of the memory cell transistor shown in FIG. 6 in a second example.
Figure 12:
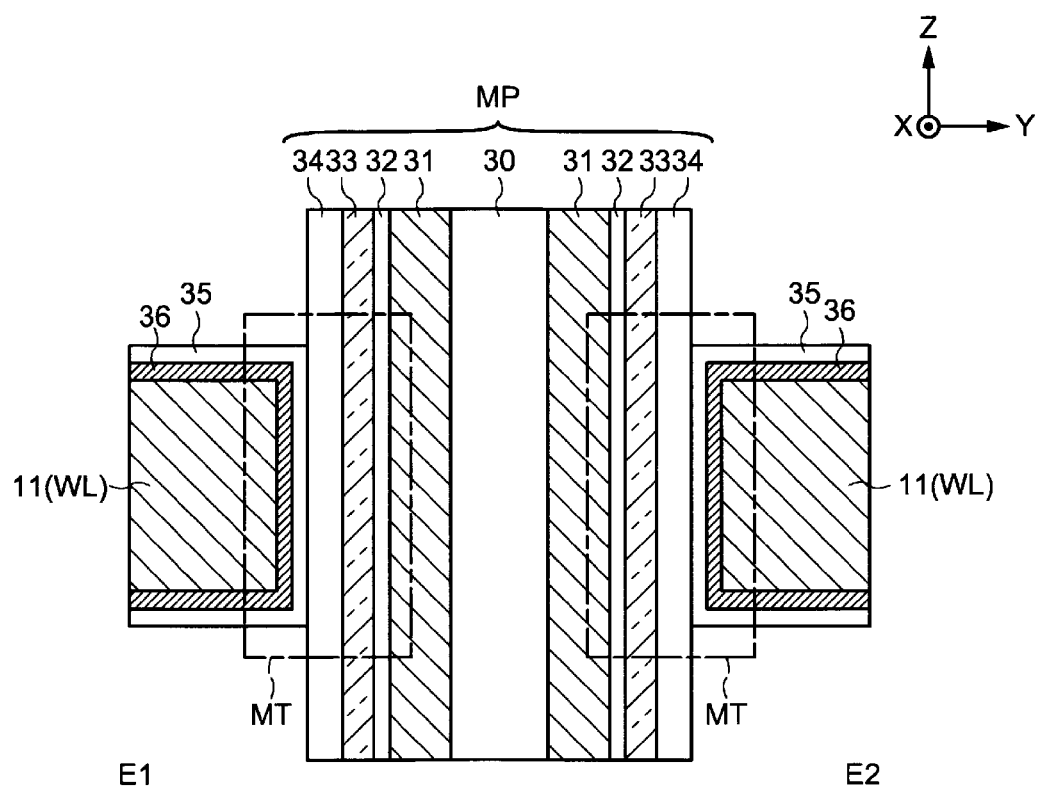
FIG. 12 is a cross-sectional view along line E1-E2 of the memory cell transistor shown in FIG. 11.

The structure of the second example shown in FIGS. 11 and 12 may be used for the memory cell transistor MT. FIG. 11 is a diagram showing a cross section along the line C1-C2 in FIG. 6, and FIG. 12 is a diagram showing a cross section along a line E1-E2 of the memory cell transistor MT shown in FIG. 11. FIGS. 11 and 12 are cross-sectional views showing a region including two memory cell transistors MT. In the second example, the charge storage layer in the memory cell transistor MT is an insulating film. In the second example, in the description of FIGS. 11 and 12 in which the memory cell transistor MT is a MONOS type memory cell transistor MT, the same or similar components as those of FIGS. 1 to 8 may be omitted.

As shown in FIGS. 11 and 12, the memory pillar MP includes, provided along the Z direction, an insulating layer 30, a semiconductor layer 31, an insulating layer 32, an insulating layer 33, and an insulating layer 34. The insulating layer 30 is formed using a silicon oxide film, for example. The semiconductor layer 31 surrounds the insulating layer 30 and serves as a region where the channel of the memory cell transistor MT is formed. The semiconductor layer 31 is formed using a polycrystalline silicon layer, for example. The semiconductor layer 31 is provided continuously without being separated between the memory cell transistors MT in the same memory pillar MP. Therefore, the channels formed in each of the two memory cell transistors MT share a part of the memory pillar MP.

The insulating layer 32 surrounds the semiconductor layer 31 and serves as a gate insulating film of the memory cell transistor MT. The insulating layer 32 is formed using a stacked structure of a silicon oxide film and a silicon nitride film, for example. The insulating layer 33 surrounds the semiconductor layer 31 and serves as a charge storage layer of the memory cell transistor MT. The insulating layer 33 is formed using a silicon nitride film, for example. The insulating layer 34 surrounds the insulating layer 33 and serves as a block insulating film of the memory cell transistor MT. The insulating layer 34 is formed using a silicon oxide film, for example. An insulating layer 37 is buried in the slit SLT2 except the memory pillar MP portion. The insulating layer 37 is formed using a silicon oxide film, for example.

For example, an AlO layer 35 is provided around the memory pillar MP according to the second example. For example, a barrier metal layer 36 is provided around the AlO layer 35. The barrier metal layer 36 is formed using a TiN film, for example. The wiring layer 11 serving as the word line WL is provided around the barrier metal layer 36. The wiring layer 11 is formed using a film made of tungsten, for example.

Similarly to the first example, one memory pillar MP according to the second example includes two memory cell transistors MT along the Y direction. Similarly to the one memory pillar MP, the select transistors ST1 and ST2 include two transistors along the Y direction.

1-1-7. Equivalent Circuit of String

Figure 13:
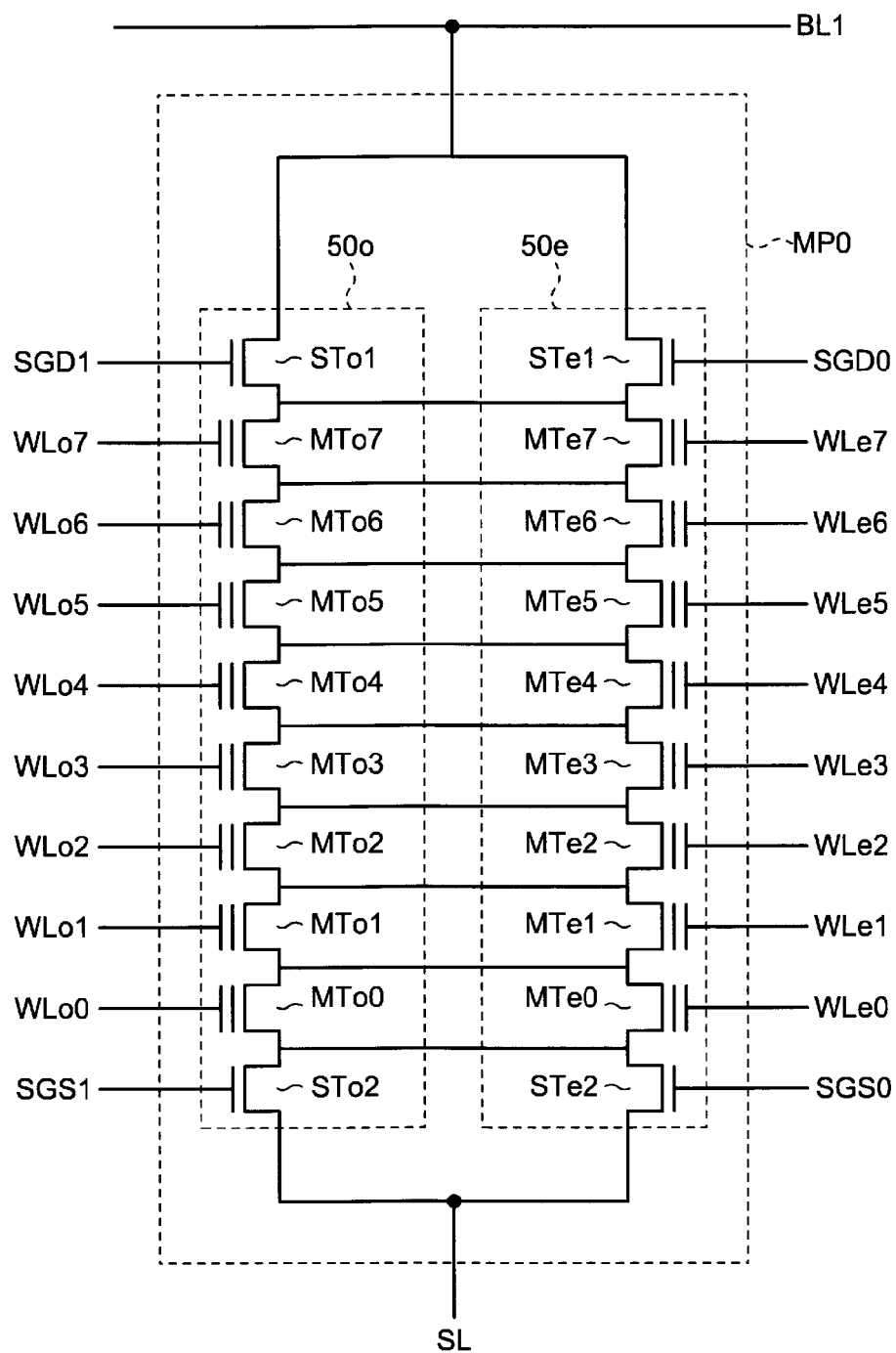
FIG. 13 is a diagram showing an equivalent circuit of adjacent strings in the semiconductor storage device according to the first embodiment.

FIG. 13 is an equivalent circuit diagram of adjacent strings in the semiconductor storage device 1. In the description of FIG. 13, the same or similar configuration as that of FIGS. 1 to 12 may be omitted.

As shown in FIG. 13, two memory strings 50e and 50o are formed in one memory pillar MP. For example, the memory string 50o is provided on the first side (also referred to as third side, fifth side, seventh side, depending on the memory pillar) of the memory pillar MP. The memory string 50e is provided on the second side (also referred to as fourth side, sixth side, eighth side, depending on the memory pillar) of the memory pillar MP.

The memory string 50o includes a select transistor STo1, i memory cell transistors MTo (i is an integer equal to or greater than 2), and a select transistor STo2, which are electrically connected in series to each other. The memory string 50e includes a select transistor STe1, i memory cell transistors MTe, and a select transistor STe2, which are electrically connected in series to each other.

The memory string 50e and the memory string 50o face each other. Therefore, the select transistor STe1, the memory cell transistors MTe0 to MTe7, and the select transistor STe1, which are in the memory string 50e, and the select transistor STo2, the memory cell transistors MTo0 to MTo7 and the select transistor STo2, which are in the memory string 50o, face each other on a one to one basis.

For example, one layer of the source side select gate lines SGS1 and SGS0, i layers of odd word lines WLo, i layers of even word lines WLe, and one layer of drain side select gate lines SGD0 and SGD1 are provided in the Z direction with respect to the source line SL.

In the first embodiment, i is eight. Eight memory cell transistors MTo0 to MTo7 are electrically connected between the select transistor STo1 and the select transistor STo2, and eight memory cell transistors MTe0 to MTe7 are electrically connected between the select transistor STe1 and the select transistor STe2, and the odd word lines WLo0 to WLo7 and the even word lines WLe0 to WLe7 are provided.

In the semiconductor storage device 1, for example, the memory strings 50o and 50e may simply be referred to as "memory string 50" unless it is necessary to distinguish the memory strings 50o and 50e from each other. The members in the memory string 50 and the wiring connected to the members are also expressed in the same way as the memory strings 50o and 50e are distinguished. In the semiconductor storage device 1, for example, the memory cell transistors MTo and MTe may simply be referred to as "memory cell transistor MT" unless it is necessary to distinguish the memory cell transistors MTo and MTe from each other. In the semiconductor storage device 1, for example, the select transistors STo1 and STe1 may be referred to as "drain side select transistor", and the select transistors STo2 and STe2 may be referred to as "source side select transistor".

The select transistor STo1 of the memory string 50o is connected to the select gate line SGD1, for example. The select transistor STe1 of the memory string 50e is connected to the select gate line SGD0, for example. The select transistors STo1 and STe1 are connected to one select gate line SGD of 4n select gate lines SGD0 to SGD7 (for example, numerical value n=2). For example, the memory pillar MP0 is connected as shown in FIG. 13. For example, in the memory pillar MP4, the select transistor STo1 is connected to the select gate line SGD5, and the select transistor STe1 is connected to the select gate line SGD4, as shown in FIGS. 3 and 6.

The memory cell transistors MTo0 to MTo7 of the memory string 50o are electrically connected in series, located along the Z direction, and connected to the i layers of odd word lines WLo0 to WLo7, respectively. The memory cell transistors MTe0 to MTe7 of the memory string 50e are electrically connected in series, located along the Z direction, and connected to i layers of even word lines WLe0 to WLe7, respectively. The select transistor STo2 of the memory string 50o is connected to the odd select gate line SGSo, for example. The select transistor STe2 of the memory string 50e is connected to the even select gate line SGSe, for example. In the first memory pillar MP, i memory cell transistors MTo0 to MTo7 and i memory cell transistors MTe0 to MTe7, the select transistors STo1 and STe1, and the select transistors STo2 and STe2 share the semiconductor layer. Similarly to the first memory pillar MP, also in the second memory pillar MP, i memory cell transistors MTo0 to MTo7 and i memory cell transistors MTe0 to MTe7, the select transistors STo1 and STe1, and the select transistors STo2 and STe2 share the semiconductor layer.

The select transistor STo2 of the memory string 50o is connected to the select gate line SGS1, for example. The select transistor STe2 of the memory string 50e is connected to the select gate line SGS0, for example. The select transistors STo2 and STe2 are connected to one select gate line SGS of 2n select gate lines SGS0 to SGS3 (for example, numerical value n=2). For example, the memory pillar MP0 is connected as shown in FIG. 13. For example, in the memory pillar MP4, the select transistor STo2 is connected to the select gate line SGS3, and the select transistor STe2 is connected to the select gate line SGS2, as shown in FIGS. 5 and 6.

In the memory strings 50e and 50o, the sources of the select transistors STo1 and STe1 facing each other are electrically connected to each other, the drains thereof are electrically connected to each other, the sources of the memory cell transistors MTo0 to MTo7 and the memory cell transistors MTe0 to MTe7 facing each other are electrically connected, the drains thereof are electrically connected, the sources of the select transistors STo2 and STe2 facing each other are electrically connected, and the drains thereof are electrically connected. The electrical connection described above is achieved by the channels formed in the transistors facing each other sharing a part of the memory pillar MP.

The two memory strings 50e and 50o in the same memory pillar MP are connected to the same bit line BL and the same source line SL. That is, the drain sides of the select transistors STo1 and STe1 are electrically connected to the same bit line BL, and the source sides of the select transistors STo2 and STe2 are connected to the same source line SL. It should be noted that the source side and the drain side of each transistor may be switched according to the voltage supplied to each transistor.

Among the eight layers of odd word lines WLo0 to WLo7, the position of the first odd word line WLo0 is closest to the position of the source line SL and farthest from the position of the bit line BL, and the position of the eighth odd word line WLo7 is farthest from the position of the source line SL and closest to the position of the bit line BL. Similarly, among the eight layers of even word lines WLe0 to WLe7, the position of the first even word line WLe0 is closest to the position of the source line SL and farthest from the position of the bit line BL, and the position of the eighth even word line WLe7 is farthest from the position of the source line SL and closest to the position of the bit line BL.

1-2. Method of Operating Semiconductor Storage Device 1

Figure 14A:
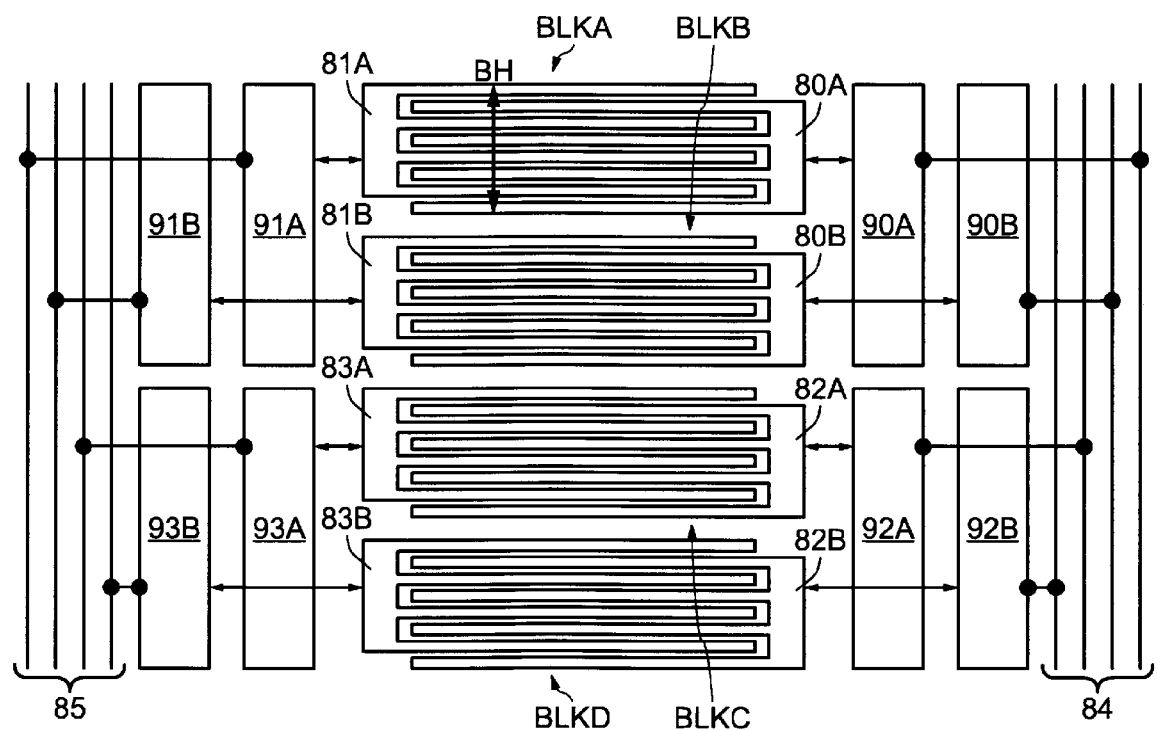
FIG. 14A shows part of a semiconductor storage device according to a first comparative example.
Figure 14B:
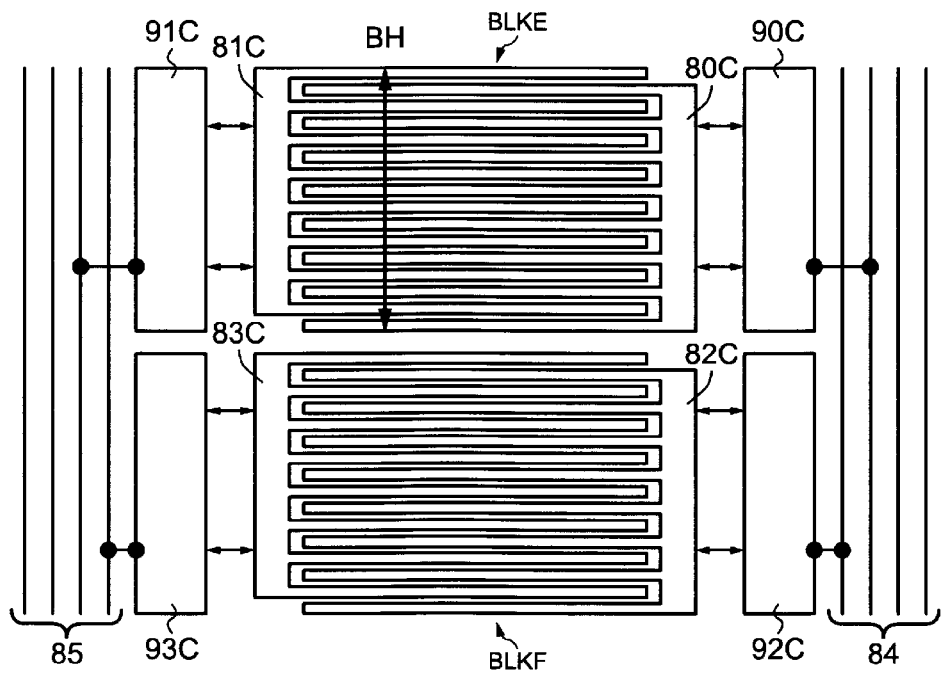
FIG. 14B shows part of a semiconductor storage device according to a second comparative example.

A method of operating the semiconductor storage device 1 will be described with reference to FIGS. 14A to 21. FIG. 14A shows a part of a semiconductor storage device according to a first comparative example, and FIG. 14B shows a part of a semiconductor storage device according to a second comparative example. FIG. 15 is an example of a simplified schematic diagram of the equivalent circuit of the strings shown in FIG. 13. FIGS. 16 to 20 are diagrams showing the configuration of the semiconductor storage device 1 illustrating the read operation of the semiconductor storage device 1. FIG. 21 is a timing chart illustrating the read operation of the semiconductor storage device 1. In the description of the read operation of the semiconductor storage device 1, the same or similar components as those of FIGS. 1 to 13 may be omitted.

First, the configuration of the semiconductor storage device according to the comparative examples will be described with reference to FIGS. 14A and 14B.

In the first comparative example shown in FIG. 14A, a global word line group 84 includes a plurality of global word lines, and each of the plurality of global word lines is connected to word lines 80A, 80B, 82A and 82B via a word line switch group (WLSWG) 90A, 90B, 92A and 92B including a plurality of word line switches (WLSW). The word lines 80A, 80B, 82A and 82B correspond to the odd word lines WLo. The WLSW is a switch for connecting and disconnecting the global word line and the word line. Similarly to the global word line group 84, a global word line group 85 includes a plurality of global word lines, and each of the plurality of global word lines is connected to word lines 81A, 81B, 83A and 83B via a word line switch group (WLSWG) 91A, 91B, 93A and 93B including a plurality of word line switches (WLSW). The word lines 81A, 81B, 83A and 83B correspond to the even word lines WLe. For example, block A (BLKA) includes the word lines 80A and 81A, block B (BLKB) includes the word lines 80B and 81B, block C (BLKC) includes the word lines 82A and 83A, and block D (BLKD) includes the word lines 82B and 83B.

The second comparative example shown in FIG. 14B is different from the first comparative example in terms of the following points. It is connected to the word lines 80C, 81C, 82C, and 83C. The word lines 80A and 80B are grouped into a word line 80C, and the WLSWGs 90A and 90B are grouped into a WLSWG 90C. In the global word line group 84, the global word lines connected to the WLSWG 90A and 90B are connected to the WLSWG 90C. The word lines and WLSWGs other than the word lines 80A and 80B and the WLSWGs 90A and 90B are configured like the word lines 80A and 80B and WLSWG 90A and 90B.

As shown in FIGS. 14A and 14B, in the semiconductor storage devices according to the comparative examples, the number of WLSWGs is the same as the number of word lines. The WLSW transmits a program voltage during a program operation, for example. Since the program voltage is a high voltage, the WLSW is required to have characteristics that can withstand the high voltage. Therefore, the WLSW is manufactured by a high breakdown voltage process, and the size of the WLSW is greater than that of the memory cell transistors and the like.

In the first comparative example, the number of blocks is 4 blocks (BLKA to BLKD), and the number of WLSWG corresponding to each of the blocks is also 4 blocks. In the semiconductor storage device according to the first comparative example, the overall size of the semiconductor storage device is increased.

In the second comparative example, the size of the word line (block height BH) is made larger (higher) than in the first comparative example. Here, the number of blocks is reduced from 4 blocks (BLKA to BLKD) to 2 blocks (BLKE and BLKF). In the second comparative example, the size of the word line is increased by integrating the two word lines in the first comparative example into one word line. As a result, in the second comparative example, the number of blocks can be reduced and also the number of WLSWGs can be reduced without reducing the storage density.

Meanwhile, when the size of the word line is increased as in the second comparative example, for example, the region including memory cell transistors that are not to be operated during the program operation is increased. As a result, the capacitive load when charging and discharging the word line is increased. Each memory cell transistor is easily affected by disturb.

The semiconductor storage device 1 achieves not only a reduction in the number of blocks of the WLSWG due to the increase in the size of the word lines, but also achieves a reduction in the capacitive load and disturb when charging and discharging the word lines. The WLSW connected to the even word lines WLe is provided in the even word line driver 28A (FIG. 8), for example, and WLSW connected to the odd word lines WLo is provided in the odd word line driver 28B, for example.

In the semiconductor storage device 1, for example, one block BLK includes 32 memory pillars MP as shown in FIGS. 3 to 5. In the comparative examples shown in FIGS. 14A and 14B, for example, one block BLK includes 16 memory pillars MP (not shown). That is, the size of the word lines WL in one block BLK of the semiconductor storage device 1 is twice the size of the word lines WL in the comparative examples. In the semiconductor storage device 1, as shown in FIG. 2 or 5, the select gate line electrically connected to the select transistors STe2 in the memory groups MG0 and MG2 is the select gate line SGS0, the select gate line electrically connected to the select transistors STo2 in the memory groups MG1 and MG3 is the select gate line SGS1, the select gate line electrically connected to the select transistors STe2 in the memory groups MG4 and MG6 is the select gate line SGS2, and the select gate line electrically connected to the select transistors STo2 in the memory groups MG5 and MG7 is the select gate line SGS3. That is, 32 memory pillars MP are controlled by four select gate lines SGS. In the comparative examples shown in FIGS. 14A and 14B, for example, 16 memory pillars MP are controlled by two select gate lines SGS. As a result, in the semiconductor storage device 1, the number of blocks of WLSW is reduced as the size of the word lines WL is doubled compared to the comparative examples. In the semiconductor storage device 1, the number of blocks of WLSW is reduced and the number of select gate lines SGS is doubled compared to the comparative examples such that, as much as the number of blocks of WLSW is reduced, the capacitive load when charging/discharging the word lines WL and the disturb accompanying the read operation is reduced.

1-2-1. Overview of Write Operation and Read Operation of Semiconductor Storage Device 1

In the semiconductor storage device 1, there is a distribution of threshold voltages of each memory cell transistor MT. A triple level cell (TLC) method will be described as an example of the threshold voltage distribution of the memory cell transistor MT. The memory system 3 may employ a quad level cell (QLC) method, a multi level cell (MLC) method, or a single level cell (SLC) method.

In the TLC method, a plurality of memory cell transistors form eight threshold voltage distributions. In the memory system 3, the eight threshold voltage distributions may be referred to as write states. The write states are referred to as "Er" state, "A" state, "B" state, "C" state, and "D" state, "E" state, "F" state, and "G" state in order from the lowest threshold voltage. For example, different 3-bit data are assigned to the write states as shown below. The assigned 3-bit data is a lower bit, a middle bit, and an upper bit.

It should be noted that "Er" state: "111" data, "A" state: "110" data, "B" state: "100" data, "C" state: "000" data, "D" state: "010" data, "E" state: "011" data, "F" state: "001" data, and "G" state: "101" data are expressed in the order of upper, middle, and lower bits.

A set of lower bits stored by the memory cell transistors MT connected to the same word line is referred to as lower page, a set of middle bits is referred to as middle page, and a set of upper bits is referred to as upper page. The data write and read operations are performed in units of pages as described above.

The semiconductor storage device 1 includes write and read operations. The write operation includes a plurality of program loops (for example, X times, where X is an integer greater than or equal to 1). Each program loop includes at least one program operation followed by one or a plurality of verification operations (for example, Y times, where Y is an integer equal to or greater than 1). That is, in the write operation, a program loop including program operations and verification operations is performed a plurality of times. It should be noted that the verification operation may be omitted in each program loop.

The program operation is an operation of increasing the threshold voltage of the memory cell transistor MT by a predetermined voltage. In the program operation, electrons are injected into the charge storage layer of the memory cell transistor MT to be written to increase the threshold voltage thereof, and injection of electrons into the charge storage layer of the memory cell transistor MT not to be written is inhibited to maintain the threshold voltage. In the program operation, for example, a voltage VPGM is supplied to the selected word line SEL-WL. Accordingly, a plurality of memory cell transistors MT connected to the selected word line SEL-WL are selected. In each of the plurality of memory cell transistors MT, the threshold voltage is increased or maintained based on the voltage supplied to the corresponding bit line BL.

The verification operation is an operation that is performed following the program operation, and is an operation of confirming whether the threshold voltage of the selected memory cell transistor MT has reached a target level by performing a read operation using a predetermined voltage. A memory cell transistor MT of which the threshold voltage reached the target level is considered to have passed the verification operation, and thereafter, the memory cell transistor MT is set as a non-writing target, and injection of electrons into the charge storage layer is inhibited.

The read operation is an operation of reading the threshold voltage of the selected memory cell transistor MT based on the set read voltage, for example. The set read voltage is, for example, a read voltage for determining whether the threshold voltage of the memory cell transistor MT is provided in the "Er" state or provided in the "A" state or higher.

In the write and read operations of the semiconductor storage device 1, a method of selecting or un-selecting the select gate line SGD will be described with reference to FIG. 3. For example, when a predetermined voltage (for example, a voltage VSG) is supplied to the first connecting section 10-0d, the select gate line SGD0 is selected, and the eight select transistors STe1 provided on the second side of each of the memory pillars MP0, MP7, MP8, MP9, MP16, MP23, MP24 and MP25 are turned on. Here, a predetermined voltage (for example, a voltage VSS) is supplied to the second connecting sections 10-1d and 10-7d, and the eight select transistors STo1 provided on the first side of each of the memory pillars MP0, MP7, MP8, MP9, MP16, MP23, MP24 and MP25 are turned off.

Next, in write and read operations of the semiconductor storage device 1, a method of selecting or un-selecting the word line WL will be described with reference to FIG. 4. For example, when a predetermined voltage (for example, a voltage VREAD) is supplied to the wiring layer 11 including the wiring layers 11-0a, 11-2, and 11-0b, the even word line WLe7 provided on the second side of each of the memory pillars MP0, MP7, MP8, MP9, MP16, MP23, MP24 and MP25 is turned on or off depending on the supplied voltage. Here, a predetermined voltage (for example, the voltage VSS) is supplied to the wiring layers 11 including the wiring layers 11-1, 11-3, and 11-15, and the odd word line WLo7 provided on the first side of each of the memory pillars MP0, MP7, MP8, MP9, MP16, MP23, MP24 and MP25 is turned on or off depending on the supplied voltage. Similarly to the even word line WLe7 and the odd word line WLo7, the even word lines WLe0 to WLe6 and the odd word lines WLo0 to WLo6 are turned on or off depending on the supplied voltage.

Next, in the write and read operations of the semiconductor storage device 1, a method of selecting or un-selecting the select gate line SGS will be described with reference to FIG. 5. For example, when a predetermined voltage (for example, a voltage VSG_SGS) is supplied to the first connecting section 12-0f, the select gate line SGS0 is selected, and the eight select transistors STe2 provided on the second side of each of the memory pillars MP0, MP7, MP8, MP9, MP16, MP23, MP24 and MP25 are turned on. Here, a predetermined voltage (for example, the voltage VSS) is supplied to the second connecting sections 12-1f and 12-3f, and the eight select transistors STo2 provided on the first side of each of the memory pillars MP0, MP7, MP8, MP9, MP16, MP23, MP24 and MP25 are turned off.

As a result, in the block BLK, the memory cell transistors MT belonging to the memory pillars corresponding to the select gate lines SGD0 and SGS0 are selected. The memory group MG is formed by memory cell transistors MT selected by each select gate line. One page is formed by the memory cell transistors MT corresponding to the selected word line WL in the memory group MG. Therefore, the block BLK includes memory groups MG corresponding to the number of select gate lines SGD, and each memory group MG includes pages corresponding to the number of layers of the word lines WL. The operation of selecting wiring layers other than the wiring layer described above is the same as described above, and a description thereof will be omitted here.

1-2-2. First Example of Method of Read Operation of Semiconductor Storage Device 1

The first example of the method of read operation of the semiconductor storage device 1 will be described with reference to FIGS. 15 to 18. In the first example of the method of read operation of the semiconductor storage device 1, for example, when the memory cell transistor MT to be read is the memory cell transistor MTe2 electrically connected to the select transistor STe2, the select gate line SGS0 electrically connected to the select transistor STe2 is supplied with a voltage that turns the select transistor STe2 to on state, and the select gate line SGS1 electrically connected to the select transistor STo2 opposite to the select transistor STe2 is supplied with a voltage that turns the select transistor STo2 to on state. The reading operation of the semiconductor storage device 1 according to the first embodiment is, as described in sections 1-1-1, 1-1-2, and 1-2-1, controlled using the sequencer 24 based on a signal or the like transmitted from the memory controller 2 to the semiconductor storage device 1. In FIGS. 15 to 21, "SGD0" to "SGD7" correspond to the select gate lines SGD0 to SGD7 shown in FIG. 3, "SGS0" to "SGS3" correspond to the select gate lines SGS0 to SGS3 shown in FIG. 5, and "WL0" to "WL7", "WLe", and "WLo" correspond to the odd word lines WLo0 to WLo7 and the even word lines WLe0 to WLe7 shown in FIG. 2 or 4.

In the description of the read operation of the semiconductor storage device 1, the equivalent circuit of adjacent strings shown in FIG. 13 is simplified to show the memory cell transistors (MT0 to MT4) and the like connected to five word lines (WL0 to WL5) shown in the left diagram of FIG. 15, and also simplified to the schematic diagram shown in the right diagram of FIG. 15. As described in section 1-1-7, the select transistors STo1 and STe1 are each connected to one of the select gate lines SGD0 to SGD7, and the select transistors STo2 and STe2 are each connected to one of the select gate lines SGS0 to SGS3. The equivalent circuit of adjacent strings shown in FIG. 15 is a diagram corresponding to the memory pillar MP0, and the memory pillar MP0 is electrically connected to the bit line BL1, the select gate lines SGD1 and SGD0, and the select gate lines SGS0 and SGS1. The memory pillars other than the memory pillar MP0 are electrically connected to the bit lines BL and the select gate lines SGD and SGS corresponding to the respective memory pillars.

Figure 16:
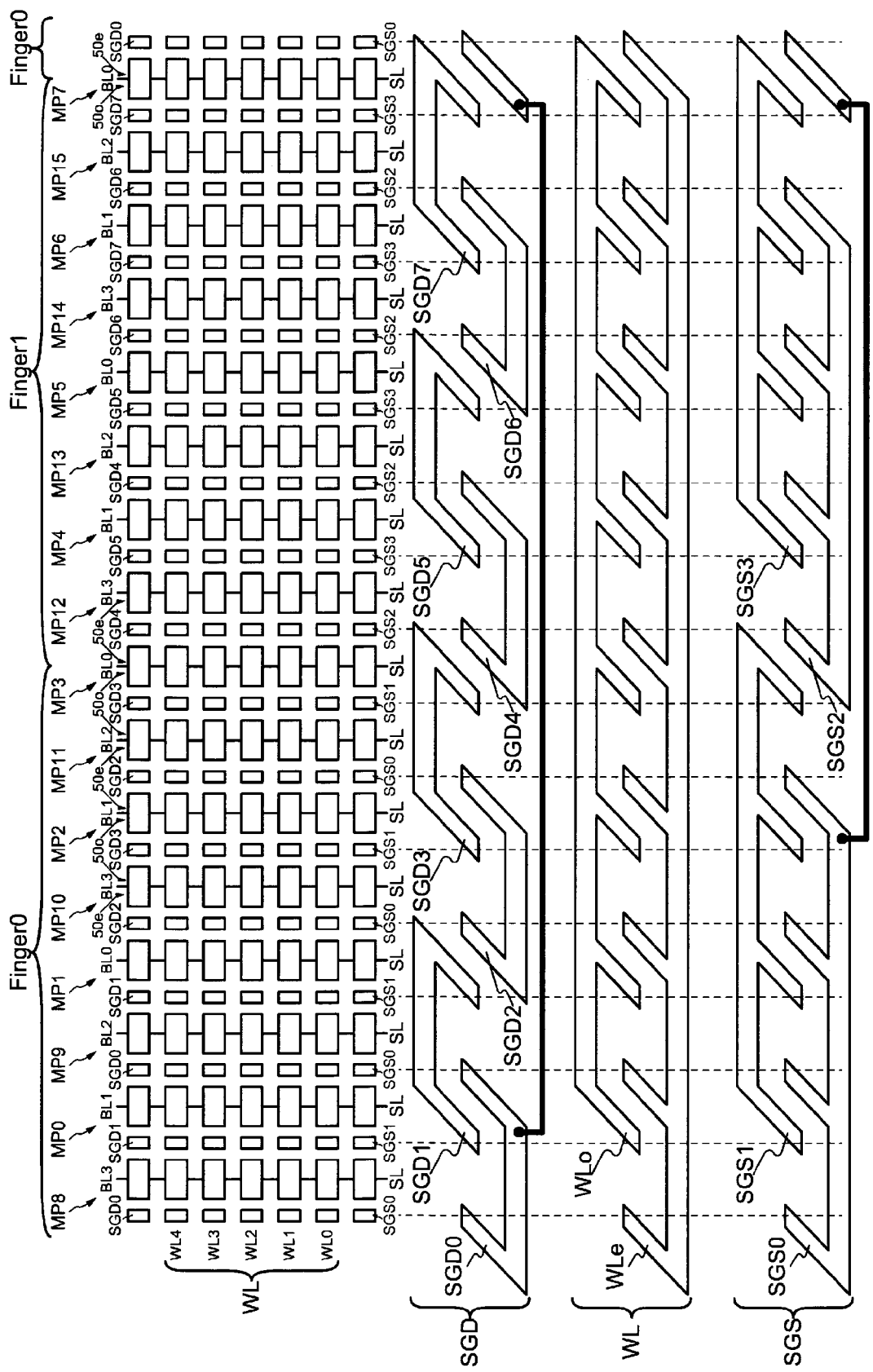
FIGS. 16-20 are diagrams showing a configuration of the semiconductor storage device, to explain read operation of the semiconductor storage device according to the first embodiment.

The drawing on the upper half (upper drawing) of FIG. 16 is a drawing (schematic diagram) showing the schematic drawing shown in FIG. 15 applied to the cross-sectional view shown in FIG. 6. The diagram on the lower half (lower drawing) in FIG. 16 is a view (bird's-eye view) showing only the drain side select gate lines SGD0 to SGD7, the even word lines WLe, the odd word lines WLo, and the source side select gate lines SGS0 to SGS3, when viewing the cross-sectional view shown in FIG. 6 down from an obliquely upper right direction and comparing with the corresponding schematic diagram.

As shown in FIG. 16, in the semiconductor storage device 1, one block BLK includes two groups (the first group Finger0 and the second group Finger1). The first group Finger0 includes the region between the memory pillar MP10 and the memory string 50o on the fifth side of the memory pillar MP3, and the memory string 50e on the eighth side of the memory pillar MP7. The second group Finger1 includes the region between the memory string 50e on the sixth side of the memory pillar MP3 and the memory string 50o on the seventh side of the memory pillar MP7. That is, each of the first group Finger0 and the second group Finger1 includes the regions described in section 1-1-4.

As shown in FIG. 16, the first group Finger0 includes the memory string 50o on the fifth sides of the memory pillars MP10, MP2, and MP3, and the memory string 50e on the eighth side of the memory pillar MP7. The second group Finger1 includes the memory string 50e on the sixth side of the memory pillar MP3 and the memory string 50o on the seventh side of the memory pillar MP7.

The memory pillar MP10 is disposed adjacent to the memory pillar MP2. The memory pillars MP3 and MP7 are provided at the boundary between the first group Finger0 and the second group Finger1.

Referring to FIGS. 16 and 15, the memory pillar MP10 includes the first side memory string 50o and the second side memory string 50e electrically connected between the bit line BL3 and the source line SL. The first side memory string 50o includes the drain side select transistor STo1 electrically connected to the drain side select gate line SGD3, the memory cell transistors MTo0 to MTo4 electrically connected to the odd word lines WLo0 to WLo4, and the source side select transistor STo2 electrically connected to the source side select gate line SGS1. The second side memory string 50e includes the drain side select transistor STe1 electrically connected to the drain side select gate line SGD2, the memory cell transistors MTe0 to MTe4 electrically connected to the even word lines WLe0 to WLe4, and the source side select transistor STe2 electrically connected to the source side select gate line SGS0.

Similarly to the memory pillar MP10, the memory pillar MP2 includes the third side memory string 50o and the fourth side memory string 50e electrically connected between the bit line BL1 and the source line SL. The third side memory string 50o includes the drain side select transistor STo1 electrically connected to the drain side select gate line SGD3, the memory cell transistors MTo0 to MTo4 electrically connected to the odd word lines WLo0 to WLo4, and the source side select transistor STo2 electrically connected to the source side select gate line SGS1. The second side memory string 50e includes the drain side select transistor STe1 electrically connected to the drain side select gate line SGD2, the memory cell transistors MTe0 to MTe4 electrically connected to the even word lines WLe0 to WLe4, and the source side select transistor STe2 electrically connected to the source side select gate line SGS0.

Similarly to the memory pillar MP10, the memory pillar MP3 includes the fifth side memory string 50o and the sixth side memory string 50e electrically connected between the bit line BL0 and the source line SL. The fifth side memory string 50o includes the drain side select transistor STo1 electrically connected to the drain side select gate line SGD3, the memory cell transistors MTo0 to MTo4 electrically connected to the odd word lines WLo0 to WLo4, and the source side select transistor STo2 electrically connected to the source side select gate line SGS1. The sixth side memory string 50e includes the drain side select transistor STe1 electrically connected to the drain side select gate line SGD4, the memory cell transistors MTe0 to MTe4 electrically connected to the even word lines WLe0 to WLe4, and the source side select transistor STe2 electrically connected to the source side select gate line SGS2.

Similarly to the memory pillar MP10, the memory pillar MP7 includes the seventh side memory string 50o and the eighth side memory string 50e electrically connected between the bit line BL0 and the source line SL. The seventh side memory string 50o includes the drain side select transistor STo1 electrically connected to the drain side select gate line SGD7, the memory cell transistors MTo0 to MTo4 electrically connected to the odd word lines WLo0 to WLo4, and the source side select transistor STo2 electrically connected to the source side select gate line SGS3. The eighth side memory string 50e includes the drain side select transistor STe1 electrically connected to the drain side select gate line SGD0, the memory cell transistors MTe0 to MTe4 electrically connected to the even word lines WLe0 to WLe4, and the source side select transistor STe2 electrically connected to the source side select gate line SGS0.

Figure 17:
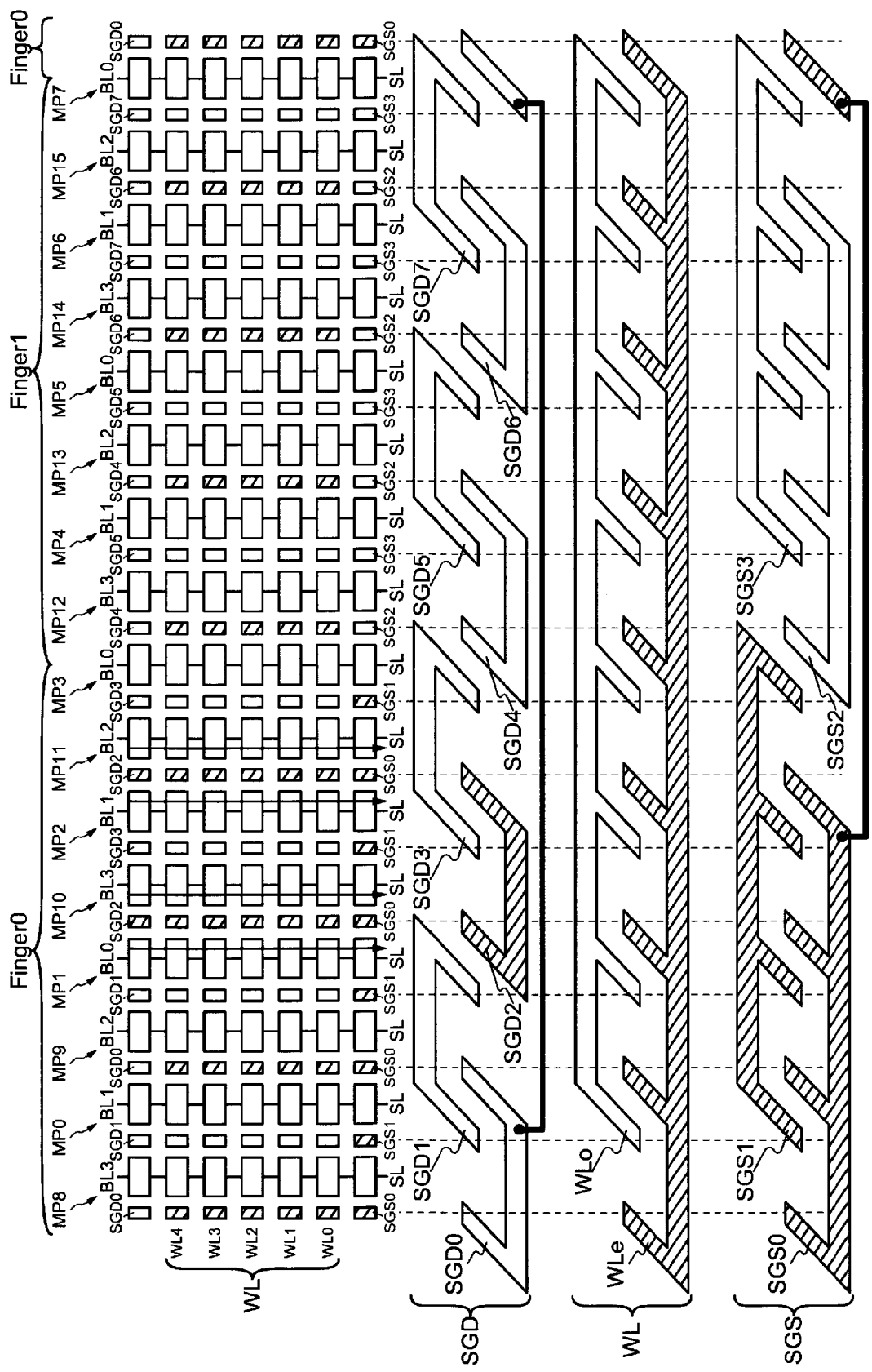

In the first example of the method of read operation of the semiconductor storage device 1, for example, in the first group Finger0 the drain side select gate line SGD2, the even word lines WLe (WLe0 to WLe4), and the source side select gate lines SGS0 and SGS1 are selected as shown in FIG. 17. In FIG. 17, the selected signal lines are indicated with oblique lines. Here, each of the selected signal lines supplies the memory cell transistor MT, the drain side select transistor ST1, and the source side select transistor ST2 connected to each selected signal line with a voltage that turns the connected transistors to on state.

Here, in the second group Finger1, the drain side select gate lines SGD0, SGD1 and SGD3 to SGD7, the odd word lines WLo (WLo0 to WLo4), and the source side select gate lines SGS2 and SGS3 are not selected. That is, in the second group Finger1, here, each of the un-selected signal lines supplies the memory cell transistor MT, the drain side select transistor ST1, and the source side select transistor ST2 connected to each un-selected signal line with a voltage that turns the connected transistors to off state.

As a result, in the first group Finger0 each transistor operates as follows based on each selected signal line, and in the second group Finger1, each transistor operates as follows based on the un-selected signal lines and the selected signal lines.

First, each transistor in the first group Finger0 will be described.

In the memory pillar MP10, the drain side select transistor STe1 electrically connected to the drain side select gate line SGD2, the memory cell transistors MTe0 to MTe4 electrically connected to the even word lines WLe0 to WLe4, and the source side select transistor STe2 electrically connected to the source side select gate line SGS0 are turned on, and current flows from the bit line BL3 to the source line SL (in the direction indicated by the arrow in FIG. 17). Therefore, the second side memory string 50e of the memory pillar MP10 can read the threshold voltage of the memory cell transistor MTe2 from the bit line BL3.

Similarly to the memory pillar MP10, in the memory string 50e of the memory pillar MP1 facing the second side memory string 50e of the memory pillar MP10, each transistor provided in the memory string 50e of the memory pillar MP1 is turned on, and current flows from the bit line BL0 to the source line SL (in the direction indicated by the arrow in FIG. 17). Therefore, the memory string 50e of the memory pillar MP1 can read the threshold voltage of the memory cell transistor MTe2 from the bit line BL0.

Similarly to the memory pillar MP10, in the fourth side memory string 50e of the memory pillar MP2, each transistor in the fourth side memory string 50e of the memory pillar MP2 is turned on, and current flows from the bit line BL1 to the source line SL (in the direction indicated by the arrow in FIG. 17). Therefore, the fourth side memory string 50e of the memory pillar MP2 can read the threshold voltage of the memory cell transistor MTe2 from the bit line BL1.

Similarly to the memory pillar MP10, in the sixth side memory string 50e of the memory pillar MP11, each transistor in the sixth side memory string 50e of the memory pillar MP11 is turned on, and current flows from the bit line BL2 to the source line SL (in the direction indicated by the arrow in FIG. 17). Therefore, the sixth side memory string 50e of the memory pillar MP11 can read the threshold voltage of the memory cell transistor MTe2 from the bit line BL2.

Next, each transistor in the second group Finger1 will be described.

In the second group Finger1, referring to FIGS. 15 and 17, the drain side select transistors ST1 connected to the drain side select gate lines SGD0, SGD1 and SGD3 to SGD7, the memory cell transistors MT connected to the odd word lines WLo (WLo0 to WLo4), and the source side select transistor ST2 connected to the source side select gate lines SGS2 and SGS3 are supplied with a voltage that turns the transistors to off state based on each of the un-selected signal lines. That is, the memory cell transistors MTo0 to MTo4 connected to the odd word lines WLo (WLo0 to WLo4) are electrically connected between the off-state drain side select transistor STo1 and the off-state source side select transistor STo2, and are in a floating state. A voltage is supplied to the memory cell transistors MTe0 to MTe4 connected to the selected even word line WLe (WLe0 to WLe4) to turn the transistors to on state.

For example, the odd word lines WLo (WLo0 to WLo4) electrically connected to the memory cell transistors MT other than the memory cell transistor MTe2 to be read are supplied with a voltage VBB, for example. The voltage VBB is a voltage lower than the voltage VSS and has a negative voltage. The memory cell transistor MTe2 to be read and the even word lines WLe (WLe0 to WLe4) electrically connected to the memory cell transistors MTe0 to MTe4 in the memory string 50e including the memory cell transistor MTe2 are supplied with the voltage VREAD. The voltage VREAD is greater than the voltages VSS and VBB and has a positive voltage. The voltage VREAD may be referred to as "first voltage". The voltage VBB may be referred to as "second voltage".

In the semiconductor storage device 1, as described in sections 1-1-6-1, 1-1-6-2, and 1-1-7, two memory cell transistors MT in the same memory pillar MP share a channel.

In the memory pillars MP12, MP4, MP13, MP5, MP14, MP6 or MP15 in the second group Finger1, among the memory cell transistors MT0 to MT4 in the same memory pillar MP, the memory cell transistors MTe0 to MTe4 connected to the even word line WLe are supplied with an on-state voltage, and the memory cell transistors MTo0 to MTo4 connected to the odd word line WLo are supplied with an off-state voltage. Therefore, as the channel of the memory cell transistor MT is shared, a sneak current flows through the channel of each memory cell transistor MT.

As a result, in the second group Finger1, since the memory cell transistors MTo0 to MTo4 connected to the odd word lines WLo (WLo0 to WLo4) are in the floating state, the channels of the memory cell transistors MT can be boosted.

Figure 18:
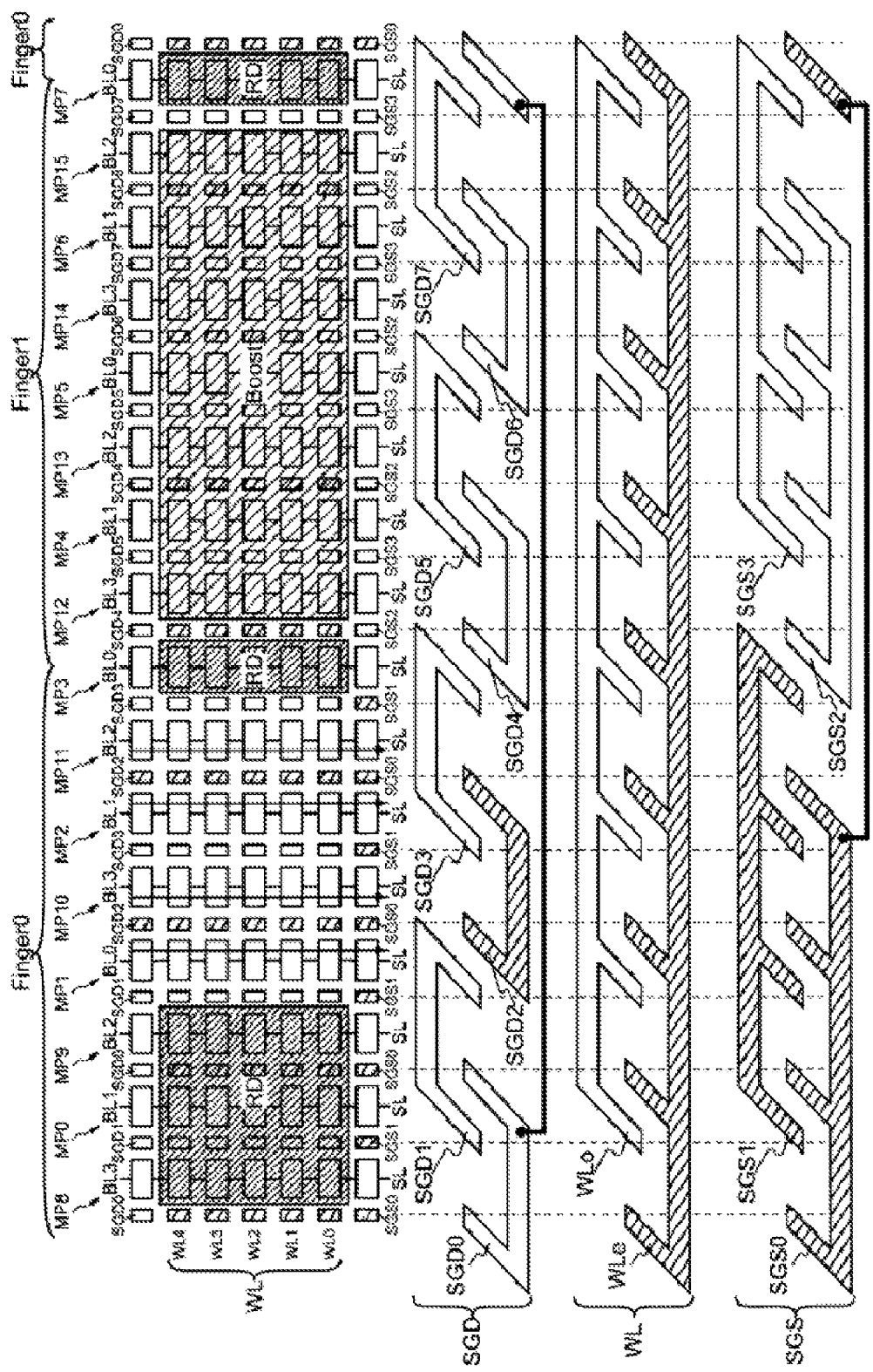

Therefore, in the first example of the method of read operation of the semiconductor storage device 1, as shown in FIG. 18, in the first group Finger0, the read operation is performed based on the current (arrows in FIG. 18) flowing from the bit line BL of the memory pillars MP1, MP10, MP2 and MP11 to the source line SL, and in the second group Finger1, the channels of the memory cell transistors MT in the regions (the memory pillars MP12, MP4, MP13, MP5, MP14, MP6 and MP15) indicated with thick oblique lines and a sign Boost thereon can be boosted.

1-2-3. Second Example of Method of Read Operation of Semiconductor Storage Device 1 (SGS One Side ON)

The second example of the read operation of the semiconductor storage device 1 will be described with reference to FIGS. 15, 16, 19 and 20. The second example of the read operation of the semiconductor storage device 1 is different from the first example in that the select gate line SGS1 electrically connected to the select transistor STo2 opposite to the select transistor STe2 is supplied with a voltage that turns the select transistor STo2 to off state. In the description of the second example of the read operation of the semiconductor storage device 1, the description will be mainly focused on differences from the first example.

As described in section 1-2-2, in the first example, the read operation is performed in the first group Finger0 and the channel of the memory cell transistor MT can be boosted in the second group Finger1.

Meanwhile, referring to FIGS. 15, 17 and 18, in the first example of the read operation of the semiconductor storage device 1, in the first group Finger0 the drain side select transistors ST1 connected to the un-selected drain side select gate lines SGD0, SGD1, and SGD3 to SGD7, and the memory cell transistors MTo0 to MTo4 connected to the un-selected odd word lines WLo (WLo0 to WLo4) are supplied with a voltage that turns the transistors to off state. A voltage is supplied to the memory cell transistors MTe0 to MTe4 connected to the selected even word line WLe (WLe0 to WLe4) to turn the transistors to on state.

Here, as described in section 1-2-2, the odd word lines WLo (WLo0 to WLo4) electrically connected to the memory cell transistors MTo0 to MTo4 are supplied with the voltage VBB. The voltage VREAD is supplied to the even word lines WLe (WLe0 to WLe4) electrically connected to the memory cell transistors MTe0 to MTe4. In the semiconductor storage device 1, as described in sections 1-1-6-1, 1-1-6-2, and 1-1-7, two memory cell transistors MT in the same memory pillar MP share a channel.

In the memory pillars MP8, MP0, MP9, MP1 and MP7 in the first group Finger0 and the memory pillar MP3 disposed on the boundary between the first group Finger0 and the second group Finger1, among the memory cell transistors MT0 to MT4 in the same memory pillar MP, the memory cell transistors MTe0 to MTe4 connected to the even word line WLe are supplied with an on-state voltage, and the memory cell transistors MTo0 to MTo4 connected to the odd word line WLo are supplied with an off-state voltage. Therefore, as the channel of the memory cell transistor MT is shared, a sneak current flows through the channel of each memory cell transistor MT.

In the memory pillars MP8, MP0, MP9, MP1 and MP7 provided in the first group Finger0 the select transistors STe2 and STo2 electrically connected to the source side select gate lines SGS0 and SGS1 are supplied with a voltage to turn the select transistors STe2 and STo2 to on state. In the memory pillar MP3 disposed on the boundary between the first group Finger0 and the second group Finger1, the select transistor STo2 electrically connected to the source side select gate line SGS1 is supplied with a voltage to turn the select transistor STo2 to on state.

As a result, in the region indicated with thin oblique lines and a sign RD thereon in the first group Finger0, read disturb (RD) can occur in the memory cell transistors MTe0 to MTe4 provided in the memory pillars MP8, MP0, MP9, MP1 and MP7, and the sixth side memory string 50e of the memory pillar MP3 disposed on the boundary between the first group Finger0 and the second group Finger1, resulting in unintended variations of the threshold voltage.

Figure 19:
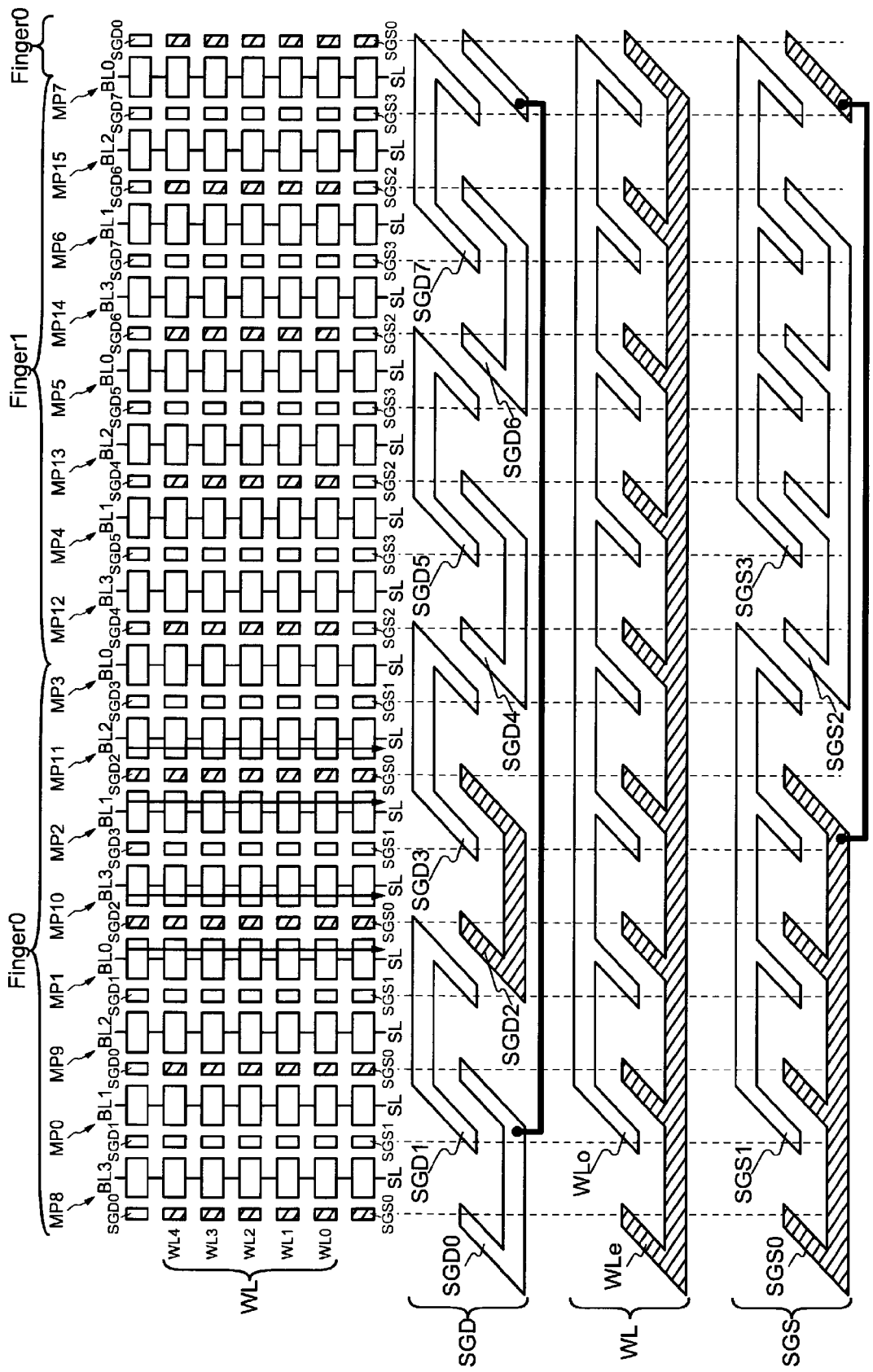
Figure 20:
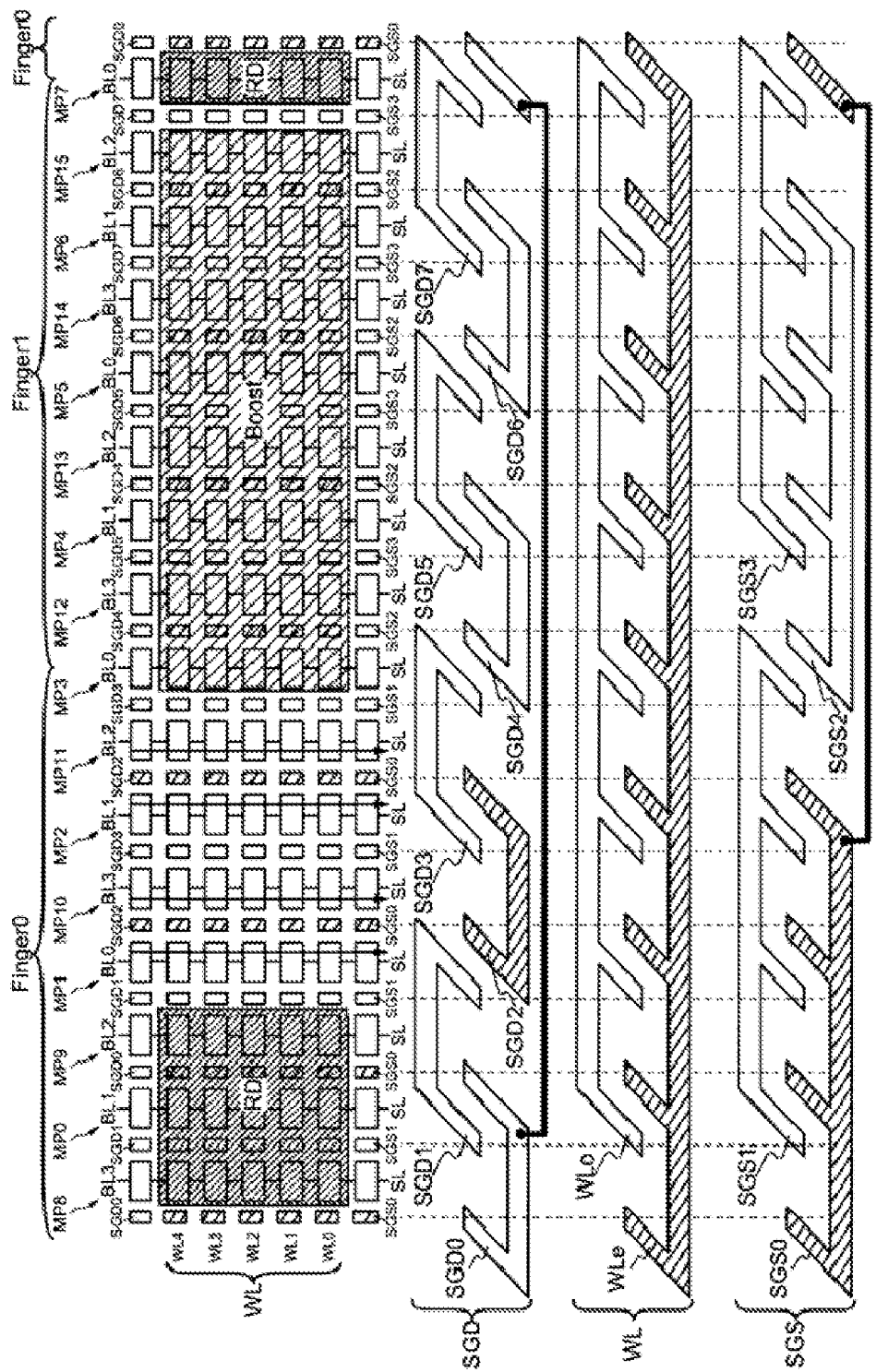
Figure 21:
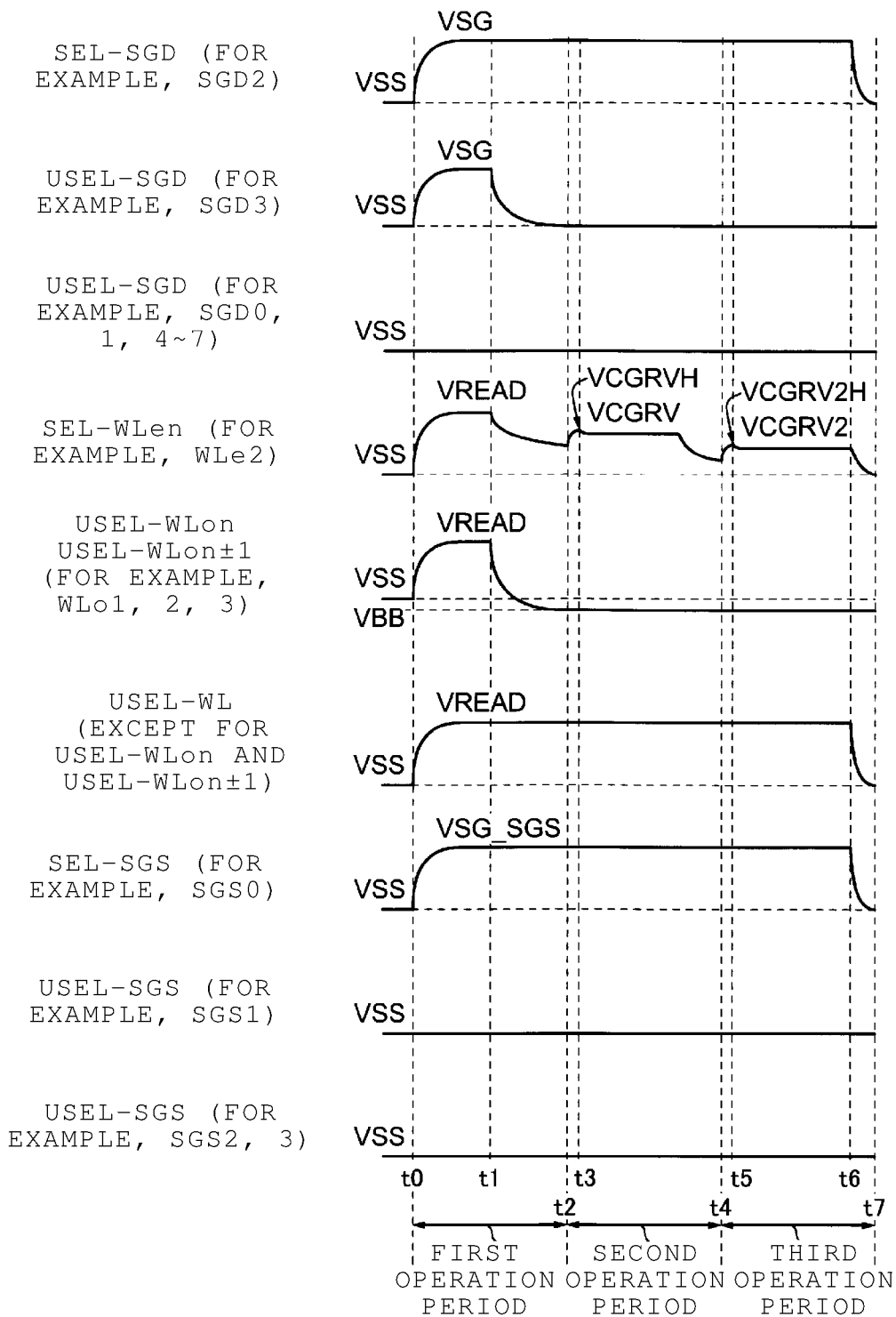
FIG. 21 is a timing chart to explain the read operation of the semiconductor storage device according to the first embodiment.

Meanwhile, for example, referring to FIGS. 15, 19, and 20, the second example of the method of read operation of the semiconductor storage device 1 is different from the first example in that the source side select gate line SGS1 electrically connected to the select transistor STo2 opposite to the select transistor STe2 is not selected, and the source side select gate line SGS1 supplies the select transistor STo2 with a voltage to turn the select transistor Sto2 in the first group Finger0 to off state. Similarly to FIG. 17, in FIGS. 19 and 20, the selected signal lines are indicated with oblique lines. Since the source side select gate line SGS1 is not selected, the source side select gate line SGS1 is not indicated with oblique lines in FIGS. 19 and 20.

As a result, in the memory cell transistors MTe0 to MTe4 provided in the sixth side memory string 50e of the memory pillar MP3 disposed on the boundary between the first group Finger0 and the second group Finger1, read disturb (RD) does not occur, and unintended variations in threshold voltage can be prevented.

Each transistor in the memory pillar MP3 disposed on the boundary between the first group Finger0 and the second group Finger1 is supplied with the same voltage as each of the transistors provided in the memory pillar MP12 of the second group Finger1. As a result, in the memory pillar MP3 disposed on the boundary between the first group Finger0 and the second group Finger1, since the memory cell transistors MTo0 to MTo4 connected to the odd word lines WLo (WLo0 to WLo4) are in the floating state, the channels of the memory cell transistors MT can be boosted.

That is, in the second example of the method of read operation of the semiconductor storage device 1, as shown in FIG. 19 or 20, in the first group Finger0 the read operation is performed based on the current (arrows in FIGS. 19 and 20) flowing from the bit lines BL of the memory pillars MP1, MP10, MP2, and MP11 to the source lines SL, and in the memory pillar MP3 disposed on the boundary between the first group Finger0 and the second group Finger1 and in the second group Finger1, the channels of the memory cell transistors MT in the regions (memory pillars MP3, MP12, MP4, MP13, MP5, MP14, MP6, and MP15) indicated with thick oblique lines with a sign Boost thereon can be boosted.

Therefore, in the second example of the method of read operation of the semiconductor storage device 1, by devising a method of operating the memory pillar MP disposed on the boundary between the first group Finger0 and the second group Finger1, it is possible to reduce the memory cell transistors MT affected by read disturb.

In the second example of the method of read operation of the semiconductor storage device 1, since the drain side select gate line SGD7 and the source side select gate lines SGS3 and SGS4 are selected according to the memory cell transistor MT to be read, it is possible to reduce read disturb of the memory cell transistor MT in the memory pillar MP7.

Therefore, in the second example of the method of read operation of the semiconductor storage device 1, by leveling the selection of the plurality of drain side select gate lines SGD, it is possible to equalize read disturb in the plurality of memory cell transistors MT in the semiconductor storage device 1. That is, there is no memory pillar MP (memory string) always being affected by disturb.

1-2-4. Timing Chart of Semiconductor Storage Device 1

An example of a timing chart for the second example described in section 1-2-3 will be described with reference to FIG. 21. FIG. 21 is a timing chart illustrating the read operation of the semiconductor storage device 1. In the description of FIG. 21, the same or similar configuration as that of FIGS. 1 to 20 may be omitted. Hereinafter, the name of a selected signal line is affixed with "SEL" in front, and the name of an un-selected signal line is affixed with "VSEL" in front.

As shown in FIG. 21, the second example of the method of read operation of the semiconductor storage device 1 includes a first operation period, a second operation period, and a third operation period. For example, the first operation period is a period during which an operation of commonly supplying the same voltage (the voltage VBB in the semiconductor storage device 1) to each channel is performed. For example, the first operation period is referred to as channel clean (CC) operation or a channel clean (CC) operation period. For example, the second operation period is a period during which a read operation of any state from "Er" state to "G" state is performed. For example, the third operation period is a period during which a read operation at a state different from that in the second operation period is performed.

1-2-4-1. Operation Up to Time t0

In the method of read operation of the semiconductor storage device 1, until time t0, for example, the state of the semiconductor storage device 1 is set to a standby state. The standby state is a state of waiting whether to perform a read operation, for example. Until time t0, the selected select gate line SEL-SGD (for example, SGD2), the selected select gate line SEL-SGD (for example, SGD3), the un-selected select gate lines USEL-SGD (for example, SGD1 and SGD4 to SGD7), the selected even word lines SEL-WLen (for example, n=2, WLe2), the un-selected odd word lines USEL-WLon (for example, n=2, WLo2), the un-selected odd word lines USEL-WLon±1 (for example, n=2, WLo1 and WLo3), the un-selected word lines USEL-WL (WL excluding SEL-WLen, USEL-WLon and USEL-WLon±1), the selected select gate line SEL-SGS (for example, SGS0), and the un-selected select gate lines USEL-SGS (for example, SGS1 to SGS3) are supplied with the voltage VSS. It should be noted that the un-selected select gate lines USEL-SGD (for example, SGD1 and SGD4 to SGD7) and the un-selected select gate lines USEL-SGS (for example, SGS1 to SGS3) are supplied with the voltage VSS from time t0 to time t7 shown in FIG. 21. Since VSS is supplied to each signal line, each of the select transistors ST1 and ST2 electrically connected to each signal line is turned off, and each of the memory cell transistors MT electrically connected to each signal line is turned off.

1-2-4-2. First Operation Period (from Time t0 to Time t2)

From time t0 to time t1, the voltage VSG is supplied to the selected select gate line SEL-SGD (SGD2) and the select transistor STe1 electrically connected to SGD2. The voltage VSG is supplied to the un-selected select gate line USEL-SGD (SGD3) and the select transistor STo1 electrically connected to SGD3. The voltage VREAD is supplied to the selected even word line SEL-WLen (WLe2) and the memory cell transistor MTe2 electrically connected to WLe2. The voltage VREAD is supplied to the un-selected odd word line USEL-WLon (WLo2) opposite to WLe2 and the memory cell transistor MTo2 electrically connected to WLo2. The voltage VREAD is supplied to the un-selected odd word lines USEL-WLon±1 (WLo1, WLo3), the memory cell transistor MTo1 electrically connected to WLo1, and the memory cell transistor MTo3 electrically connected to WLo3. The voltage VREAD is supplied to the un-selected word lines USEL-WL (WL excluding SEL-WLen, USEL-WLon, and USEL-WLon±1), and the voltage VREAD is supplied to the memory cell transistors MT electrically connected to WL excluding SEL-WLen, USEL-WLon and USEL-WLon±1. The voltage VSG_SGS is supplied to the selected select gate line SEL-SGS (SGS0) and the select transistor STe2 electrically connected to SGS0. The select transistor ST1 supplied with the voltage VSG, the memory cell transistor MT supplied with the voltage VREAD, and the select transistor ST2 supplied with the voltage VSG_SGS are turned on. The select transistors ST1 and ST2 supplied with the voltage VSS are turned off.

From time t1 to time t6, the voltage VSG is supplied to SGD2 and the select transistor STe1 electrically connected to SGD2, and the voltage VREAD is supplied to the un-selected word lines USEL-WL (WL excluding SEL-WLen, USEL-WLon, and USEL-WLon±1), the voltage VREAD is supplied to the memory cell transistors MT electrically connected to WL excluding SEL-WLen, USEL-WLon and USEL-WLon±1, and the voltage VSG_SGS is supplied to SGS0 and the select transistor STe2 electrically connected to SGS0. The select transistor ST1 supplied with the voltage VSG, the memory cell transistor MT supplied with the voltage VREAD, and the select transistor ST2 supplied with the voltage VSG_SGS are turned on.

From time t1 to time t2, the voltage VSS is supplied to SGD3 and the select transistor STo1 electrically connected to SGD3. A voltage that gradually decreases from the voltage VREAD is supplied to the selected even word line SEL-WLen (WLe2) and the memory cell transistor MTe2 electrically connected to WLe2. The voltage VBB is supplied to the un-selected odd word line USEL-WLon (WLo2) opposite to WLe2 and the memory cell transistor MTo2 electrically connected to WLo2. The voltage VBB is supplied to the un-selected odd word lines USEL-WLon±1 (WLo1, WLo3), the memory cell transistor MTo1 electrically connected to WLo1, and the memory cell transistor MTo3 electrically connected to WLo3. Each transistor supplied with the voltages VSS or VBB is turned off.

From time t2 to time t6, the voltage VSS is supplied to the SGD3 and the select transistor STo1 electrically connected to SGD3, and the voltage VBB is supplied to the un-selected odd word lines USEL-WLon±1 (WLo1, WLo3), the memory cell transistor MTo1 electrically connected to WLo1, and the memory cell transistor MTo3 electrically connected to WLo3. Each transistor supplied with the voltages VSS or VBB is turned off.

1-2-4-3. Second Operation Period (From Time t2 to Time t4)

From time t2 to time t3, a voltage VCGRVH higher than a read voltage VCGRV corresponding to a certain state is supplied to the selected even word line SEL-WLen (WLe2) and the memory cell transistor MTe2 electrically connected to WLe2. From time t3 to time t4, the voltage VCGRVH is supplied to the selected even word lines SEL-WLen (WLe2) and the memory cell transistor MTe2 electrically connected to WLe2, and then the voltage VCGRVH gradually decreases.

As a result, the threshold voltage of the memory cell transistor MTe2 corresponding to a certain state can be read during the second operation period.

In the second operation period, SGD3 and SGS1 are not selected, SGD3 supplies the voltage VSS to the select transistor STo1, and SGS1 supplies the voltage VSS to the select transistor STo2. The select transistors STo1 and STo2 are turned off. As described in section 1-2-3, for example, in the memory pillar MP3 disposed on the boundary between the first group Finger0 and the second group Finger1, among the memory cell transistors MT0 to MT4 in the same memory pillar MP, the memory cell transistors MTe0 to MTe4 connected to the even word line WLe are supplied with an on-state voltage, and the memory cell transistors MTo0 to MTo4 connected to the odd word line WLo are supplied with an off-state voltage. The content of section 1-2-3 corresponds to the operation in the second operation period. That is, the even word line WLe corresponds to the selected word line WLe2, and the odd word line WLo facing the even word line WLe corresponds to the un-selected word line WLo2 facing the selected word line WLe2. The on-state voltage corresponds to the voltage VCGRV or VCGRVH, and the off-state voltage corresponds to the voltage VBB. That is, in the second operation period, the memory cell transistors MTo0 to MTo4 in the fifth side memory string 50o of the memory pillar MP3 disposed on the boundary between the first group Finger0 and the second group Finger1 are in the floating state. As the channel of the memory cell transistor MT in the memory pillar MP3 disposed on the boundary between the first group Finger0 and the second group Finger1 is shared, a sneak current flows through the channel of each memory cell transistor MT.

As a result, in the memory cell transistors MTe0 to MTe4 provided in the sixth side memory string 50e of the memory pillar MP3 disposed on the boundary between the first group Finger0 and the second group Finger1, read disturb (RD) does not occur, and unintended variations in threshold voltage can be prevented. In the memory pillar MP3 disposed on the boundary between the first group Finger0 and the second group Finger1, since the memory cell transistors MTo0 to MTo4 connected to the un-selected word lines WLo (WLo0 to WLo4) are in the floating state, the channels of the memory cell transistors MT can be boosted.

1-2-4-4. Third Operation Period (From Time t4 to Time t6)

From time t4 to time t5, a voltage VCGRV2H higher than a read voltage VCGRV2 corresponding to a different state from that in the second operation period is supplied to the selected even word lines SEL-WLen (WLe2) and the memory cell transistor MTe2 electrically connected the WLe2. From time t5 to time t6, the voltage VCGRV2H is supplied to the selected even word line SEL-WLen (WLe2) and the memory cell transistor MTe2 electrically connected to WLe2, and then the voltage VCGRV2H decreases gradually.

As a result, in the third operation period, the threshold voltage of the memory cell transistor MTe2 corresponding to a state different from that in the second operation period can be read. The voltage VCGRV2H is higher than the voltage VCGRV, and the state different from that in the second operation period is lower than the state in the second operation period. For example, when the state in the second operation period is the "E" state, the state different from the second operation period is any one of the "Er" state to the "D" state.

As shown in FIG. 21, in the third operation period, the memory pillar MP3 disposed on the boundary between the first group Finger0 and the second group Finger1 is also supplied with the same voltage as the voltage described in 1-2-4-3. Second Operation Period (From Time t2 to Time t4).

As a result, in the third operation period, in the memory cell transistors MTe0 to MTe4 provided in the sixth side memory string 50e of the memory pillar MP3 disposed on the boundary between the first group Finger0 and the second group Finger1, read disturb (RD) does not occur, and unintended variations in threshold voltage can be prevented. In the memory pillar MP3 disposed on the boundary between the first group Finger0 and the second group Finger1, since the memory cell transistors MTo0 to MTo4 connected to the un-selected word lines WLo (WLo0 to WLo4) are in the floating state, the channels of the memory cell transistors MT can be boosted.

1-2-4-5. Operation from Time t6 to Time t7

According to the method of read operation of the semiconductor storage device 1, from time t6 to time t7, the voltage VSS is supplied to each signal line and each transistor electrically connected to each signal line shown in FIG. 21 in the same manner as at time t0. Each transistor is turned off.

As described above, the semiconductor storage device 1 according to the first embodiment includes the first group Finger0 and the second group Finger1 adjacent to the first group Finger0 The word line WLe2 (first word line) is provided in the first layer extending in the X direction (first direction) and the Y direction (second direction) that intersects the X direction, and the word line WLo2 (second word line) is provided opposite to the word line WLe2 in the first layer and controlled independently of the first word line. The word line WLe1 (third word line) is provided in the second layer extending in the X and Y directions and stacked on the first layer in the Z direction (third direction) that intersects the X and Y directions, and the word line WLo1 (fourth word line) is provided opposite to the word line WLe1 in the second layer and controlled independently of the third word line. The word line WLe3 (fifth word line) is provided in the third layer extending in the X and Y directions and stacked on the first layer in the Z direction, and the word line WLo3 (sixth word line) is provided opposite to the word line WLe3 in the third layer and controlled independently of the fifth word line. The source side select gate line SGS0 (first select gate line) is disposed in the fourth layer stacked on the third layer in the Z direction and extends in the X direction, and the source side select gate line SGS1 (second select gate line) is disposed opposite to the source side select gate line SGS0 in the fourth layer and controlled independently of the first select gate line. The source side select gate line SGS2 (third select gate line) is disposed adjacent to the source side select gate line SGS1 in the fourth layer and controlled independently of the first and second select gate lines, and the source side select gate line SGS3 (fourth select gate line) is disposed opposite to the source side select gate line SGS2 in the fourth layer and controlled independently of the first to third select gate lines. The memory pillar MP11 (first memory pillar) extends in the Z direction and includes the memory cell transistor MTe2 (first memory cell) electrically connected to the word line WLe2 and the source side select transistor STe2 (first select transistor) electrically connected in series to the memory cell transistor MTe2 (first memory cell) and electrically connected to the source side select gate line SGS0 in the first group Finger0 and the memory cell transistor MTo2 (second memory cell) electrically connected to the word line WLo2 and the source side select transistor STo2 (second select transistor) electrically connected in series to the memory cell transistor MTo2 (second memory cell) and electrically connected to the source side select gate line SGS1 in the first group Finger0 The memory pillar MP3 (second memory pillar) extends in the Z direction and includes the memory cell transistor MTe2 (third memory cell) electrically connected to the word line WLe2 and the source side select transistor STe2 (third select transistor) electrically connected in series to the memory cell transistor MTe2 (third memory cell) and electrically connected to the source side select gate line SGS2 in the second group Finger1, and the memory cell transistor MTo2 (fourth memory cell) electrically connected to the word line WLo2 and the source side select transistor STo2 (fourth select transistor) electrically connected in series to the memory cell transistor MTo2 (fourth memory cell) and electrically connected to the source side select gate line SGS1 in the first group Finger0. The memory pillar MP12 (third memory pillar) extends in the Z direction and includes the memory cell transistor MTe2 (fifth memory cell) electrically connected to the word line WLe2 and the source side select transistor STe2 (fifth select transistor) electrically connected in series to the memory cell transistor MTe2 (fifth memory cell) and electrically connected to the source side select gate line SGS2 in the second group Finger1, and the memory cell transistor MTo2 (sixth memory cell) electrically connected to the word line WLo2 and the source side select transistor STo2 (sixth select transistor) electrically connected in series to the memory cell transistor MTo2 (sixth memory cell) and electrically connected to the source side select gate line SGS3 in the second group Finger1. The memory pillar MP7 (fourth memory pillar) extends in the Z direction and includes the memory cell transistor MTe2 (seventh memory cell) electrically connected to the word line WLe2 and the source side select transistor STe2 (seventh select transistor) electrically connected in series to the memory cell transistor MTe2 (seventh memory cell) and electrically connected to the source side select gate line SGS0 in the first group Finger0, and the memory cell transistor MTo2 (eighth memory cell) electrically connected to the word line WLo2 and the source side select transistor STo2 (eighth select transistor) electrically connected in series to the memory cell transistor MTo2 (eighth memory cell) and electrically connected to the source side select gate line SGS3 in the second group Finger1. The logic control circuit 23 controls to perform the read operation of reading the threshold voltages of the first to eighth memory cells, respectively. The first to eighth memory cells are interposed between the word lines WLe2 and WLo2. The first, third, fifth, and seventh memory cells are disposed opposite to the word line WLe2, and the second, fourth, sixth, and eighth memory cells are disposed opposite to the word line WLo2. The first and second select transistors are interposed between the source side select gate lines SGS0 and SGS1. The third and fourth select transistors are interposed between the source side select gate lines SGS1 and SGS2. The fifth and sixth select transistors are interposed between the source side select gate lines SGS2 and SGS3. The seventh and eighth select transistors are interposed between the source side select gate lines SGS0 and SGS3. The first and seventh select transistors are electrically connected to the source side select gate line SGS0, the second and fourth select transistors are electrically connected to the source side select gate line SGS1, the third and fifth select transistors are electrically connected to the source side select gate line SGS2, and the sixth to eighth select transistors are electrically connected to the source side select gate line SGS3. When performing the read operation, the logic control circuit 23 independently controls each of the source side select gate lines SGS0 to SGS3 such that the select transistors electrically connected to the memory cells other than the memory cells (for example, memory cell transistor MTe2) to be read are turned off. The source side select gate lines SGS0 to SGS3 are disposed in the same layer (second layer) and provided independently of each other.

In the semiconductor storage device 1 according to the first embodiment, the logic control circuit 23 supplies a voltage (for example, the voltage VREAD) that turns the first and seventh select transistors to on state to the source side select gate line SGS0, a voltage (for example, the voltage VSS) that turns the second and fourth select transistors to off state to the source side select gate line SGS1, a voltage (for example, the voltage VSS) that turns the third and fifth select transistors to off state to the source side select gate line SGS2, and a voltage (for example, the voltage VSS) that turns the sixth and eighth select transistors to off state to the source side select gate line SGS3.

1-3. Example of Method for Forming SGS, WL, and SGD of Semiconductor Storage Device 1

Figure 22:
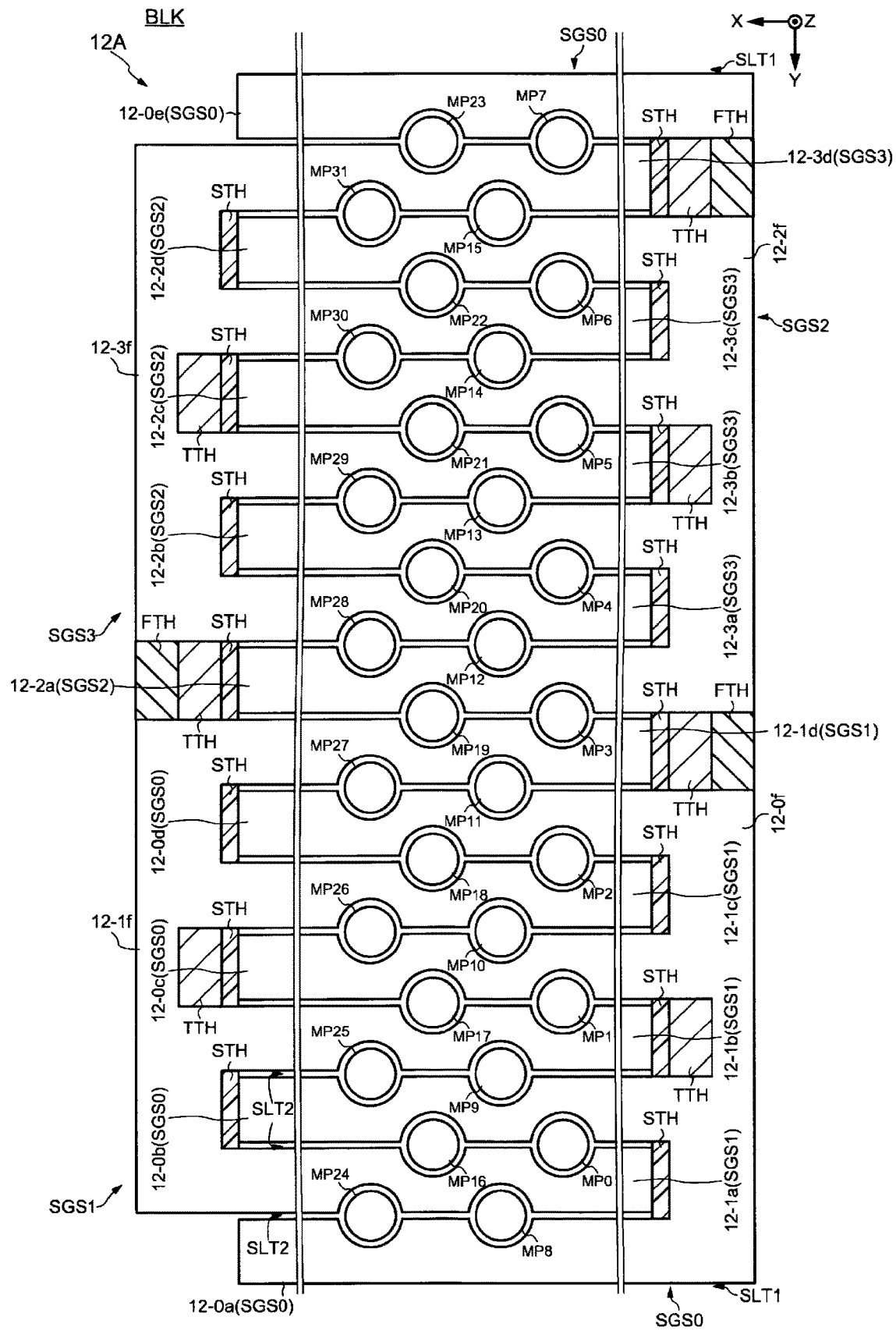
FIGS. 22-23 are diagrams to explain a method for forming source side select gate lines of the semiconductor storage device according to the first embodiment.
Figure 23:
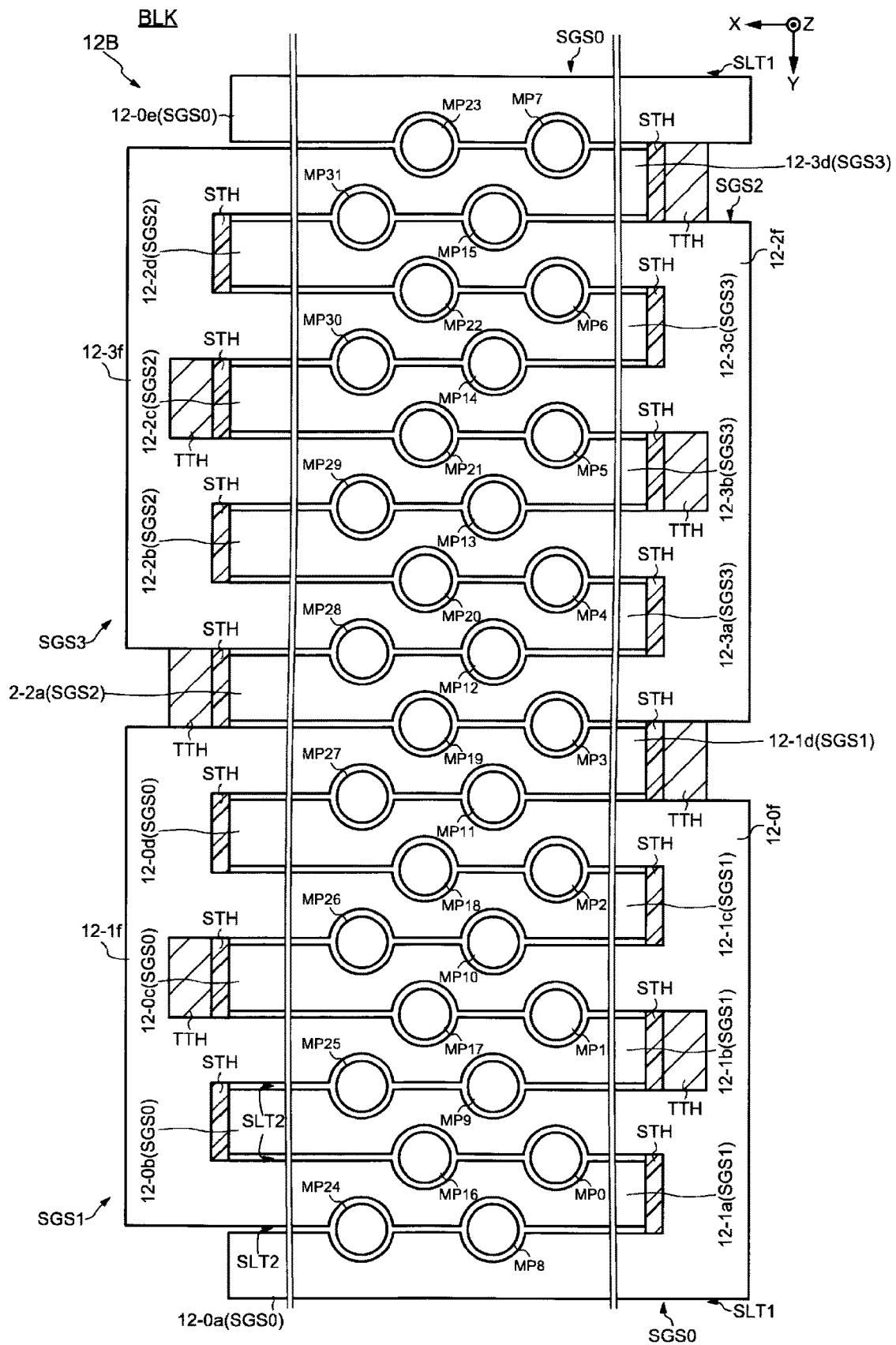
Figure 24:
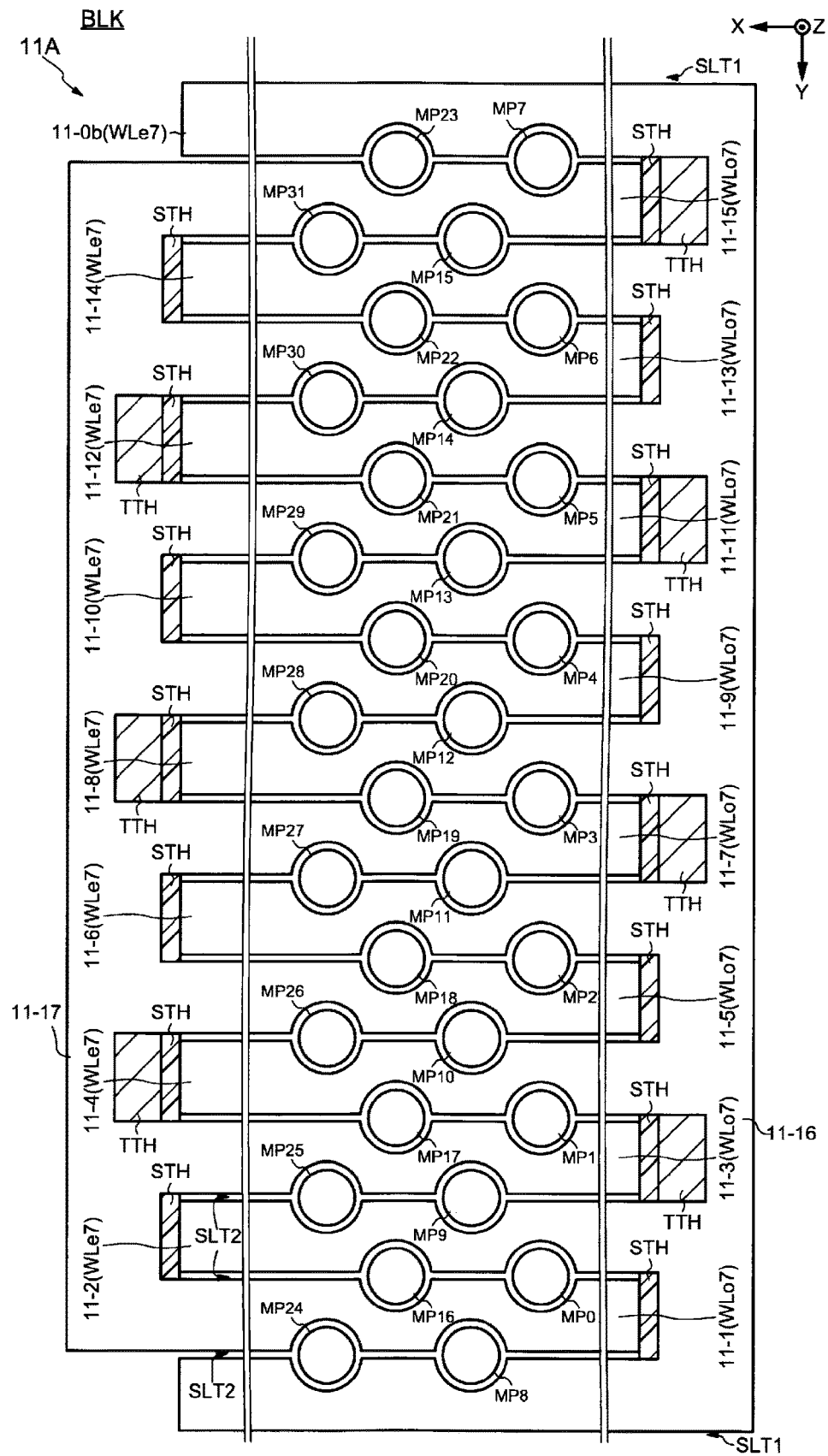
FIG. 24 is a diagram to explain a method for forming the word lines of the semiconductor storage device according to the first embodiment.
Figure 25:
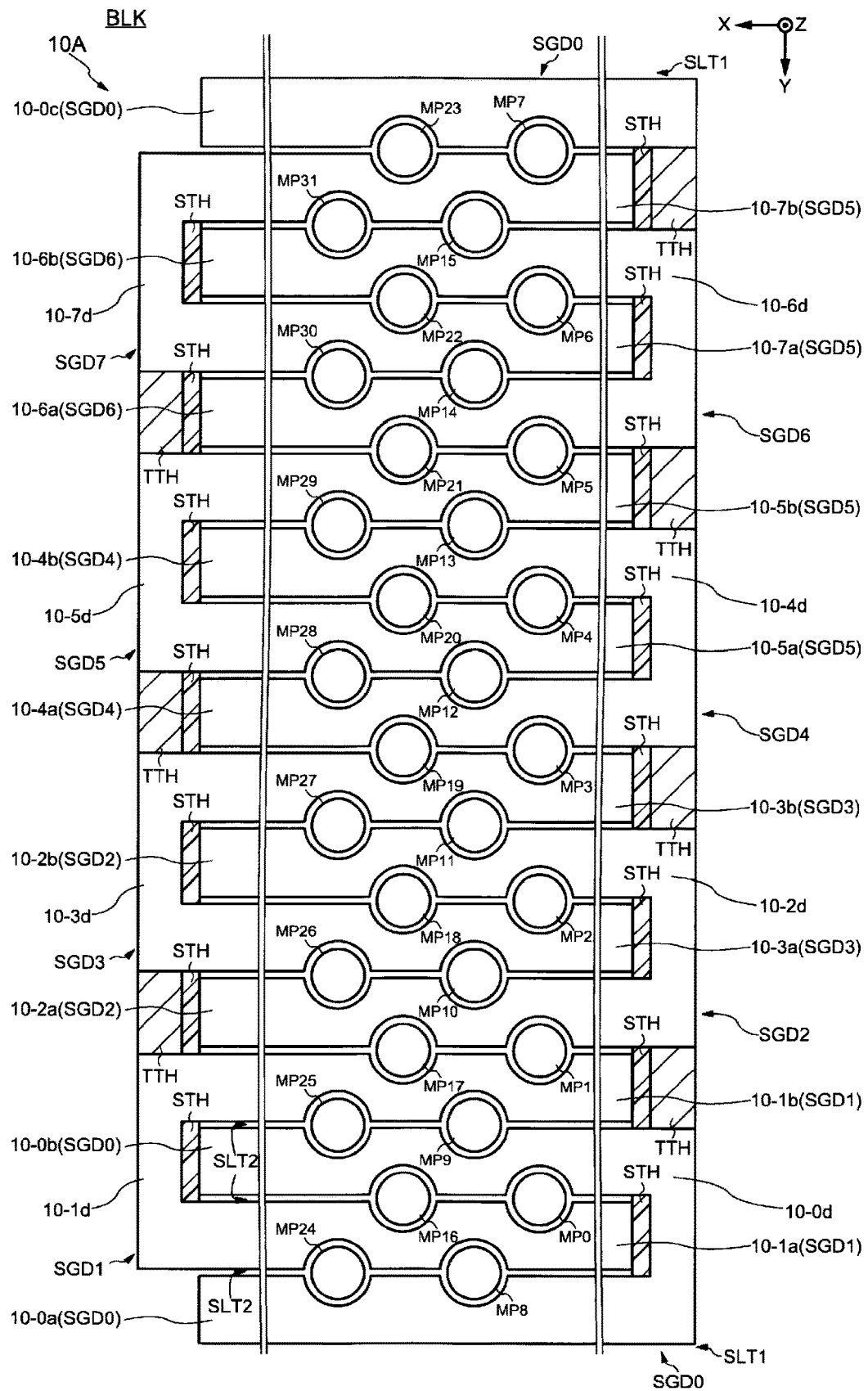
FIG. 25 is a diagram to explain a method for forming drain side select gate lines of the semiconductor storage device according to the first embodiment.

An example of a method for forming the select gate lines SGS, the word lines WL, and the select gate lines SGD of the semiconductor storage device 1 according to the first embodiment will be described with reference to FIGS. 3 to 6, 9 and 22 to 25. FIGS. 22 and 23 are diagrams illustrating a method for forming the select gate lines SGS of the semiconductor storage device 1 according to the first embodiment. FIG. 24 is a diagram illustrating a method for forming the word lines WL of the semiconductor storage device 1 according to the first embodiment. FIG. 25 is a diagram illustrating a method for forming the select gate lines SGD of the semiconductor storage device 1 according to the first embodiment. In the description of the method for forming the select gate lines SGS, the word lines WL, and the select gate lines SGD, the same or similar components as those shown in FIGS. 1 to 21 may be omitted.

In forming the select gate lines SGS shown in FIG. 22, for example, a wiring layer 12A is formed above the semiconductor substrate 13. Next, for example, by using photolithography, the wiring layer 12A is formed into an original shape of the select gate lines SGS. Next, portions overlapping with a first opening FTH in the original shape of the formed select gate lines SGS are removed by using photolithography. Next, an insulating layer is formed on the removed portions. Thus, for example, a wiring layer 12B as a base of the select gate lines SGS shown in FIG. 23 is formed.

Next, in forming the word lines WL shown in FIG. 24, a wiring layer 11A is formed above the wiring layer 12B. Next, for example, by using photolithography, the wiring layer 11A is formed into an original shape of the word lines WL. Similarly, in forming the select gate line SGD shown in FIG. 25, a wiring layer 10A is formed above the wiring layer 11A. Next, for example, by using photolithography, the wiring layer 10A is formed into an original shape of the select gate lines SGD.

In the original shape of the select gate lines SGS, the original shape of the word lines WL, and the original shape of the select gate lines SGD shown in FIGS. 22, 23, 24 and 25, a replace hole STH is a hole for forming the select gate lines SGS, the word lines WL, and the select gate lines SGD. Similarly to the slit SLT1 in the cross-sectional view shown in FIG. 6 for example, the replace hole STH penetrates from the wiring layer 10 (10A) to the wiring layer 12 (12A).

An example of a method for forming the original shape of word lines WL including the original shape of word lines WL (WLo7 and WLe7) shown in FIG. 23 will now be briefly described mainly with reference to FIG. 10. In a process prior to forming the original shape of the word lines WL, for example, a stacked film of nitride is provided in the place where the AlO layer 45, the barrier metal layer 47, and the wiring layer 11 shown in FIG. 10 are provided. After removing the nitride stacked film using the replace hole STH, the AlO layer 45, the barrier metal layer 47 and the wiring layer 11 are formed. That is, the nitride stacked film is replaced with the AlO layer 45, the barrier metal layer 47 and the wiring layer 11. A known technique used in the technical field of semiconductor storage devices can be applied to the method for forming the original shape of the word lines WL described herein. Similarly to the original shape of the word lines WL shown in FIG. 24, the original shape of the select gate lines SGS shown in FIG. 23 and the original shape of the select gate lines SGD shown in FIG. 25 are formed using the replace hole STH.

Next, the overlapping portions of the wiring layers 10 (10A) to 12 (12A) shown in FIGS. 23 to 25 and the second openings STH are removed using the second openings STH formed to penetrate at least from the wiring layer 10 (10A) to the wiring layer 12 (12A).

Next, for example, the contact plugs 61-0a and 61-0b (FIG. 3) and the contact plugs 63-0a and 63-0b (FIG. 5) are formed using the contact plugs 17 (FIG. 7). The contact plug 61-0a is in contact with the wiring layer 10-0c forming the select gate line SGD0, and is formed on the wiring layer 10-0c forming the select gate line SGD0. The contact plug 61-0b is in contact with the first connecting section 10-0d connected to the select gate line SGD0 and is formed on the first connecting section 10-0d connected to the select gate line SGD0. The contact plug 63-0a is in contact with the wiring layer 12-0e forming the select gate line SGS0, and formed on the wiring layer 12-0e forming the select gate lines SGS0. The contact plug 63-0b is in contact with the first connecting section 12-0f connected to the select gate line SGS0 and formed on the first connecting section 12-0f connected to the select gate line SGS0. The wiring layers 60-0a (FIG. 3) and 62-0a (FIG. 5) are formed using the metal wiring layer 18 (FIG. 7), and the wiring layer 60-0a is connected to the contact plugs 61-0a and 61-0b, and the wiring layer 62-0a is connected to the contact plugs 63-0a and 63-0b.

As described above, the select gate lines SGD shown in FIG. 3, the word lines WL shown in FIG. 4, and the select gate lines SGS shown in FIG. 5 can be formed.

In the semiconductor storage device 1, the select gate line SGS0 includes first and second sub select gate lines. The first sub select gate line includes the wiring layers 12-0a, 12-0b, 12-0c and 12-0d, and the first connecting section 12-0f, and the second sub select gate line includes the wiring layer 12-0e. The select gate line SGS2 is disposed between the first sub select gate line and the second sub select gate line.

2. Second Embodiment

In the second embodiment, an example of a method for forming the select gate lines SGS, the word lines WL, and the select gate lines SGD of the semiconductor storage device 1 will be described. The example of a method for forming the select gate lines SGS, the word lines WL, and the select gate lines SGD of the semiconductor storage device 1 according to the second embodiment is the same as section 1-3, except for the method for forming the word line WL. Therefore, the description of the method for forming the select gate lines SGS, the word lines WL, and the select gate lines SGD of the semiconductor storage device 1 according to the second embodiment will mainly be focused on the method for forming the word lines WL.

Figure 26:
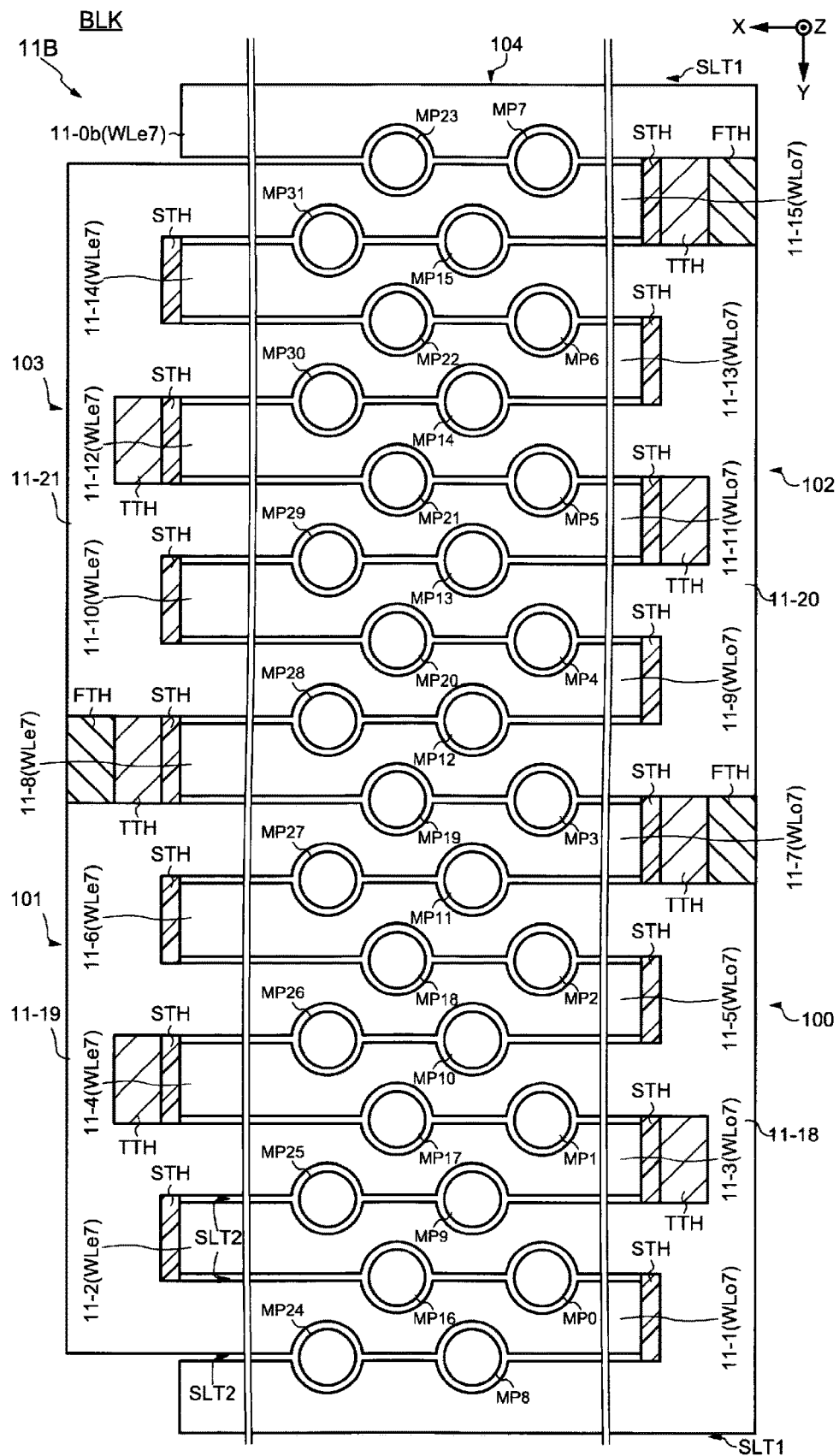
FIGS. 26-28 are diagrams to explain a method for forming word lines of a semiconductor storage device according to a second embodiment.

An example of a method for forming the select gate lines SGS, the word lines WL, and the select gate lines SGD of the semiconductor storage device 1 according to the second embodiment will be described with reference to FIGS. 3, 5, 22 and 26 to 28. FIG. 26 is a diagram illustrating the method for forming the word lines WL of the semiconductor storage device 1 according to the second embodiment. In the description of the method for forming the select gate lines SGS, the word lines WL, and the select gate lines SGD, the same or similar components as those shown in FIGS. 1 to 25 may be omitted.

In the formation of the select gate lines SGS shown in FIG. 22 and the formation of the word lines WL shown in FIG. 26, the wiring layer 12A is formed above the semiconductor substrate 13, for example. Next, for example, by using photolithography, the wiring layer 12A is formed into an original shape of the select gate lines SGS. Next, the wiring layer 11B is formed above the wiring layer 12A. Next, for example, by using photolithography, the wiring layer 11B is formed into an original shape of the word lines WL. Next, by using photolithography, portions overlapping with the first opening FTH in the original shape of the select gate lines SGS formed in the wiring layer 12A shown in FIG. 22, and portions overlapping with the first opening FTH in the original shape of the word lines WL formed in the wiring layer 11B shown in FIG. 26 are removed in the same step, for example. Next, an insulating layer is formed on the removed portions. Thus, for example, the wiring layer 12B as the base of the select gate lines SGS shown in FIG. 23 and a wiring layer 11C as the base of the word lines WL shown in FIG. 27 are formed.

Similarly, in forming the select gate lines SGD shown in FIG. 25, the wiring layer 10A is formed above the wiring layer 11C. Next, for example, by using photolithography, the wiring layer 10A is formed into an original shape of the select gate lines SGD.

Figure 27:
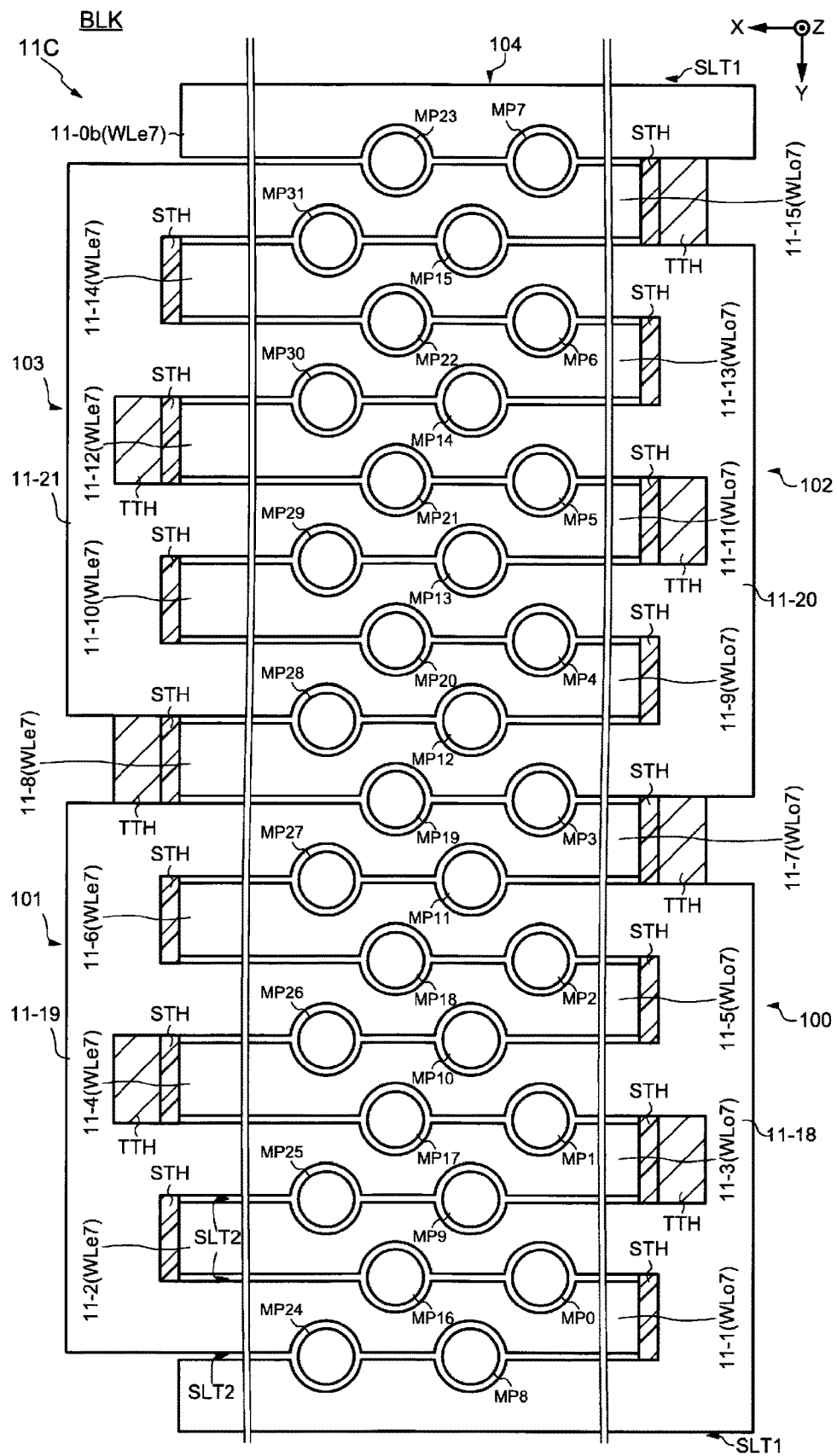

The original shape of the select gate lines SGS, the original shape of the word lines WL, and the original shape of the select gate lines SGD shown in FIG. 23, 25 or 27 are formed using the replace holes STH in the same manner as the method described in section 1-3.

Next, the overlapping portions of the wiring layers 10 (10A), 11(11C) and 12 (12B) shown in FIGS. 23, 25 and 27 and a second opening STH are removed using the second opening STH formed to penetrate at least from the wiring layer 10 (10A) to the wiring layer 12 (12A).

For example, a method of removing the overlapping portions of the second opening STH and the wiring layer 11 (11C) will be described with reference to FIGS. 27 and 28. The word line WLe (for example, WLe7) includes a first even sub word line 100, a second even sub word line 102, and a third even sub word line 104, and the word line WLo (for example, WLo7) includes a first odd sub word line 101 and a second odd sub word line 103. Between the first even sub word line 100 and the second even sub word line 102, between the second even sub word line 102 and the third even sub word line 104, and between the first odd sub word line 101 and the second odd sub word line 103, the wiring layer 11C and the second opening STH overlap with each other. Actually, the second opening STH is provided on the wiring layer 12 (12B) above the wiring layer 11C.

Figure 28:
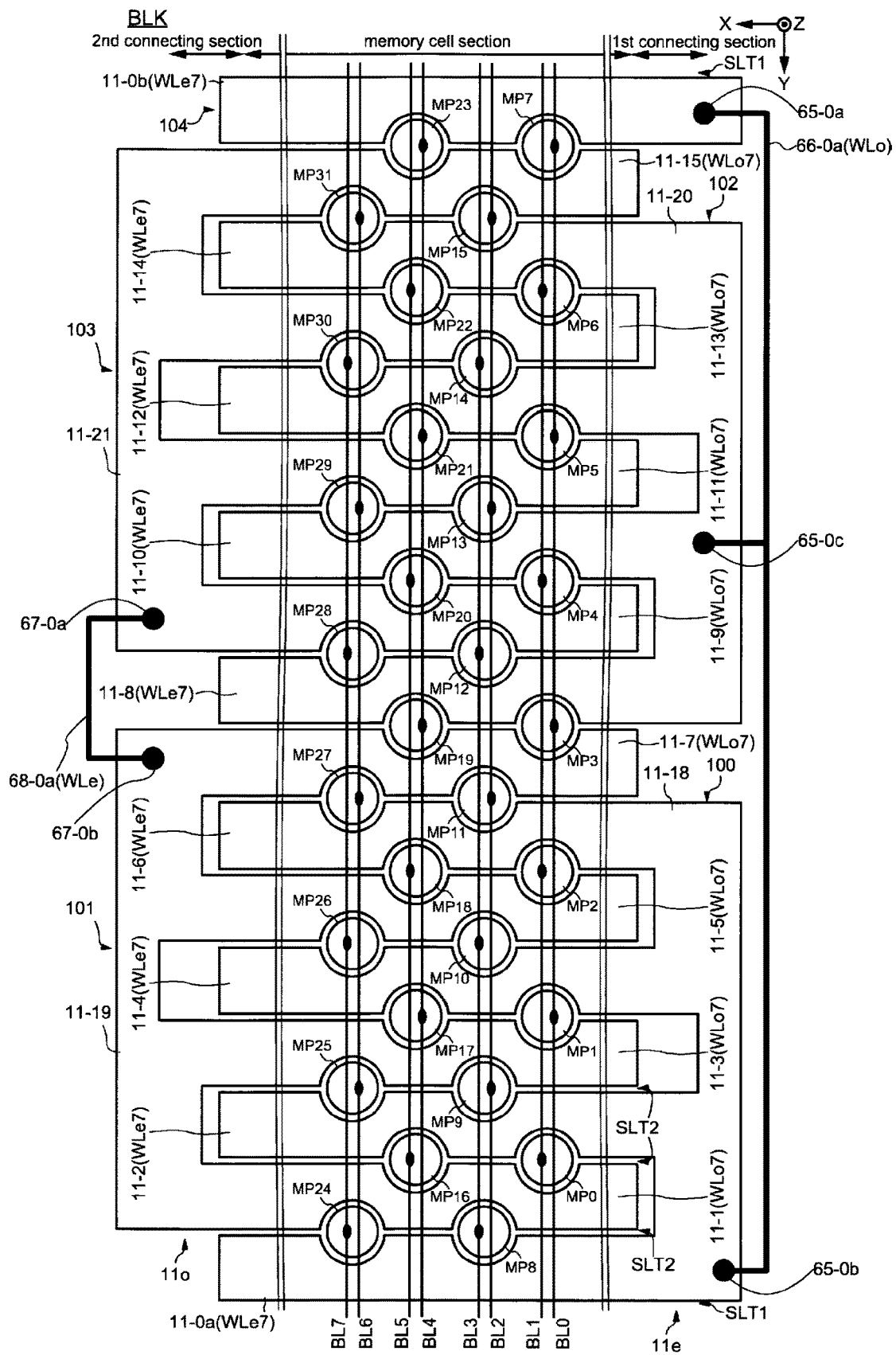

By removing the overlapping portions of the second opening STH and the wiring layer 11 (11C), in FIGS. 27 to 28, at least contact plugs 65-0a, 65-0b and 65-0c, contact plugs 67-0a and 67-0b, a wiring layer 66-0a, and the word lines WLe and WLo excluding the wiring layer 68-0a are formed. That is, the first even sub word line 100, the second even sub word line 102, the third even sub word line 104, the first odd sub word line 101, and the second odd sub word line 103 are separated using the first opening FTH and the second opening STH, and the first even sub word line 100, the second even sub word line 102, the third even sub word line 104, the first odd sub word line 101 and the second odd sub word line 103 are disposed independently.

The first even sub word line 100 includes the wiring layers 12-0a, 12-0b, 12-0c and 12-0d, and the first connecting section 12-0f. The second even sub word line 102 includes the wiring layers 12-2a, 12-2b, 12-2c and 12-2d, and the first connecting section 12-2f. The third even sub word line 104 includes the wiring layer 12-0e. The first odd sub word line 101 includes the wiring layers 12-1a, 12-1b, 12-1c and 12-1d, and the first connecting section 12-1f. The second odd sub word line 103 includes the wiring layers 12-3a, 12-3b, 12-3c and 12-3d, and the first connecting section 12-3f.

Next, for example, the contact plugs 61-0a and 61-0b (FIG. 3), the contact plugs 65-0a, 65-0b and 65-0c (FIG. 28), and the contact plugs 63-0a and 63-0b (FIG. 5) are formed using the contact plug 17 (FIG. 7). The contact plug 65-0a is in contact with the third even sub word line 104 and formed on the third even sub word line 104. The contact plug 65-0c is in contact with the second even sub word line 102 and formed on the second even sub word line 102. The contact plug 65-0b is in contact with the first even sub word line 100 and formed on the first even sub word line 100. The contact plugs 67-0a and 67-0b (FIG. 28) are formed using the contact plug 19 (FIG. 7). The contact plug 67-0a is in contact with the second odd sub word line 103 and formed on the second odd sub word line 103. The contact plug 67-0b is in contact with the first odd sub word line 101 and formed on the first odd sub word line 101. The wiring layers 60-0a (FIG. 3) and 62-0a (FIG. 5) are formed using the metal wiring layer 18 (FIG. 7), the wiring layer 60-0a is connected to the contact plugs 61-0a and 61-0b, the wiring layer 66-0a is connected to the contact plugs 65-0a to 65-0c, and the wiring layer 62-0a is connected to the contact plugs 63-0a and 63-0b. The wiring layer 68-0a (FIG. 28) is formed using the metal wiring layer 20 (FIG. 7), and the wiring layer 68-0a and the contact plugs 67-0a and 67-0b are in contact with each other.

As described above, the select gate lines SGD shown in FIG. 3, the word lines WL shown in FIG. 28, and the select gate lines SGS shown in FIG. 5 can be formed.

In the semiconductor storage device 1 according to the second embodiment, the first opening FTH and the second opening STH are provided between the select gate line SGS0 (first select gate line) and the select gate line SGS2 (third select gate line). The select gate lines SGS0 and SGS2 are separated using the first opening FTH and the second opening STH. The word line WLe (first word line) is formed using the wiring layer 11, and the select gate lines SGS0 and SGS2 are formed using the wiring layer 12. The wiring layer 11 is disposed above the wiring layer 12 (FIGS. 6 and 7). Therefore, the word line WLe overlaps with the first opening FTH, the select gate line SGS0 and the select gate line SGS2.

In the semiconductor storage device 1 according to the second embodiment, the first opening FTH (third opening) and the second opening STH (fourth opening) are disposed between the select gate line SGS1 (second select gate line) and the select gate line SGS3 (fourth select gate line). The select gate lines SGS1 and SGS3 are separated using the first opening FTH and the second opening STH. The word line WLo (second word line) is formed using the wiring layer 11, and the select gate lines SGS1 and SGS3 are formed using the wiring layer 12. The wiring layer 11 is disposed above the wiring layer 12. Therefore, the word line WLo (second word line) overlaps with the first opening FTH, the select gate line SGS1 and the select gate line SGS3.

In the semiconductor storage device 1 according to the second embodiment, the first opening FTH and the second opening STH are disposed between the select gate lines SGS0 and SGS2, and the select gate lines SGS0 and SGS2 are disposed independently. The word lines WLe include the first even sub word line (first sub word line), the second even sub word line (second sub word line), and the third even sub word line. The first opening FTH and the second opening STH are disposed between the first and second even sub word lines. The first even sub word line and the second even sub word line are disposed independently.

As described in section 1-3, the select gate line SGS0 (first select gate line) includes the first even sub select gate line (first sub select gate line) and the second even sub select gate line (second sub select gate line). The select gate line SGS2 (third select gate line) is disposed between the first and second even sub select gate lines. The first and second even sub select gate lines are connected to the wiring layer 62-0a at two points using the contact plugs 63-0a and 63-0b (FIG. 5) connected to the first and second even sub select gate lines, respectively. The word lines WLe include the first even sub word line (first sub word line), the second even sub word line (second sub word line), and the third even sub word line. The first, second, and third even sub word lines are connected to the wiring layer 66-0a at three points using the contact plugs 65-0a, 65-0b and 65-0c (FIG. 28) connected to the first, second, and third even sub word lines, respectively.

3. Third Embodiment

In the third embodiment, an example of a timing chart different from the timing chart described in section 1-2-4 will be described. The timing chart of the semiconductor storage device 1 according to the third embodiment is different from the timing chart described in section 1-2-4 in that different voltages are supplied to the un-selected select gate line USEL-SGD (for example, SGD0, 1, 4 to 7) and the un-selected select gate lines USEL-SGS (for example, SGS2, 3). The other timing charts are the same as the timing charts Described in 1-2-4. Timing Chart of Semiconductor Storage Device 1, so the description will focus on the differences.

Figure 29:
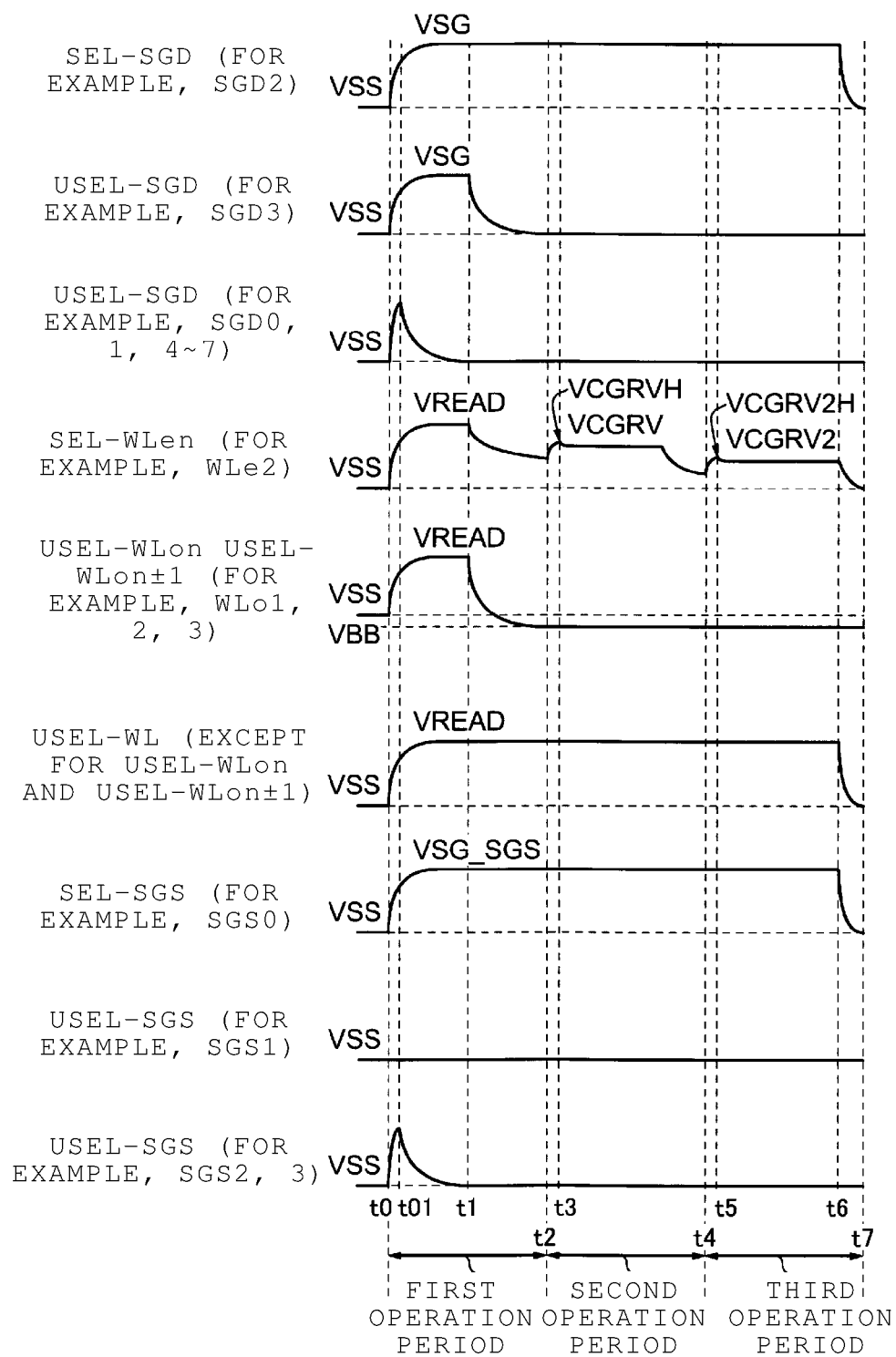
FIG. 29 is a timing chart to explain read operation of a semiconductor storage device according to a third embodiment.

FIG. 29 shows a timing chart of the semiconductor storage device 1 according to the third embodiment. In the description of the timing chart of the semiconductor storage device 1 according to the third embodiment, the same or similar components as those of FIGS. 1 to 28 may be omitted.

As shown in FIG. 29, the voltages supplied to the un-selected select gate lines USEL-SGD (for example, SGD0, 1, 4 to 7) and the un-selected select gate lines USEL-SGS (for example, SGS2, 3) are boosted up to the voltage VSG from time t0 to time t01. The voltages supplied to the un-selected select gate lines USEL-SGD (for example, SGD0, 1, 4 to 7) and the un-selected select gate lines USEL-SGS (for example, SGS2, 3) are stepped down from the voltage VSG to the voltage VSS from time t01 to time t2 before the selected word line SEL-WLen (for example, WLe2) is boosted up to the voltage VSG.

In the semiconductor storage device 1 according to the third embodiment, the logic control circuit 23 supplies a voltage to the source side select gate line SGS2 such that the third select transistor (the source side select transistor STe2 of the memory pillar MP3) and the fifth select transistor (the source side select transistor STe2 of the memory pillar MP12) are turned on faster than fully turn on of the first memory cell (the memory cell transistor MTe2), supplies a voltage to the source side select gate line SGS3 such that the sixth select transistor (the source side select transistor STo2 of the memory pillar MP12) and the eighth select transistor (the source side select transistor STo2 of the memory pillar MP7) are turned on faster than fully turn on of the first memory cell (the memory cell transistor MTe2), and supplies a voltage to the word line WLo2 such that the second memory cell transistor (the memory cell transistor MTo2) is turned off later than turn off of the third, fifth, sixth, and eighth select transistors.

In the semiconductor storage device 1, as described in sections 1-1-6-1, 1-1-6-2, and 1-1-7, two memory cell transistors MT in the same memory pillar MP share a channel. In the semiconductor storage device 1 according to the third embodiment, during the first operation period, by weakly turning the select transistors STe2 and STo2 electrically connected to the memory cell transistors MT in the un-selected block BLK (second group Finger1) to on state, it is possible to finely adjust the boost voltage in the channel of the memory cell transistor MT as there is supply to the channel of two memory cell transistors MT in the same memory pillar MP.

4. Fourth Embodiment

In a fourth embodiment, an example of a timing chart different from the timing chart described in the second embodiment will be described. The timing chart of the semiconductor storage device 1 according to the fourth embodiment is different from the timing chart described in the second embodiment in that different voltages are supplied to the un-selected word lines USEL-WLon and the un-selected word lines USEL-WLon±1 (for example, WLo1, 2, 3). The other timing charts are the same as the timing charts described in the second embodiment, so the description will focus on the differences.

FIG. 30 shows a timing chart of the semiconductor storage device 1 according to the fourth embodiment. In the description of the timing chart of the semiconductor storage device 1 according to the fourth embodiment, the same or similar components as those of FIGS. 1 to 29 may be omitted.

As shown in FIG. 30, after time t0, the voltages supplied to the un-selected word lines USEL-WLon and the un-selected word lines USEL-WLon±1 (for example, WLo1, 2, 3) are stepped down to the voltage VBB.

In the semiconductor storage device 1 according to the fourth embodiment, the memory cell to be read is the memory cell transistor MTe2 (first memory cell), and the first memory cell is facing the memory cell transistor MTo2 (second memory cell), for example. The logic control circuit 23 supplies a voltage (for example, the voltage VREAD, the first voltage) that turns the first memory cell to on state to the word line WLe2, supplies the first voltage to the memory cells electrically connected to the word line WLe1 and to the memory cells electrically connected to the word line WLe3, supplies a voltage (for example, the voltage VBB, the second voltage) that turns the second memory cell to off state to the word line WLo2, and the voltage VBB to the memory cells electrically connected to the word line WLo1 and the memory cells electrically connected to the word line WLo3. As described in section 1-2-2, the voltage VBB is lower than voltage VREAD and is a negative voltage.

In the semiconductor storage device 1, as described in sections 1-1-6-1, 1-1-6-2, and 1-1-7, two memory cell transistors MT in the same memory pillar MP share a channel. In the semiconductor storage device 1 according to the fourth embodiment, when the voltage VBB is supplied to the un-selected word lines USEL-WLon and the un-selected word lines USEL-WLon±1 (for example, WLo1, 2, 3) during the first operation period, a sneak current flows through the channel of each memory cell transistor MT as the channel of the memory cell transistor MT is shared. As a result, in the semiconductor storage device 1 according to the fourth embodiment, the channel of the memory cell transistor MT can be boosted from the first operation period earlier than the second operation period, thereby increasing the speed of the read operation.

In each of the embodiments described above, when terms "identical" and "matching" are used, the terms "identical" and "matching" may include errors in the scope of design.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor storage device comprising:
a first word line provided in a first layer extending in a first direction and a second direction that intersects the first direction;
a second word line provided opposite to the first word line in the first layer and controlled independently of the first word line;

a third word line provided in a second layer extending in the first direction and the second direction and stacked on the first layer in a third direction that intersects the first direction and the second direction;
a fourth word line provided opposite to the third word line in the second layer and controlled independently of the third word line;
a fifth word line provided in a third layer extending in the first direction and the second direction and stacked on the second layer in the third direction;
a sixth word line provided opposite to the fifth word line in the third layer and controlled independently of the fifth word line;
a first select gate line disposed in a fourth layer stacked on the third layer in the third direction and extending in the first direction;
a second select gate line disposed opposite to the first select gate line in the fourth layer and controlled independently of the first select gate line;
a third select gate line disposed adjacent to the second select gate line in the fourth layer and controlled independently of the first select gate line and the second select gate line;
a fourth select gate line disposed opposite to the third select gate line in the fourth layer and controlled independently of the first to third select gate lines;
a first memory pillar extending in the third direction and including a first memory cell, a first select transistor electrically connected in series to the first memory cell, a second memory cell, and a second select transistor electrically connected in series to the second memory cell;
a second memory pillar extending in the third direction and including a third memory cell and a third select transistor electrically connected in series to the third memory cell, and a fourth memory cell and a fourth select transistor electrically connected in series to the fourth memory cell;
a third memory pillar extending in the third direction and including a fifth memory cell, a fifth select transistor electrically connected in series to the fifth memory cell, a sixth memory cell, and a sixth select transistor electrically connected in series to the sixth memory cell;
a fourth memory pillar extending in the third direction and including a seventh memory cell and a seventh select transistor electrically connected in series to the seventh memory cell, and an eighth memory cell and an eighth select transistor electrically connected in series to the eighth memory cell; and
a logic control circuit configured to perform a read operation to read threshold voltages of the first to eighth memory cells, respectively, wherein
the first to eighth memory cells are interposed between the first word line and the second word line,
the first, third, fifth, and seventh memory cells are disposed opposite to the first word line,
the second, fourth, sixth, and eighth memory cells are disposed opposite to the second word line,
the first and second select transistors are interposed between the first and second select gate lines,
the third and fourth select transistors are interposed between the second and third select gate lines,
the fifth and sixth select transistors are interposed between the third and fourth select gate lines,
the seventh and eighth select transistors are interposed between the first and fourth select gate lines,
the first and seventh select transistors are electrically connected to the first select gate line,
the second and fourth select transistors are electrically connected to the second select gate line,
the third and fifth select transistors are electrically connected to the third select gate line,
the sixth to eighth select transistors are electrically connected to the fourth select gate line, and
when performing the read operation on one of the first to eighth memory cells, the logic control circuit independently controls each of the first to fourth select gate lines such that the select transistors electrically connected to the first to eighth memory cells other than the memory cell to be read are turned off.

2. The semiconductor storage device according to claim 1, wherein the logic control circuit is configured to, when the memory cell to be read is the first memory cell or the seventh memory cell:
supply a voltage to the first select gate line to turn the first and seventh select transistors to an on state;
supply a voltage to the second select gate line to turn the second and fourth select transistors to an off state;
supply a voltage to the third select gate line to turn the third and fifth select transistors to an off state; and
supply a voltage to the fourth select gate line to turn the sixth and eighth select transistors to an off state.

3. The semiconductor storage device according to claim 1, wherein
the first memory cell faces the second memory cell,
the logic control circuit is configured to, when the memory cell to be read is the first memory cell:
supply a read voltage to the first word line;
supply a first voltage that is greater than the read voltage to the third word line and to the fifth word line; and
supply a second voltage that is less than the read voltage to the second word line.

4. The semiconductor storage device according to claim 3, wherein the second voltage is a negative voltage.

5. The semiconductor storage device according to claim 1, wherein
the first memory pillar is connected between a first bit line and a source line,
the second memory pillar is connected between a second bit line and the source line,
the third memory pillar is connected between a third bit line and the source line, and
the fourth memory pillar is connected between a fourth bit line and the source line.

6. The semiconductor storage device according to claim 5, wherein
the first select transistor is connected between the source line and the first memory cell,
the second select transistor is connected between the source line and the second memory cell,
the third select transistor is connected between the source line and the third memory cell,
the fourth select transistor is connected between the source line and the fourth memory cell,
the fifth select transistor is connected between the source line and the fifth memory cell,
the sixth select transistor is connected between the source line and the sixth memory cell,
the seventh select transistor is connected between the source line and the seventh memory cell, and
the eighth select transistor is connected between the source line and the eighth memory cell.

7. A semiconductor storage device comprising:
a first word line provided in a first layer extending in a first direction and a second direction that intersects the first direction;
a second word line provided opposite to the first word line in the first layer and controlled independently of the first word line;
a third word line provided in a second layer extending in the first direction and the second direction and stacked on the first layer in a third direction that intersects the first direction and the second direction;
a fourth word line provided opposite to the third word line in the second layer and controlled independently of the third word line;
a fifth word line provided in a third layer extending in the first direction and the second direction and stacked on the second layer in the third direction;
a sixth word line provided opposite to the fifth word line in the third layer and controlled independently of the fifth word line;
a first select gate line disposed in a fourth layer stacked on the third layer in the third direction and extending in the first direction;
a second select gate line disposed opposite to the first select gate line in the fourth layer and controlled independently of the first select gate line;
a third select gate line disposed adjacent to the second select gate line in the fourth layer and controlled independently of the first select gate line and the second select gate line;
a fourth select gate line disposed opposite to the third select gate line in the fourth layer and controlled independently of the first to third select gate lines;
a first memory pillar extending in the third direction and including a first memory cell electrically connected to the first word line, a first select transistor electrically connected in series to the first memory cell and electrically connected to the first select gate line, a second memory cell electrically connected to the second word line, and a second select transistor electrically connected in series to the second memory cell and electrically connected to the second select gate line;
a second memory pillar extending in the third direction and including a third memory cell electrically connected to the first word line and a third select transistor electrically connected in series to the third memory cell and electrically connected to the third select gate line, and a fourth memory cell electrically connected to the second word line and a fourth select transistor electrically connected in series to the fourth memory cell and electrically connected to the second select gate line;
a third memory pillar extending in the third direction and including a fifth memory cell electrically connected to the first word line, a fifth select transistor electrically connected in series to the fifth memory cell and electrically connected to the third select gate line, a sixth memory cell electrically connected to the second word line, and a sixth select transistor electrically connected in series to the sixth memory cell and electrically connected to the fourth select gate line; and
a fourth memory pillar extending in the third direction and including a seventh memory cell electrically connected to the first word line and a seventh select transistor electrically connected in series to the seventh memory cell and electrically connected to the first select gate line, and an eighth memory cell electrically connected to the second word line and an eighth select transistor electrically connected in series to the eighth memory cell and electrically connected to the fourth select gate line.

8. The semiconductor storage device according to claim 7, wherein
a first opening and a second opening are disposed between the first and third select gate lines,
the first and third select gate lines are separated by the first opening and the second opening, and
the first word line overlaps in the third direction with the first opening, and the first and third select gate lines.

9. The semiconductor storage device according to claim 8, wherein
a third opening and a fourth opening are disposed between the second and fourth select gate lines,
the second and fourth select gate lines are separated by the third opening and the fourth opening, and
the second word line overlaps in the third direction with the third opening, and the second and fourth select gate lines.

10. The semiconductor storage device according to claim 9, wherein
the first select gate line includes a first sub select gate line and a second sub select gate line,
the third select gate line is disposed between the first sub select gate line and the second sub select gate line,
the first and second sub select gate lines are electrically connected at two positions via a first wiring layer,
the first word line includes first, second, and third sub word lines, and
the first, second, and third sub word lines are electrically connected at three positions via a second wiring layer.

11. The semiconductor storage device according to claim 7, wherein
first and second openings are disposed between the first and third select gate lines, and the first and third select gate lines are disposed independently,
the first word line includes a first sub word line and a second sub word line,
the first and second openings are aligned in the third direction with openings that are between the first and second sub word lines, and
the first and second sub word lines are disposed independently.

12. A semiconductor storage device comprising:
a first select gate line and a second select gate line in a first layer;
a first word line provided in a second layer above the first layer and extending in a first direction and a second direction that intersects the first direction;
a second word line provided opposite to the first word line in the second layer and controlled independently of the first word line;
a third word line provided in a third layer above the second layer and extending in the first direction and the second direction and stacked on the second layer in a third direction that intersects the first direction and the second direction;
a fourth word line provided opposite to the third word line in the third layer and controlled independently of the third word line;
a fifth word line provided in a fourth layer above the third layer and extending in the first direction and the second direction and stacked on the first layer in the third direction;

a sixth word line provided opposite to the fifth word line in the fourth layer and controlled independently of the fifth word line;
a third select gate line disposed in a fifth layer above the fourth layer and stacked on the third layer in the third direction and extending in the first direction;
a fourth select gate line disposed opposite to the third select gate line in the fifth layer and controlled independently of the third select gate line;
a fifth select gate line disposed adjacent to the fourth select gate line in the fifth layer and controlled independently of the third select gate line and the fourth select gate line;
a sixth select gate line disposed opposite to the fifth select gate line in the fifth layer and controlled independently of the third to fifth select gate lines;
a first memory pillar extending in the third direction and including a first select transistor, a first memory cell, and a third select transistor that are electrically connected in series, and a second select transistor, a second memory cell, and a fourth select transistor that are electrically connected in series;
a second memory pillar extending in the third direction and including the second select transistor, a third memory cell, and the fourth select transistor that are electrically connected in series, and the first select transistor, a fourth memory cell, and a fifth select transistor that are electrically connected in series;
a third memory pillar extending in the third direction and including the first select transistor, a fifth memory cell, and the fifth select transistor that are electrically connected in series, and the second select transistor, a sixth memory cell, and a sixth select transistor that are electrically connected in series; and
a logic control circuit configured to perform a read operation, wherein
the first, fourth, and fifth memory cells are disposed opposite to the first word line,
the second, third, and sixth memory cells are disposed opposite to the second word line,
the first to sixth select transistors are electrically connected to the first to sixth select gate lines, respectively,
when performing the read operation on the fourth memory cell, the logic control circuit independently controls each of the third to sixth select gate lines such that the fifth select transistor is turned on and the third, fourth, and sixth select transistors are turned off.

13. The semiconductor storage device according to claim 12, wherein
when performing the read operation on the fourth memory cell, the logic control circuit independently controls the first and second select gate lines such that both the first and second select transistors are turned on.

14. The semiconductor storage device according to claim 13, wherein
when performing the read operation on the fourth memory cell, while the fifth select transistor is turned on and the third, fourth, and sixth select transistors are turned off, the logic control circuit applies a first voltage to the first word line and a second voltage lower than the first voltage to the second word line.

15. The semiconductor storage device according to claim 14, wherein the second voltage is a negative voltage.

16. The semiconductor storage device according to claim 15, wherein the first voltage is a read voltage associated with one of a plurality of threshold voltage states to which the memory cells can be programmed.

17. The semiconductor storage device according to claim 16, wherein
while the first voltage is applied to the first word line and the second voltage is applied to the second word line, the logic control circuit applies the second voltage to the fourth word line and a third voltage that is higher than the first voltage to the third, fifth, and sixth word lines.

18. The semiconductor storage device according to claim 12, wherein
when performing the read operation on the fourth memory cell, the logic control circuit independently controls the first and second select gate lines such that the first select transistor is turned on and the second select transistor is turned off.

19. The semiconductor storage device according to claim 13, wherein
when performing the read operation on the fourth memory cell, while the fifth select transistor is turned on and the third, fourth, and sixth select transistors are turned off, the logic control circuit applies a first voltage to the first word line, a second voltage lower than the first voltage to the second word line and fourth word line, and a third voltage that is higher than the first voltage to the third, fifth, and sixth word lines.

20. The semiconductor storage device according to claim 19, wherein the second voltage is a negative voltage.

* * * * *